United States Patent [19]
Nakamura et al.

[11] Patent Number: 5,475,342
[45] Date of Patent: Dec. 12, 1995

[54] AMPLIFIER FOR STABLY MAINTAINING A CONSTANT OUTPUT

[75] Inventors: Makoto Nakamura, Isehara; Noboru Ishihara, Atsugi; Yukio Akazawa; Masayuki Ishikawa, both of Isehara, all of Japan

[73] Assignee: Nippon Telegraph and Telephone Corporation, Tokyo, Japan

[21] Appl. No.: 227,886

[22] Filed: Apr. 15, 1994

[30] Foreign Application Priority Data

| Apr. 19, 1993 | [JP] | Japan | 5-090960 |
| Apr. 20, 1993 | [JP] | Japan | 5-116483 |
| Jul. 30, 1993 | [JP] | Japan | 5-208538 |

[51] Int. Cl.$^6$ ........................................... H03G 3/30
[52] U.S. Cl. .................. 330/136; 327/309; 330/279; 330/280; 330/308; 375/317
[58] Field of Search ............................ 330/299, 310, 330/311, 253, 11, 136, 141, 281, 280, 279; 375/76; 359/194; 250/214 A, 214 AG; 307/552, 564, 567, 568

[56] References Cited

U.S. PATENT DOCUMENTS

| 2,999,925 | 9/1961 | Thomas | 375/76 |
| 3,838,448 | 9/1974 | Garde et al. | 375/76 X |
| 3,947,769 | 3/1976 | Rousos et al. | 375/76 X |
| 4,375,037 | 4/1983 | Ikushima | 375/76 X |
| 4,456,889 | 6/1984 | Kuman | 330/275 |
| 4,540,897 | 9/1985 | Takaoka et al. | 375/76 X |
| 4,631,737 | 12/1986 | Davis et al. | 375/76 X |
| 4,641,324 | 2/1987 | Karsh et al. | 375/76 |
| 4,736,391 | 4/1988 | Siegel | 330/11 X |
| 4,975,657 | 12/1990 | Eastmond | 330/279 |
| 5,025,251 | 6/1991 | Mitter et al. | 375/76 X |
| 5,091,920 | 2/1992 | Ikeda et al. | 375/76 |
| 5,307,196 | 4/1994 | Kinoshita | 375/76 |

FOREIGN PATENT DOCUMENTS

| 2905904 | 8/1980 | Germany | 375/76 |
| 115023 | 9/1981 | Japan | 307/564 |
| 5-10987 | 1/1993 | Japan . | |

OTHER PUBLICATIONS

Fiehmann et al, "Data Demodulator Circuit Arrangement," IBM Technical Disclosure Bulletin, vol. 20, No. 2, Jul. 1977, p. 769.

"A Burst Mode, Packet Receiver with Precision Reset and Automatic Dark Level Compensation for Optical Bus Communications", Swartz et al., VLSI Symp., pp. 67–68, 1993.

C. A. Eldering, "Theoretical Determination of Sensitivity Penalty for Burst Mode Fiber Optic Receivers", Journal of Lightwave Technology, vol. 11, No. 12, Dec. 1993, New York, pp. 2145–2149.

J. Akagi et al, "AlGaAs/GaAs HBT Receiver ICs for a 10 Gbps Optical Communication System", Proceedings of the Gallium Arsenide Integrated Circuit Symposium, New Orleans, Oct. 7–10, 1990, Nr. Symp. 12, pp. 45–48, Institute of Electrical and Electronics Engineers.

Primary Examiner—James B. Mullins
Attorney, Agent, or Firm—Finnegan, Henderson, Farabow, Garrett & Dunner

[57] ABSTRACT

An amplifier having an automatic threshold control circuit (ATC) and a limiting amplifier. The ATC detects and holds a top value (peak value) and bottom value of an input signal, and outputs the middle value between the top and bottom values as a reference voltage. The limiting amplifier amplifies the input signal in a linear operating region whose center is set at the reference voltage, thereby maintaining the output amplitude at a constant value. Even if the amplitude and the level of the input signals instantaneously changes by a large amount, the ATC can follow the change, so that the offset compensation and gain compensation of the amplifier can be achieved instantaneously. This makes it possible to continue producing the output of a constant amplitude with little phase deviations.

54 Claims, 33 Drawing Sheets

TRANSMITTER AND RECEIVER OF OPTICAL
DIGITAL COMMUNICATIONS SYSTEM

INPUT WAVEFORM

OUTPUT WAVEFORM

FIG.10A INPUT SIGNAL WAVEFORM TO FIRST STAGE

FIG.10B INPUT SIGNAL WAVEFORM TO SECOND STAGE

FIG.10C INPUT SIGNAL WAVEFORM TO THIRD STAGE

FIG.10D OUTPUT SIGNAL WAVEFORM FROM FINAL STAGE

Id-Vgs CHARACTERISTICS
OF TRANSISTOR

HIGH LEVEL LIMITING

LOW LEVEL LIMITING

Id-Vds CHARACTERISTICS
OF TRANSISTOR mn5

LOW LEVEL LIMITING 5,475,342

AMPLIFIER FOR STABLY MAINTAINING A CONSTANT OUTPUT

BACKGROUND OF THE INVENTION

1. Field of the Invention

The present invention relates to an amplifier for an optical receiver circuit, and particularly to an amplifier which can stably maintain a constant output amplitude by automatically and instantaneously controlling offset voltage and gain in response to wide range of changes in an input signal.

2. Description of Related Art

Amplifiers are essential in an optical digital communications system for amplifying an attenuated signal in an optical receiver circuit, or for generating a stable clock signal by extracting a timing signal from input data by using a timing signal recovery circuit. These amplifiers are required to have a large gain, a wide dynamic range for an input signal, and a constant output amplitude.

In an optical receiver circuit for an optical digital communications system as shown in FIG. 1, an optical signal is first converted into a current signal by a photodiode. Subsequently, the current signal is converted into a voltage signal, and then, amplified by an amplifier to a voltage amplitude, at which the logic levels can be identified. In addition, the voltage amplitude of the output signal must be maintained constant by automatically controlling the offset voltage and gain of the amplifier even if the input signal changes its level. A conventional amplifier implements these functions by combining a variable gain amplifier and a DC feedback circuit.

Recently, introduction of an optical communications system that handles a burst mode data signals of various signal levels has been studied. The optical receiver circuit of such a system strongly requires an amplifier that can maintain a constant output amplitude by instantaneously controlling the offset voltage and gain.

The conventional amplifier, however, has a problem in that it is slow in response because of a feedback loop, and cannot follow changes in the input signal. This problem will be explained in detail referring to FIG. 2 showing a conventional optical receiver circuit.

In this figure, the intensity of an optical signal is converted into a current by a photodiode 1, and the current signal produced from the photodiode 1 is amplified and converted into a voltage signal by a preamplifier 2. The voltage output from the preamplifier 2 is further amplified and converted into an output voltage of a fixed amplitude by a voltage amplifier 3 which automatically performs the offset compensation and the gain control. The output voltage of a fixed amplitude is produced from the output terminal To.

The offset compensation refers to a function which is achieved by providing the DC bias of the amplifier with an offset so that the reference voltage of the voltage amplifier 3 (that is, the voltage at point d of FIG. 2) is always set at the midpoint of the input signal waveform WF, which is shown by a dashed-and-dotted line in FIG. 2. Thus, the voltage amplifier 3 operates in the linear operating region whose center is the reference voltage.

For example, if the peak value (referred to as a top value below) of the output waveform WF from the preamplifier 2 varies as shown in FIG. 2 in response to changes in the optical digital signal inputted to the photodiode 1, and is amplified by a common amplifier, only half of the linear operating region of the amplifier (one direction with regard to the bottom value of the waveform) becomes available. Thus, a wide dynamic range cannot be efficiently achieved, and distortions of the output waveform and deviations of the duty thereof are liable to occur. In view of this, the reference voltage applied to the voltage amplifier 3 is continually controlled to always take the middle value of the waveform WF by providing the DC bias of the amplifier with an offset. Thus, the voltage amplifier 3 operates in the linear operating region whose center is determined at the renewed reference voltage.

More specifically, the offset control is carried out by an automatic offset compensation control circuit 5 including a top-holding capacitor 5A and a voltage amplifier 5B. The automatic offset compensation control circuit 5 detects the top value (peak value) of the output voltage of a variable gain amplifier 4, and feeds the detected component back to the offset control terminal d of the variable gain amplifier 4. Thus, the output waveform of the variable gain amplifier 4 is controlled to take a constant top level.

On the other hand, the gain control refers to a function that controls the gain of the voltage amplifier 3 in order to maintain its output amplitude even if the input signal changes its amplitude or level.

More specifically, the gain control is achieved by a gain control circuit 6 including a top-holding capacitor 6A and a voltage amplifier 6B. The gain control circuit 6 detects the top value of the output voltage of the variable gain amplifier 4, and feeds the detected component back to the gain control terminal c of the variable gain amplifier 4. Thus, the output amplitude of the voltage amplifier is controlled to take a constant value.

Combining these two feedback circuits can implement the offset compensation and the gain compensation at the same time. Thus, the automatic offset compensation control circuit 5 and the gain control circuit 6 have a top-detecting circuit composed of an amplifier and a capacitor. The top-detecting circuit charges the capacitor when the input is high, and blocks the discharge path by establishing a high output impedance of the amplifier when the input is low, thereby holding the detected top level of the waveform.

FIG. 3A schematically illustrates an input waveform to the conventional voltage amplifier, and FIG. 3B illustrates the output waveform of the voltage amplifier produced in response to the input waveform.

When the input waveform to the amplifier 4 changes instantaneously from a small to a large amplitude as illustrated in FIG. 3A, the output waveform begins to be generated under the condition that the small amplitude operation has established with regard to the gain and offset voltage, because the offset compensation and the gain compensation cannot be carried out instantaneously. As a result, the output waveform as illustrated in FIG. 3B is produced. In this case, a desired output amplitude cannot be obtained until the feedback fully achieves its function. The response delay is determined by the time constants associated with the capacitors 5A and 6A of the top-detecting circuits (that is, the automatic offset compensation control circuit 5 and the gain control circuit 6), and the delay times of the negative feedback circuits and the amplifier.

The time constants associated with the capacitors 5A and 6A of the top-detecting circuit must be reduced as small as possible, in order to implement a circuit which provides a desired output amplitude as quick as possible. Even this, however, cannot give a response characteristics quicker than the delay time of the amplifier. Furthermore, although the time constant of the automatic gain control circuit 6 and that of the automatic offset compensation control circuit 5 are set different from each other to achieve a stable operation, the difference between the two must be reduced to implement the instantaneous response. This would make the system unstable because of the interference between the two feedback loops. This instability of the system occurs because the offset and the gain of the voltage amplifier are not independent.

As described above, the output waveform of the voltage amplifier employed by the conventional optical receiver circuit largely changes in response to an instantaneous, large change in the input signal amplitude, and it takes rather a long time for the output waveform to take a constant amplitude. Thus, the conventional voltage amplifier is unsuitable to a receiver circuit that must achieve an instantaneous response to amplitude or level changes in a received optical signal. In other words, the conventional voltage amplifier has a problem in that the amplitude and duty of the output waveform are unstable because of the delay of the feedback circuits, when the amplitude or level of the input signal changes instantaneously.

SUMMARY OF THE INVENTION

It is therefore an object of the present invention to provide an amplifier which can output a signal of a constant amplitude and small phase deviations by performing the offset compensation and the gain compensation instantaneously, following large, instantaneous changes in the amplitude or level of the input signal.

According to a first aspect of the present invention, there is provided an amplifier comprising:

a limiting amplifier including a signal input terminal and a reference voltage input terminal, amplifying an input signal applied to the signal input terminal, and producing a limited output signal in the case where the amplitude of the input signal is greater than a predetermined value, and the level of the input signal is within a predetermined range with regard to a reference voltage applied to the reference voltage input terminal; and an automatic threshold control circuit supplying the reference voltage input terminal of the limiting amplifier with a substantially middle value between a top value of the input signal and a bottom value of the input signal as the reference voltage.

Here, the automatic threshold control circuit may comprise a top-hold circuit detecting and holding a top value of the input signal, a bottom-hold circuit detecting and holding a bottom value of the input signal, and a voltage divider that produces the substantially middle value between the top value and the bottom value as the reference voltage.

The top-hold circuit and the bottom-hold circuit may comprise a reset signal terminal, and produces an output signal of substantially the same predetermined level when the top-hold circuit and the bottom-hold circuit are reset by a reset signal externally supplied to the reset signal terminals.

The limiting amplifier may comprise:

a first amplifier including a first amplifying stage and a first output stage, the first amplifying stage and the first output stage including transistors of a first conductivity type; and a second amplifier including a second amplifying stage and a second output stage, and is connected in cascade with the first amplifier, the second amplifying stage and the second output stage including transistors of a second conductivity type which is different from the first conductivity type;

wherein the second amplifier is a non-inverting amplifier, and one of upper and lower limits of the limited output signal is limited by the first output stage, and the other of the upper and lower limits of the limited output signal is limited by the second output stage.

The first output stage may comprise a serial connection of a first source follower transistor and a first constant current source transistor, and the second output stage comprises a serial connection of a second source follower transistor and a second constant current source transistor, and wherein the one of upper and lower limits of the limited output signal is limited by a characteristic of the first source follower transistor, and the other of the upper and lower limits of the limited output signal is limited by a characteristic of the second source follower transistor.

The first amplifying stage may comprise a first differential amplifier including active load transistors of the second conductivity type, and a pair of transistors of the first conductivity type which drive the active load transistors, and the second amplifying stage comprises a second differential amplifier including active load transistors of the first conductivity type, and a pair of transistors of the second conductivity type which drive the active load transistors.

The amplifier may further comprise a first resistor connected between the output terminal of the first amplifier and the input terminal of the second amplifier, and a second resistor connected between the output terminal and the input terminal of the second amplifier.

The characteristic of the first source follower transistor may be a gate-source voltage of the first source follower transistor, and the characteristic of the second source follower transistor is a gate-source voltage of the second source follower transistor.

The gate-source voltage of the first source follower transistor may be determined by a current generated by the first constant current source transistor, and the gate-source voltage of the second source follower transistor is determined by a current generated by the second constant current source transistor.

The gate-source voltage of the first source follower transistor may be determined by a transistor size determined by a ratio of a channel width to a channel length of the first follower transistor, and the gate-source voltage of the second source follower transistor is determined by a transistor size determined by a ratio of a channel width to a channel length of the second follower transistor.

The limiting amplifier may comprise:

a first amplifier including a first amplifying stage and a first output stage, the first amplifying stage and the first output stage including transistors of a first conductivity type; and a second amplifier including a second amplifying stage and a second output stage, and is connected in cascade with the first amplifier, the second amplifying stage and the second output stage including transistors of a second conductivity type which is different from the first conductivity type;

wherein the second amplifier is an inverting amplifier including a signal input terminal and a reference voltage input terminal, and one of upper and lower limits of the limited output signal is limited by biasing a reference voltage applied to the reference voltage input terminal from the center of a linear operating region of the second amplifier, and the other of the upper and lower limits of the limited output signal is limited by the second output stage.

The second output stage may comprise a serial connection of a second source follower transistor and a second constant current source transistor, and wherein the other of the upper and lower limits of the limited output signal is limited by a characteristic of the second source follower transistor.

The first output stage may comprise a serial connection of a first source follower transistor and a first constant current source transistor, and wherein the other of the upper and lower limits of the limited output signal is further limited by a characteristic of the first source follower transistor.

The first amplifying stage may comprise a first differential amplifier including active load transistors of the second conductivity type, and a pair of transistors of the first conductivity type which drive the active load transistors, and the second amplifying stage comprises a second differential amplifier including active load transistors of the first conductivity type, and a pair of transistors of the second conductivity type which drive the active load transistors.

The amplifier may further comprise a first resistor connected between the output terminal of the first amplifier and the input terminal of the second amplifier, and a second resistor connected between the output terminal and the input terminal of the second amplifier.

The amplifier may further comprise a clamping diode, and a fixed voltage terminal to which a fixed voltage is applied from the outside, wherein the clamping diode is connected between the output terminal of the bottom-hold circuit and the fixed voltage terminal, and wherein each of the top-hold circuit and the bottom-hold circuit includes a reset signal terminal, and voltages of the input terminal and output terminal of the top-hold circuit and those of the bottom-hold circuit are made substantially equal when the top-hold circuit and the bottom-hold circuit are reset by an external reset signal.

The amplifier may further comprise a clamping diode, and a fixed voltage terminal to which a fixed voltage is applied from the outside, wherein the clamping diode is connected between the output terminal of the top-hold circuit and the fixed voltage terminal, and wherein each of the top-hold circuit and the bottom-hold circuit includes a reset signal terminal, and voltages of the input terminal and output terminal of the top-hold circuit and those of the bottom-hold circuit are made substantially equal when the top-hold circuit and the bottom-hold circuit are reset by an external reset signal.

The amplifier may further comprise a transistor, the drain of the transistor being connected to the signal input terminal or the output terminal of the limiting amplifier, the source of the transistor being connected to a common terminal, and the gate of the transistor being provided with the reset signal.

The amplifier may further comprise a transistor, the drain of the transistor being connected to the signal input terminal or the output terminal of the limiting amplifier, the source of the transistor being connected to a common terminal, and the gate of the transistor being provided with the reset signal, wherein the reset signal is ended in accordance with a start timing of receiving the input signal.

According to a second aspect of the present invention, there is provided an amplifier including a plurality of basic amplifiers connected in cascade, each of the basic amplifiers comprising:

a limiting amplifier including a signal input terminal and a reference voltage input terminal, amplifying an input signal applied to the signal input terminal, and producing a limited output signal in the case where the amplitude of the input signal is greater than a predetermined value, and the level of the input signal is within a predetermined range with regard to a reference voltage applied to the reference voltage input terminal; and an automatic threshold control circuit supplying the reference voltage input terminal of the limiting amplifier with a substantially middle value between a top value of the input signal and a bottom value of the input signal as the reference voltage.

Here, the automatic threshold control circuit may comprise a top-hold circuit detecting and holding a top value of the input signal, a bottom-hold circuit detecting and holding a bottom value of the input signal, and a voltage divider producing the substantially middle value between the top value and the bottom value as the reference voltage.

Each of the top-hold circuit and the bottom-hold circuit may comprise a reset signal terminal, and produces an output signal of substantially the same predetermined level when the top-hold circuit and the bottom-hold circuit are reset by a reset signal externally supplied to the reset signal terminals.

The amplifier may further comprise a delay circuit interposed between each two consecutive basic amplifiers of the plurality of basic amplifiers connected in cascade, so that the top-hold circuit and the bottom-hold circuit of each of the plurality of basic amplifiers are reset sequentially.

According to a third aspect of the present invention, there is provided a limiting amplifier amplifying an input signal, and producing a limited output signal whose amplitude is limited, the limiting amplifier comprising:

a first amplifier including a first amplifying stage and a first output stage, the first amplifying stage and the first output stage including transistors of a first conductivity type; and a second amplifier including a second amplifying stage and a second output stage, and is connected in cascade with the first amplifier, the second amplifying stage and the second output stage including transistors of a second conductivity type which is different from the first conductivity type;

wherein the second amplifier is a non-inverting amplifier, and one of upper and lower limits of the limited output signal is limited by the first output stage, and the other of the upper and lower limits of the limited output signal is limited by the second output stage.

According to a fourth aspect of the present invention, there is provided an amplifier comprising:

a limiting amplifier including a signal input terminal and a reference voltage input terminal, amplifying an input signal applied to the signal input terminal, and producing a limited output signal in the case where the amplitude of the input signal is greater than a predetermined value, and the level of the input signal is within a predetermined range with regard to a reference voltage applied to the reference voltage input terminal; and an automatic threshold control circuit supplying the reference voltage to the reference voltage input terminal of the limiting amplifier, wherein the automatic threshold control circuit comprises a top-hold circuit detecting and holding a top value of the input signal, and a voltage divider producing, as the reference voltage, a divided voltage between the output of the top-hold circuit and a fixed voltage which is supplied from the outside, and wherein voltages of the input terminal and output terminal of the top-hold circuit are made substantially equal when the top-hold circuit is reset by an external reset signal.

According to a fifth aspect of the present invention, there is provided an amplifier comprising:

a limiting amplifier including a signal input terminal and a reference voltage input terminal, amplifying an input signal applied to the signal input terminal, and producing a limited output signal in the case where the amplitude of the input signal is greater than a predetermined value, and the level of the input signal is within a predetermined range with regard to a reference voltage applied to the reference voltage input terminal; and an automatic threshold control circuit supplying the reference voltage to the reference voltage input terminal of the limiting amplifier, wherein the automatic threshold control circuit comprises a bottom-hold circuit detecting and holding a bottom value of the input signal, and a voltage divider producing, as the reference voltage, a divided voltage between the output of the bottom-hold circuit and a fixed voltage which is supplied from the out side, and wherein voltages of the input terminal and output terminal of the bottom-hold circuit are made substantially equal when the bottom-hold circuit is reset by an external reset signal.

The present invention combines the automatic threshold control circuit and the limiting amplifier. The automatic threshold control circuit detects the top value and bottom value of the input signal waveform, and outputs the midpoint between the two values as the reference voltage. The limiting amplifier maintains its output amplitude at a fixed value by operating on the basis of the reference voltage. This makes it possible to carry out instantaneous offset compensation and gain compensation for the amplitude or level change in the input signal, and to maintain the constant amplitude output with little waveform distortion and duty fluctuations. Moreover, a multi-staged configuration of the basic circuit makes it possible to implement a wide dynamic range, and to reduce offset variations involved in fabrication processes of integrated circuits.

Furthermore, the reset function added to the basic circuit immediately returns the top value and the bottom value of the input signal waveform to their initial values. This makes it possible for the voltage amplifier to respond to instantaneous changes in the input signal from a large to a small amplitude.

In addition, since the delay circuits are added between the reset signal terminals of the basic circuits connected in cascade, and the reset signal terminal of the first stage basic circuit is used as the reset signal terminal of the whole circuit, the reset operation is sequentially carried out from the first stage to the last stage, thereby carrying out correct initialization of each stage.

Since the limited output amplitude of the amplifier is determined by the transistor characteristics such as transistor sizes by using the limiting amplifier in accordance with the present invention, the amplitude fluctuations of the limited output can be reduced in comparison with the conventional amplifier. Thus, the amplifier in accordance with the present invention is preferably applied to equalizing amplifiers of various communications systems, and serves to implement a high accuracy timing signal recovery circuit.

Finally, the present invention can provide an amplifier which can prevent bit errors during a signal-less period from the reset signal generation to the reception of the input signal, and which serves to implement high accuracy receiver circuits of the communications systems.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 4:
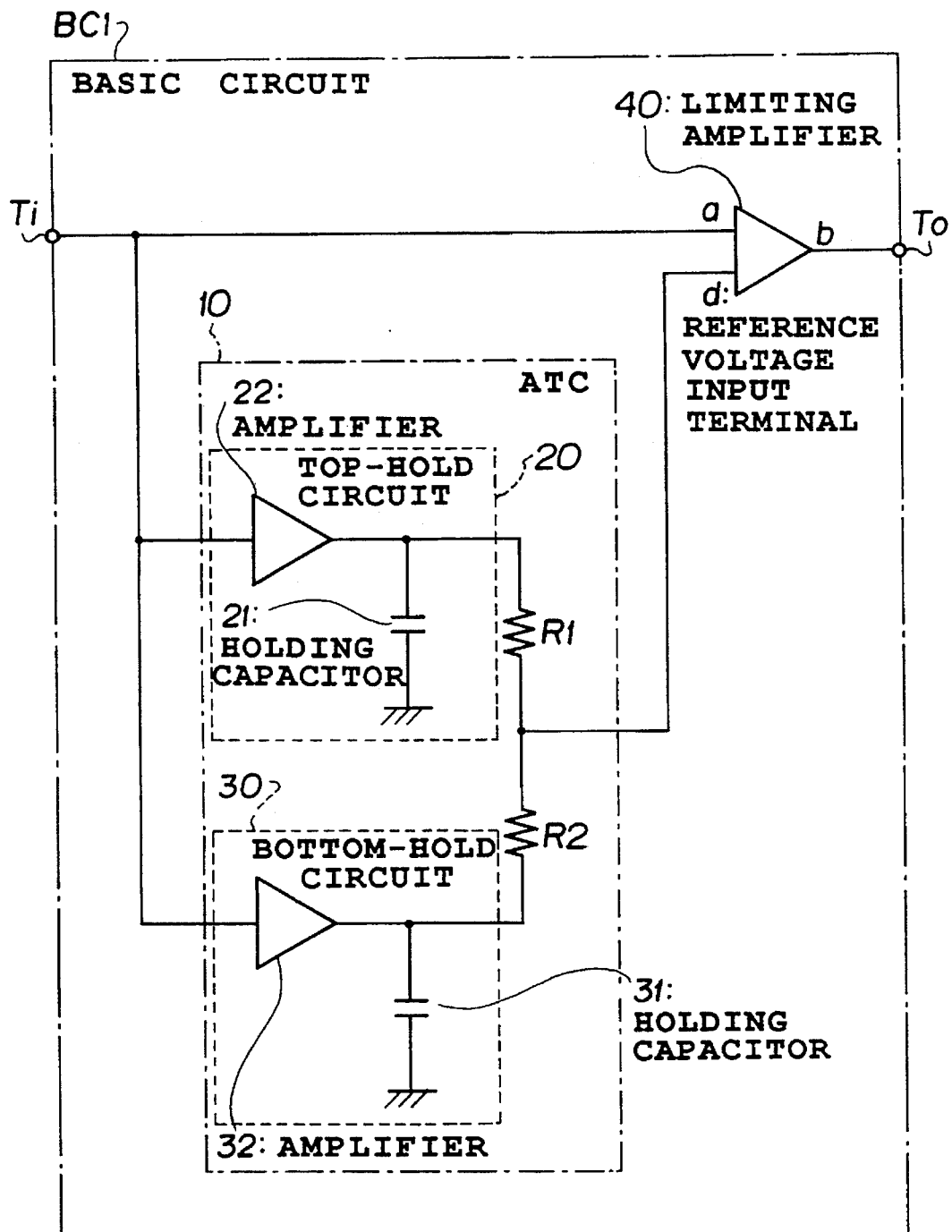
FIG. 4 is a circuit diagram showing a basic circuit BC1 of a first embodiment in accordance with the present invention.

FIG. 4 is a circuit diagram showing a basic circuit BC1 of a first embodiment in accordance with the present invention.

The basic circuit BC1 includes an ATC (Automatic Threshold Control circuit) 10, and a limiting amplifier 40, in addition to an input terminal Ti and an output terminal To.

The ATC 10 is an example that detects and holds the top value and the bottom value of the input waveform, and outputs an approximately middle value between the top value and the bottom value, as a reference voltage. The ATC 10 comprises a top value detect and hold circuit (referred to as a top-hold circuit below for the purpose of simplicity) 20, a bottom value detect and hold circuit 30 (referred to as a bottom-hold circuit below for the purpose of simplicity) 30, and resistors R1 and R2 connected in series between the output terminals of the two circuits 20 and 30. The top-hold circuit 20 has a holding capacitor 21 and an amplifier 22, and detects and holds the top value of the input signal waveform applied to the input terminal Ti. The bottom-hold circuit 30 has a holding capacitor 31 and an amplifier 32, and detects and holds the bottom value of the input signal waveform applied to the input terminal Ti.

The top-hold circuit 20 charges the holding capacitor 21 while the input signal is high, and blocks the discharge path by making the output impedance of the amplifier 22 high while the input signal is low, thereby detecting and holding the top value of the waveform. Conversely, the bottom-hold circuit 30 charges the holding capacitor 31 while the input signal is low, and blocks the discharge path by making the output impedance of the amplifier 32 high while the input signal is high, thereby detecting and holding the bottom value of the waveform.

The limiting amplifier 40 receives the input signal which is supplied from the input terminal Ti, and the reference voltage which makes the input signal operate in the linear operating region, and produces the output signal of a constant amplitude when the amplitude of the input signal exceeds a particular level. The limiting amplifier 40 has an input terminal a, an output terminal b, and a reference voltage (offset voltage) control terminal d.

The input terminal a of the limiting amplifier 40 and the input terminal of the ATC 10 are connected in common to the input terminal Ti of the basic circuit BC1. The output terminal of the ATC 10 is connected to the reference voltage input terminal d of the limiting amplifier 40, and the output terminal b of the limiting amplifier 40 is connected to the output terminal To of the basic circuit BC1.

Next, the operation of this embodiment will be described.

First, the top-hold circuit 20 and the bottom-hold circuit 30 generate the top value and the bottom value of the input signal waveform, respectively. Then, the middle voltage between the top value and the bottom value is generated from the voltage divider consisting of the resistors R1 and R2. The middle voltage is applied to the limiting amplifier 40 as its reference voltage (offset voltage) so that the offset compensating operation is carried out.

The limiting amplifier 40 also implements the gain compensating operation by limiting the output amplitude associated with an input signal whose amplitude is above a certain level.

Figure 2:
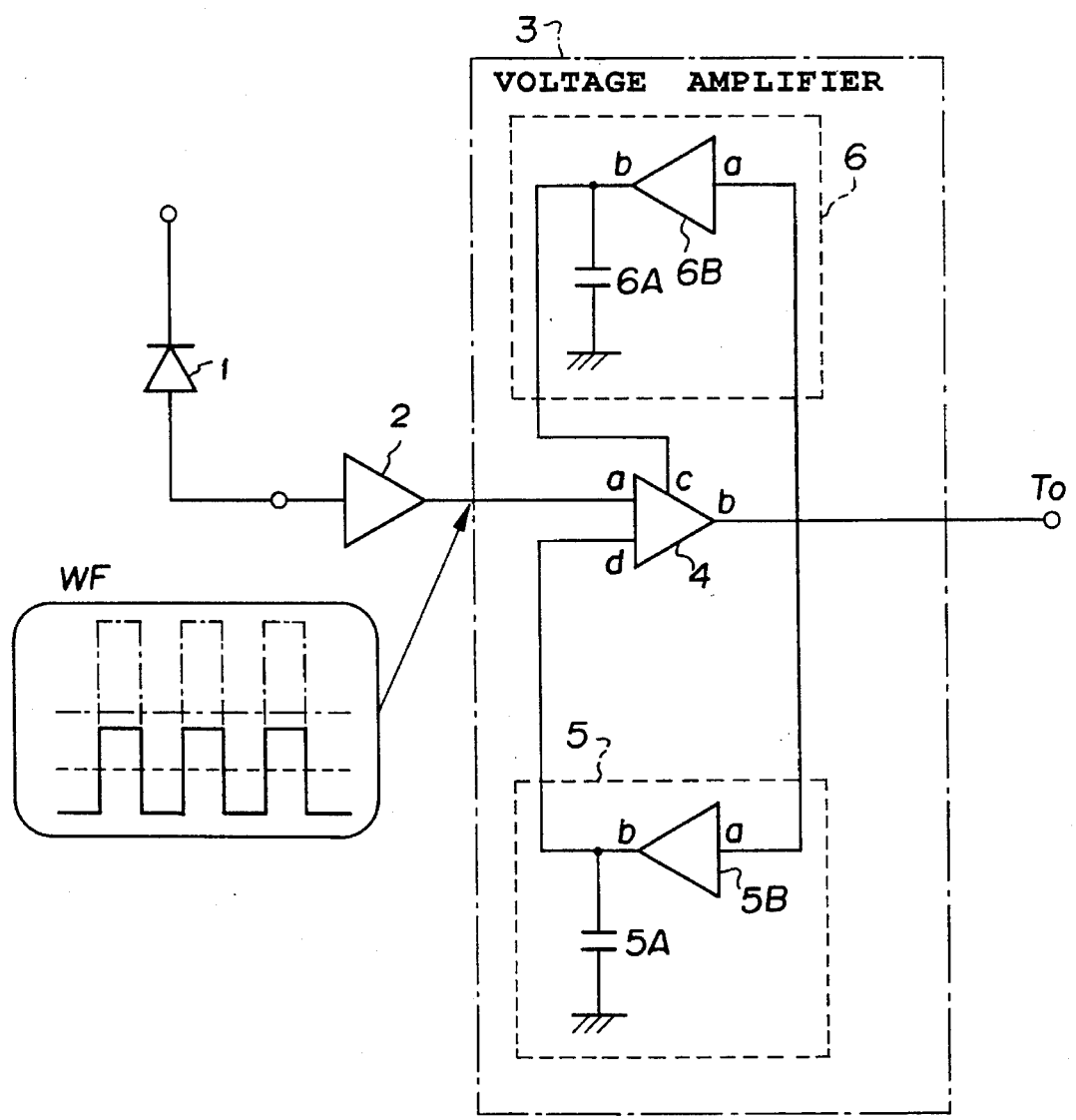
FIG. 2 is a circuit diagram showing a conventional optical receiver circuit.

According to this embodiment, the delay of response involved in the offset compensation and gain compensation, which mainly occurs owing to the negative feedback loop in the conventional circuit as shown in FIG. 2, can be greatly reduced, because the response time of this embodiment is determined by the time constant of the top-hold circuit 20 and that of the bottom-hold circuit 30. Reduction of these time constants to a certain level will prevent the entire circuit from becoming unstable, which is different from the conventional circuit as shown in FIG. 2. Thus, this embodiment can achieve the offset compensation and the gain compensation at the same time during a single bit of the signal.

Figure 5A:
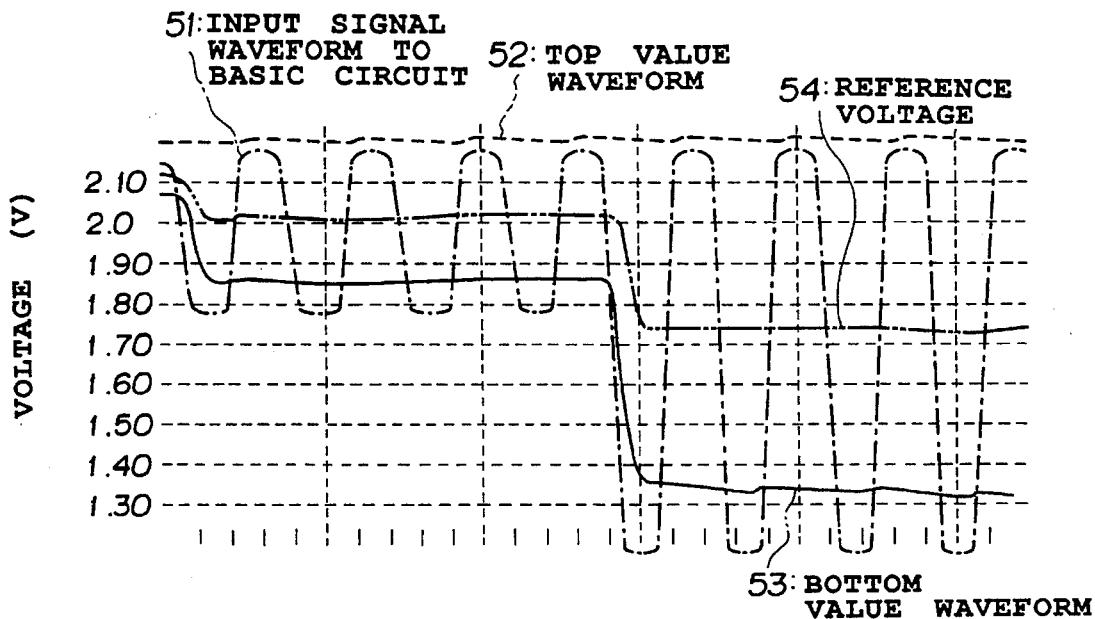
FIGS. 5A and 5B are waveform diagrams illustrating simulation results of the input and output waveforms in the first embodiment.
Figure 5B:
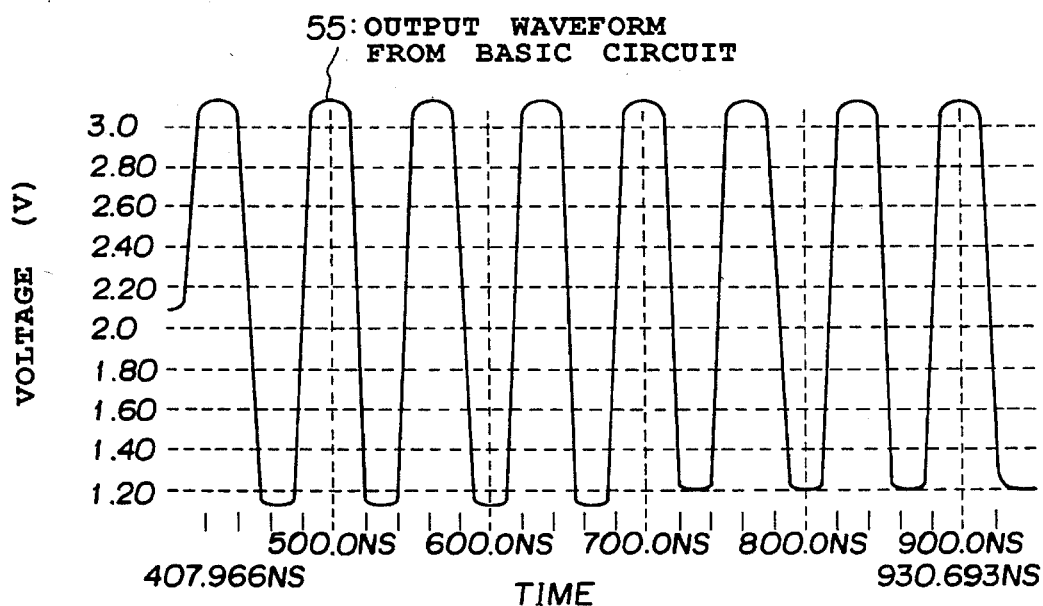

FIGS. 5A and 5B show simulation results of the input and output waveforms in the present embodiment. The simulation was carried out under the assumptions that the amplifiers were differential amplifiers fabricated using 0.8 micrometer MOS integrated circuit technique, and that the code rate of the input signal was 30 Mb/s.

FIG. 5A shows the input signal waveform 51 at the input terminal Ti, the output signal waveform 52 of the top-hold circuit 20, the output signal waveform 53 of the bottom-hold circuit 30, and the output signal waveform 54 of the ATC 10. FIG. 5B shows the output signal waveform 55 of the limiting amplifier 40. The output signal waveform 54 of the ATC 10 is the signal waveform applied to the reference voltage input terminal d of the limiting amplifier 40, and the output signal waveform 55 of the limiting amplifier 40 is the output signal waveform of the basic circuit BC1.

As will be seen from these figures, the output signal waveform 52 of the top-hold circuit 20 and the output signal waveform 53 of the bottom-hold circuit 30 instantaneously follow the transition from a small to a large amplitude of the input signal. Thus, the reference voltage, that is, the output signal waveform 54 of the ATC 10, is instantaneously set within a single bit duration of the data.

The limiting amplifier 40, receiving the input signal and the reference voltage, performs a limiting amplification that limits the output amplitude. Since the reference voltage is set at the midpoint of the input signal waveform 51, the output signal waveform 55 of the limiting amplifier 40 (that is, the output of the basic circuit BC1) includes little waveform distortions or duty fluctuations, and continues to output a signal of a fixed amplitude.

Thus, this embodiment carries out instantaneous offset and gain compensations against changes in the input signal, and continues the output signal of a fixed amplitude including little waveform distortions and duty fluctuations.

Effects of the present embodiment were confirmed by a prototype integrated circuit corresponding to an optical receiver of a PDS (Passive Double Star) subscriber system. An amplifier IC (integrated circuit) of this embodiment was combined with a photodiode and a low-noise CMOS preamplifier to constitute a receiver module. The receiver module achieved a minimum receiving sensitivity of −42 dBm, and a dynamic range of 25 dB in a burst transmission of 29 Mb/s, which were not achieved in the conventional circuit. In addition, the instantaneous response of the amplifier IC during a single bit was confirmed in the transmission test. Table 1 shows measured results of the characteristics of the amplifier IC and the receiver module.

TABLE I

| | PROTOTYPE IC PERFORMANCE | |
|---|---|---|
| AMP IC | DYNAMIC RANGE | >65 dB (IN VOLTAGE POWER) |
| | GAIN | >60 dB (IN VOLTAGE POWER) |
| | BANDWIDTH | >60 MHz |
| RECEIVER MODULE | MINIMUM RECEIVING SENSITIVITY −42 dBm (IN OPTICAL POWER: η = 0.85 A/W) | |

TABLE I-continued

| PROTOTYPE IC PERFORMANCE | |
|---|---|
| DYNAMIC RANGE | 25 dB (IN OPTICAL POWER) |
| SUPPLY VOLTAGE | +5v SINGLE |

This embodiment is suitable for the low-cost CMOS process because it can allow considerable offset variations. This embodiment is also suitable for integrated circuits because it operates without adjustment and requires no external components such as level holding capacitors. Thus, this embodiment is very advantageous to reduce the cost of the receiver.

In addition, the amplifier of this embodiment is expected to serve as a high gain, wide dynamic range, low jitter limiting amplifier, which is needed in wireless communications systems or in measurement systems.

EMBODIMENT 2

Figure 6:
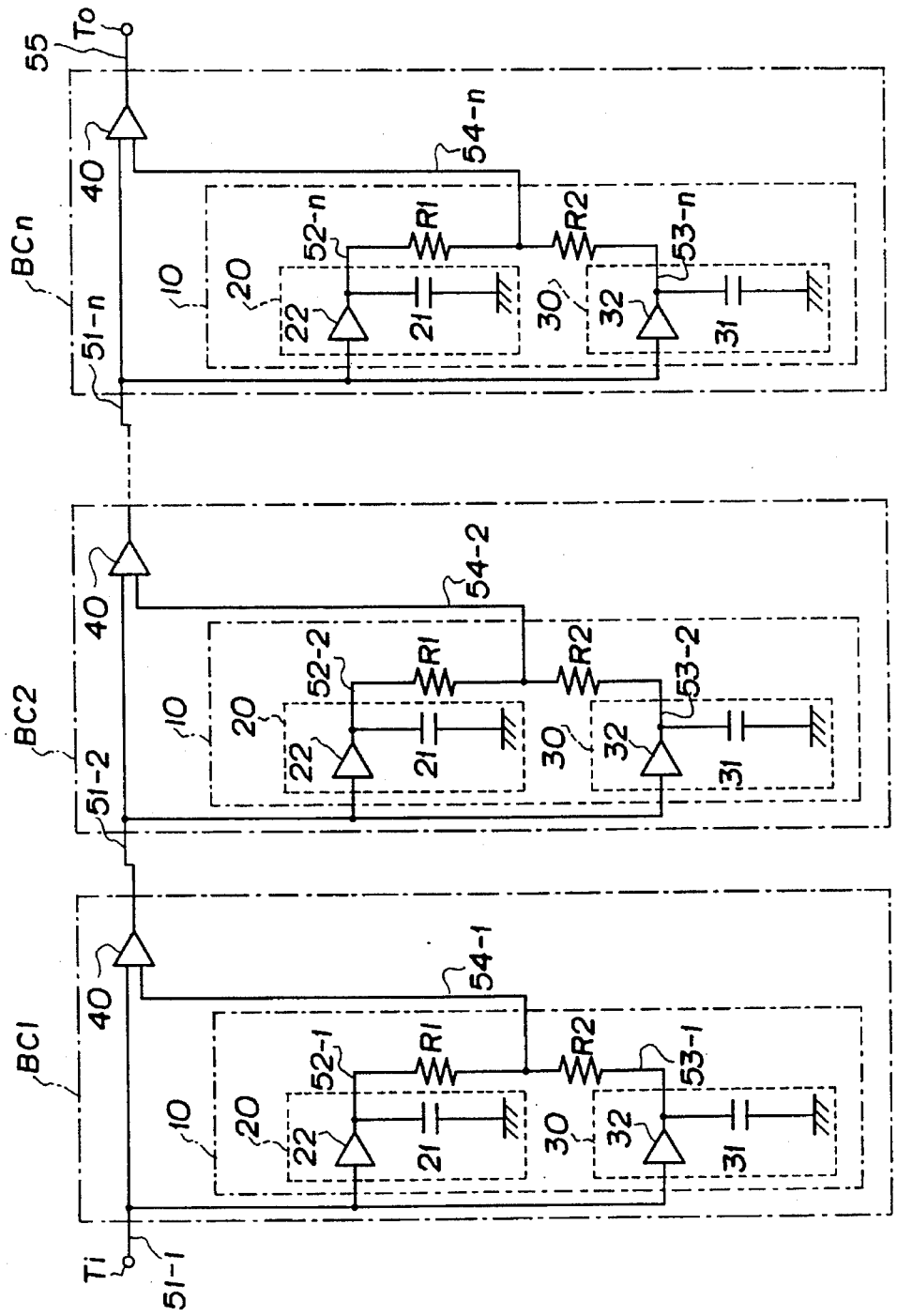
FIG. 6 is a circuit diagram showing a second embodiment in accordance with the present invention, in which n basic circuits BC1 as shown in FIG. 4 are connected in cascade.

FIG. 6 is a circuit diagram showing a second embodiment in accordance with the present invention, in which n basic circuits BC1, BC2, . . . , and BCn, which are identical to the basic circuit BC1 shown in FIG. 4, are connected in cascade.

This n-stage cascade connection of the basic circuit BC1, BC2, . . . , and BCn makes possible the wide dynamic range amplification of the input signal. In addition, it can tolerate the variations in the amplifiers 22, 32 and 40, resistors R1 and R2, and the holding capacitors 21 and 31 due to variations in the components caused during fabrication of the integrated circuit. This will be explained in more detail below.

Figure 7:
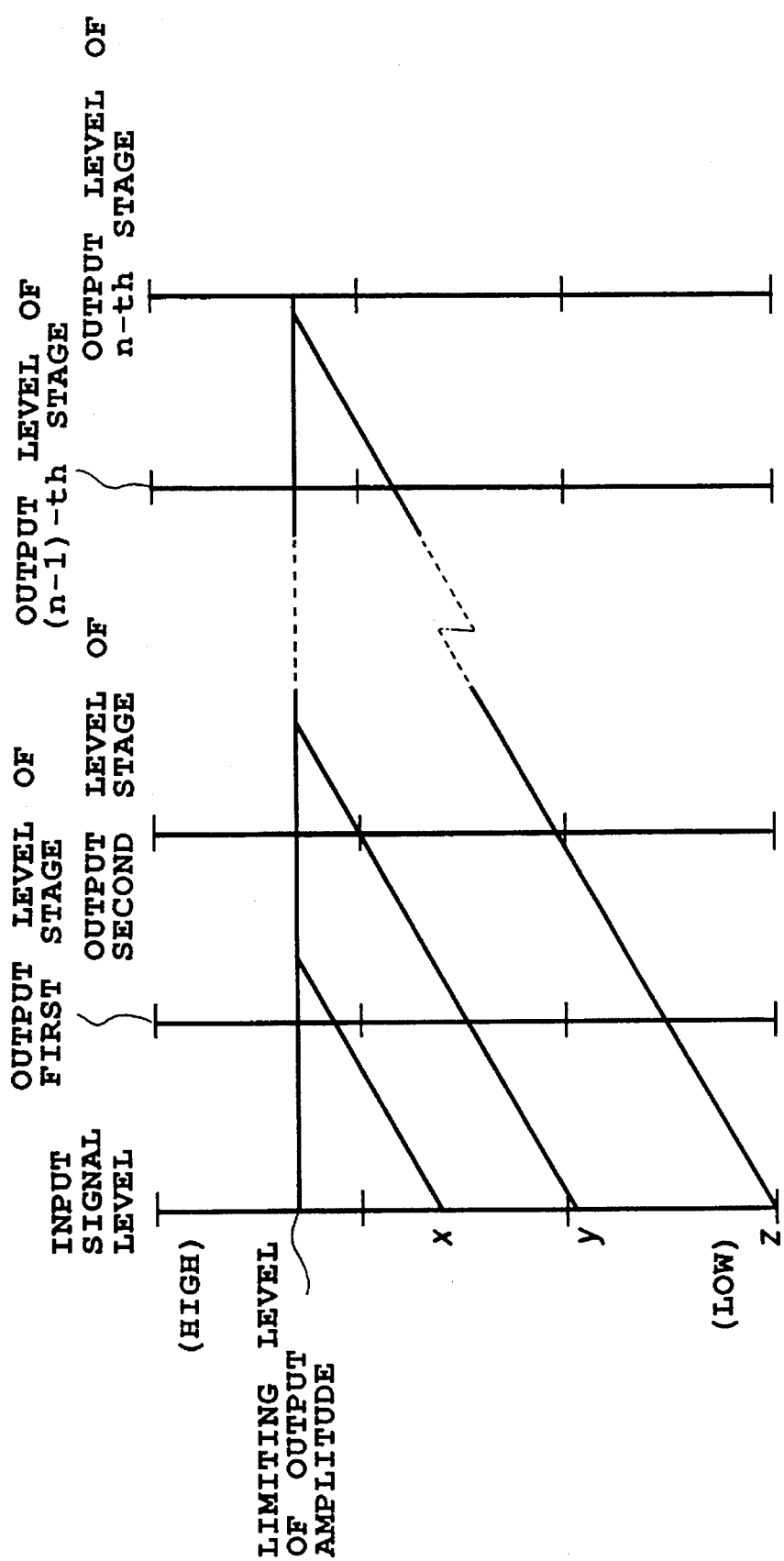
FIG. 7 is a level diagram showing output levels of respective stages of the second embodiment as shown in FIG. 6.

FIG. 7 schematically illustrates the level diagram of this embodiment as shown in FIG. 6.

FIG. 7 shows that if the input signal level to the basic circuit BC1 is x, the second basic circuit BC2 limits the amplitude of the output signal associated with the input signal. If the input signal level to the basic circuit BC1 is y, the third basic circuit BC3 limits the amplitude of the output signal associated with the input signal, and if the input signal level to the basic circuit BC1 is z, which is still smaller, the n-th basic circuit BCn limits the amplitude of the output signal associated with the input signal. Thus, the received minimum level of the input signal to the first stage basic circuit BC1 can be further improved as the number of stages of the basic circuits is increased, thereby increasing the dynamic range.

Figure 8:
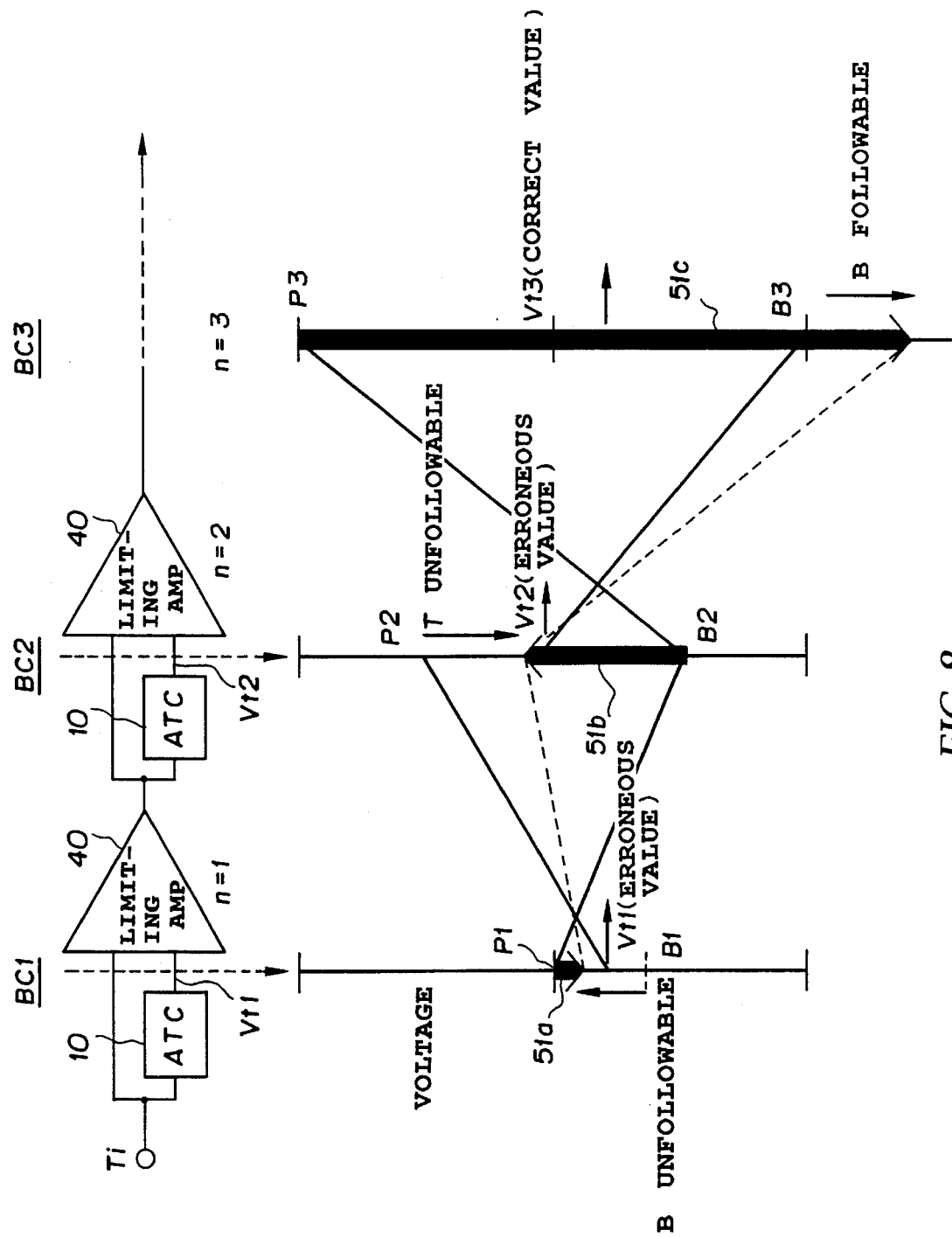
FIG. 8 is a diagram illustrating offset compensation operations at respective stages in the multi-staged configuration as shown in FIG. 6.

FIG. 8 illustrates the offset compensation operations at individual stages in the multi-staged configuration as shown in FIG. 6.

FIG. 8 illustrates the way in which the multi-stages reduce the amount of deviation of the output of the ATC 10 in the first basic circuit BC1 from the middle value of the input signal, considering variations in the components (variations in the transistor performances, resistances, and capacitances) involved in the fabrication processes of the integrated circuit.

In this figure, the bold arrows 51a, 51b and 51c represent the amplitudes of the input signals to the respective stages, P1, P2 and P3 designate the output levels of the top-hold circuits 20 of the respective stages, B1, B2 and B3 designates the output levels of the bottom-hold circuits 30 of the respective stages, and Vt1, Vt2 and Vt3 denote the output levels of the ATCs 10 of the respective stages.

In the circuit operation, it is assumed that although the top-hold circuits 20 follow and hold the changes from a low level to a high level, it does not follow the inverse changes from a high level to a low level. At the same time, it is assumed that although the bottom-hold circuits 30 follow and hold the changes from a high level to a low level, it does not follow the inverse changes from a low level to a high level. This is because the detection and holding of the top value and the bottom value are generally carried out by charging a capacitor, which can follow in one direction only.

As will be seen from FIG. 8, although the reference voltage Vt1 of the first stage is not set at the center of the amplitude of the input signal, the reference voltage Vt3 of the limiting amplifier 40 of the third stage is set at the center of the signal amplitude, after repeating the amplification (inverting amplification) together with the detection and holding of the top and bottom values.

Thus, the multi-stages can tolerate more component variations (variations in transistor performances, resistances and capacitances) involved during the fabrication of the integrated circuit. This is because the reference voltages are generated through the voltage dividers consisting of the resistors R1 and R2, and hence, the gain for the reference voltage is less than the gain for the signal by an amount of 6 dB at each stage when R1= R2. Thus, the gain difference, together with the multi-stages, allows the variations generated during the fabrication.

The relationships between the number of stages and the allowable offset voltage $V_{off}$ are obtained analytically. Assuming that the voltage gain of the limiting amplifier 40 is Av, and the minimum amplitude of the input signal is Vs, the condition for setting an optimum reference voltage is given by the following expression, because the optimum reference voltage is obtained when the amplified signal output amplitude exceeds the amplified voltage of the offset voltage Voff applied to the first limiter amplifier.

$$Voff \cdot Av \cdot (Av/2)^{n-1} < Vs \cdot (Av)^n \quad (1)$$

Reducing this expression gives $$Voff < Vs \cdot 2^{n-1} \quad (2)$$

It should be noticed here that the allowable offset voltage Voff at the input terminal of the limiting amplifier in the first stage is determined by the number of the stages, independent of the gain of the amplifiers.

Figure 9:
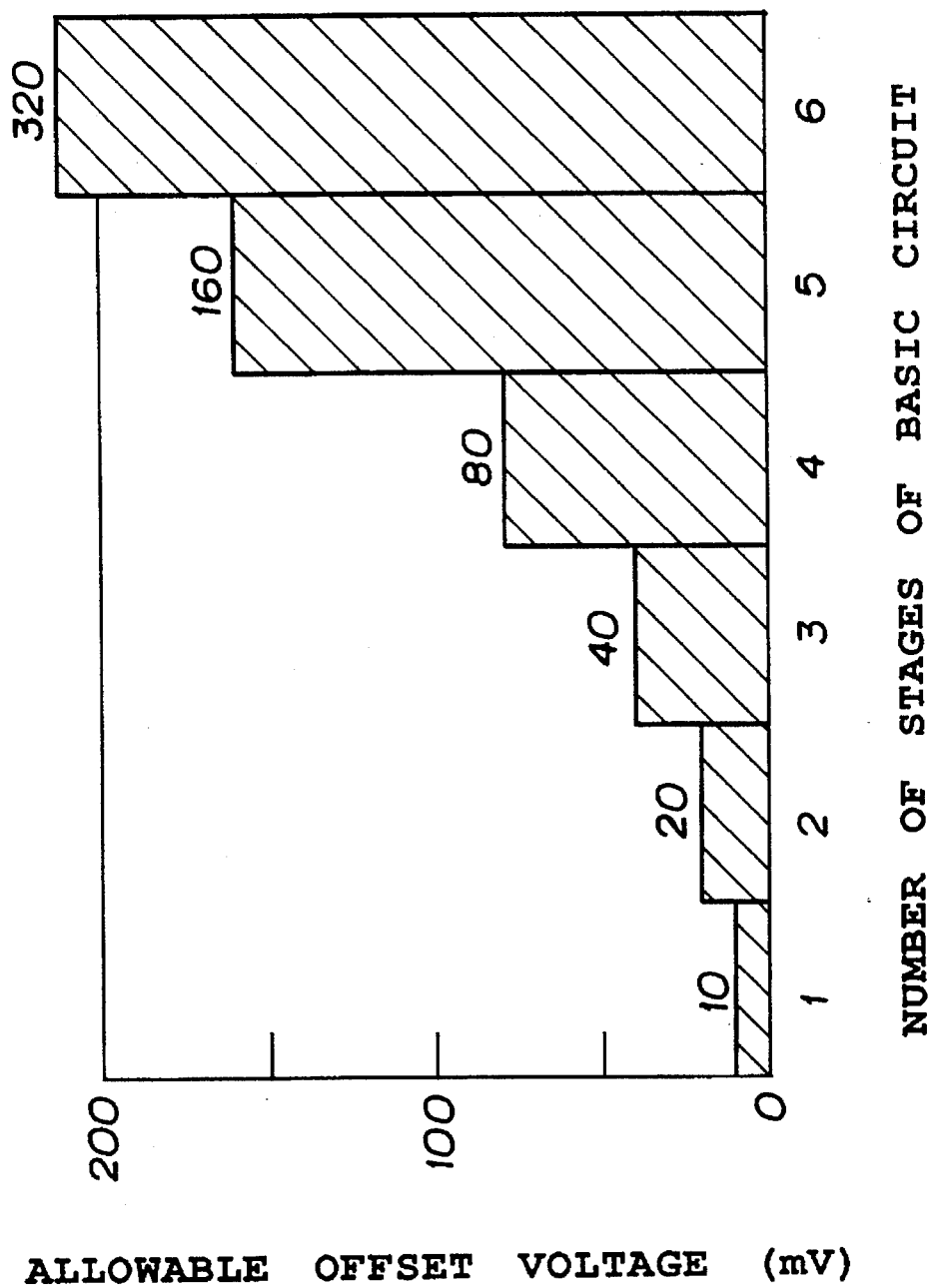
FIG. 9 is a graph illustrating the relationships between the number of stages and allowable offset voltages due to variations of devices caused by fabrication processes, when the minimum amplitude of the input signal is assumed to be 10 mV in the multi-staged configuration as shown in FIG. 6.
Figure 10:
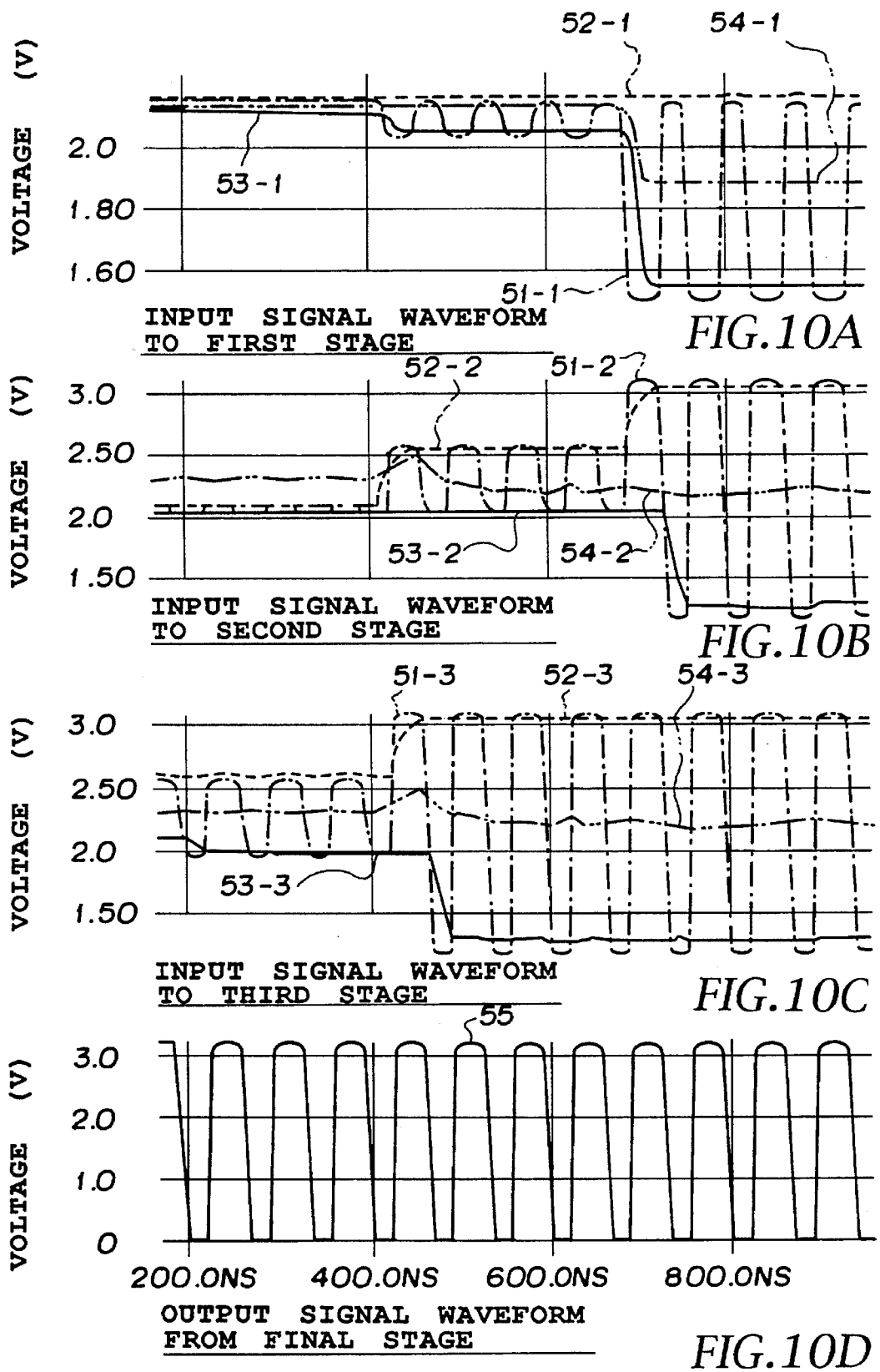
FIGS. 10A–10D are diagrams illustrating simulation results of waveforms when the number of stages is three in the multi-staged configuration as shown in FIG. 6.

FIG. 9 shows the relationships between the number of stages in the multi-staged configuration as shown in FIG. 6 and the allowable offset voltages caused by the variations in the components involved in the fabrication processes. The relationships were calculated using expression (2), assuming that the minimum amplitude Vs is 10 mV.

As will be seen from FIG. 9, the allowable offset voltage increases consistently with the number of stages of the basic circuits.

Figure 3A:
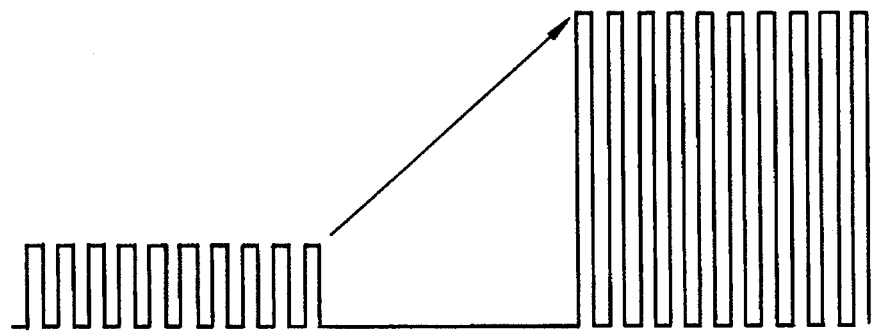
FIGS. 3A and 3B are diagrams schematically illustrating input and output waveforms of the voltage amplifier of the conventional optical receiver circuit.
Figure 3B:
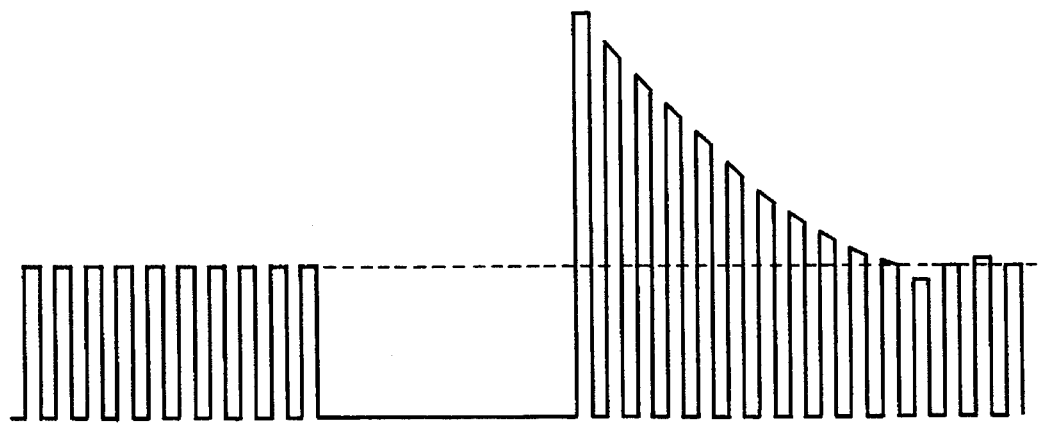

FIGS. 10A–10D illustrate simulation results of the operational waveforms when the number of stages of the multi-staged configuration as shown in FIG. 3 was three. It was assumed in the simulation that the code rate of the input signal was 30 Mb/s, and that the amplifiers were a differential amplifier.

FIGS. 10A–10D illustrate the input signal waveforms 51-1, 51-2 and 51-3 at the input terminals of the limiting amplifiers 40 of the respective stages, the output signal waveforms 52-1, 52-2 and 52-3 of the top-hold circuits 20 of the respective stages, the output signal waveforms 53-1, 53-2 and 53-3 of the bottom-hold circuits 30 of the respective stages, the output signal waveforms 54-1, 54-2 and 54-3 of ATCs 10 of the respective stages, and the output signal waveform 55 of the final stage. The numerals attached via a hyphen to the numerals denoting the signal waveforms designate the stage numbers. For example, the input signal waveform 51-1 designates the input signal waveform to the first basic circuit BC1, and the output signal waveform 52-3 designates the output signal waveform from the third basic circuit BC3.

The amplitude of the input signal waveform 51-1 to the first stage was set at 0.0065 V from the beginning to 400 ns, at 0.065 V from 400 ns to 700 ns, and at 0.65 V thereafter. The output amplitude of the final stage was set at 3.2 V. The input signal of the minimum amplitude of 0.0065 V was limited at the third stage, the input signal of 0.065 V was limited at the second stage, and the input signal of 0.65 V was limited at the first stage. The optimum setting of the reference voltage makes it possible to produce the output signal waveform of a fixed amplitude and of little duty fluctuations for a dynamic range of 40 dB of 0.0065 V–0.65 V.

EMBODIMENT 3

Figure 11:
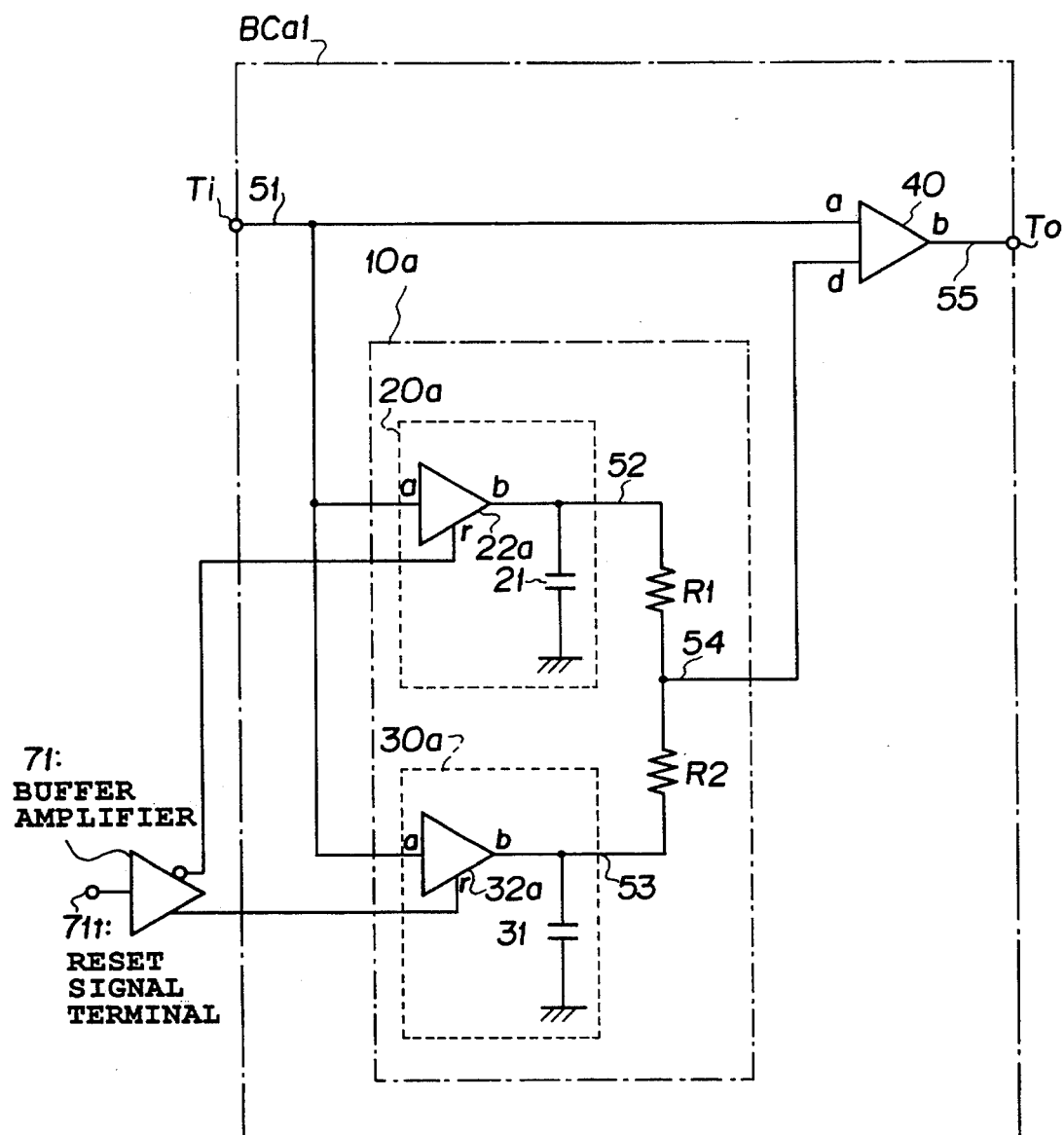
FIG. 11 is a circuit diagram showing a third embodiment in accordance with the present invention, which includes a reset function added to the basic circuit as shown in FIG. 4.

FIG. 11 shows a third embodiment, in which a reset function is added to the first embodiment as shown in FIG. 4.

Although the basic circuit BCa1 as shown in FIG. 11 is fundamentally similar to the basic circuit BC1 as shown in FIG. 4, the basic circuit BCa1 differs from the basic circuit 10 in that it has an ATC 10a instead of the ATC 10, and that a reset signal terminal 71t is connected to the basic circuit BCa1 via a buffer amplifier 71 for the reset signal. Specifically, the ATC 10a of the basic circuit BCa1 is connected to the reset signal terminal 71t via the external buffer amplifier 71, so that the input signal and output signal of the ATC 10a, that is, the voltages at points a and d of FIG. 11, are made equipotential by a signal applied to the reset signal terminal 71t.

The ATC 10a differs from the ATC 10 in that it has a top-hold circuit 20a instead of the top-hold circuit 20, and a bottom-hold circuit 30a instead of the bottom-hold circuit 30. The top-hold circuit 20a differs from the top-hold circuit 20 in that it includes an amplifier 22a having a reset signal terminal r instead of the amplifier 22. Likewise, the bottom-hold circuit 30a differs from the bottom-hold circuit 30 in that it includes an amplifier 32a having a reset signal terminal r instead of the amplifier 32.

The top-hold circuit 20 and the bottom-hold circuit 30 of the first embodiment as shown in FIG. 4 can only follow the level changes in one direction as described above. As a result, although they can instantaneously follow the input signal changes from a small amplitude to a large amplitude as shown in FIGS. 10A–10D, they cannot follow the inverse changes from a large amplitude to a small amplitude. The present embodiment as shown in FIG. 11, however, can follow the input signal even when the amplitude of the input signal reduces.

More specifically, the electric charges in the holding capacitors 21 and 31 of the top-hold circuit 20a and the bottom-hold circuit 30a are instantaneously discharged by the reset signal, and the circuits 20a and 30a are returned to the initial state in this embodiment. Hence, if these circuits 20a and 30a are returned to the initial states immediately before the input signal changes from a small amplitude to a large amplitude, the ATC 10a can instantaneously respond to this change. Thus, the reset function of the top-hold circuit 20a and the bottom-hold circuit 30a refers to the function that instantaneously discharges the electric charges stored in the holding capacitors 21 and 31, thereby returning the circuits 20a and 30a to the initial state.

Figure 12A:
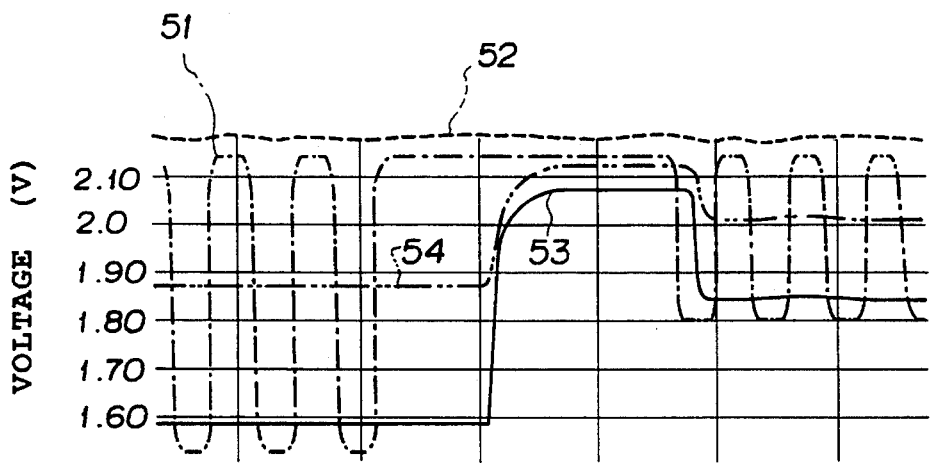
FIGS. 12A–12C are diagrams illustrating simulation results of the reset operation in the third embodiment as shown in FIG. 11.
Figure 12B:
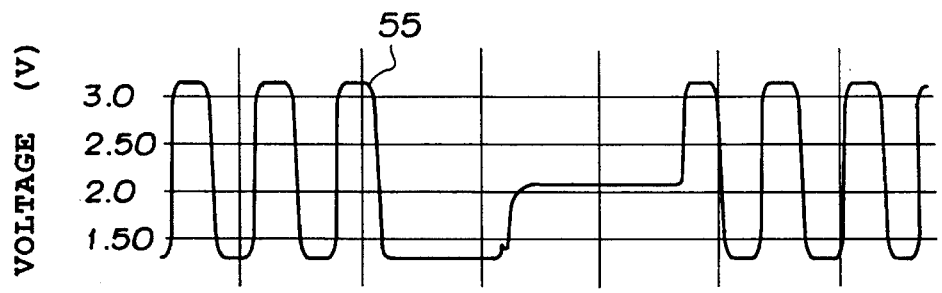
Figure 12C:
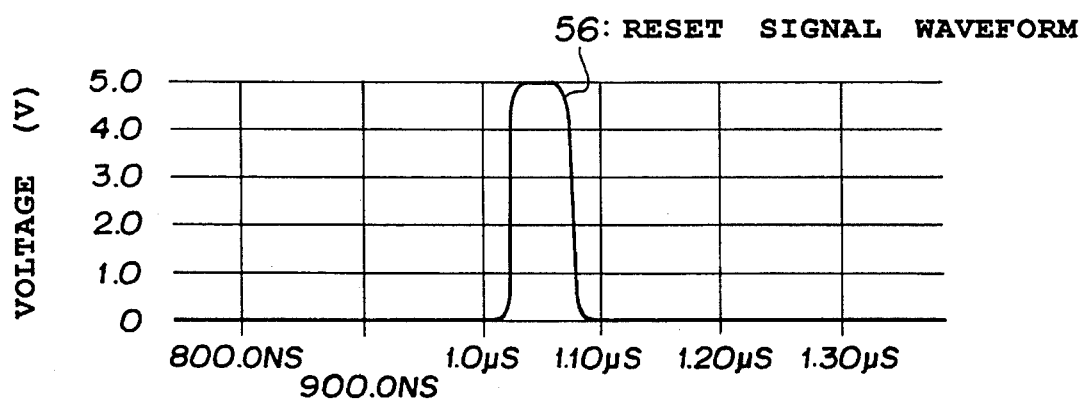

FIG. 12A—12C illustrate simulation results of the reset operation in the third embodiment as shown in FIG. 11. It was assumed in the simulation that the code rate of the input signal was 30 Mb/s, and that the amplifiers were a differential amplifier. In addition, the reset signal was assumed to have a pulse width of 60 ns.

FIGS. 12A–12C illustrate the input signal waveform 51 at the input terminal Ti, the output signal waveform 52 of the top-hold circuit 20a, the output signal waveform 53 of the bottom-hold circuit 30a, the output signal waveform (reference voltage) 54 of the ATC 10a, the output signal waveform 55 of the limiting amplifier 40, and the reset signal waveform 56 at the reset signal terminal 71t. The output signal waveform 54 of the ATC 10a is the signal waveform applied to the reference voltage input terminal d of the limiting amplifier 40, and the output signal waveform 55 of the limiting amplifier 40 is the output signal waveform of the basic circuit BC1.

FIG. 12A–12C show a case, in which after the input signal waveform 51 had terminated its large amplitude state, the reset signal 56 was applied, followed by the input signal waveform 51 of a small amplitude. The output signal 52 of the top-hold circuit 20a, the output signal 53 of the bottom-hold circuit 30a, and the output signal 54 of the ATC 10a had been once returned to the initial state, in which they had been set at substantially equipotential, and subsequently, followed the input signal of a small amplitude. The reset signal was supplied from the outside to the reset signal terminal 71t.

EMBODIMENT 4

Figure 13:
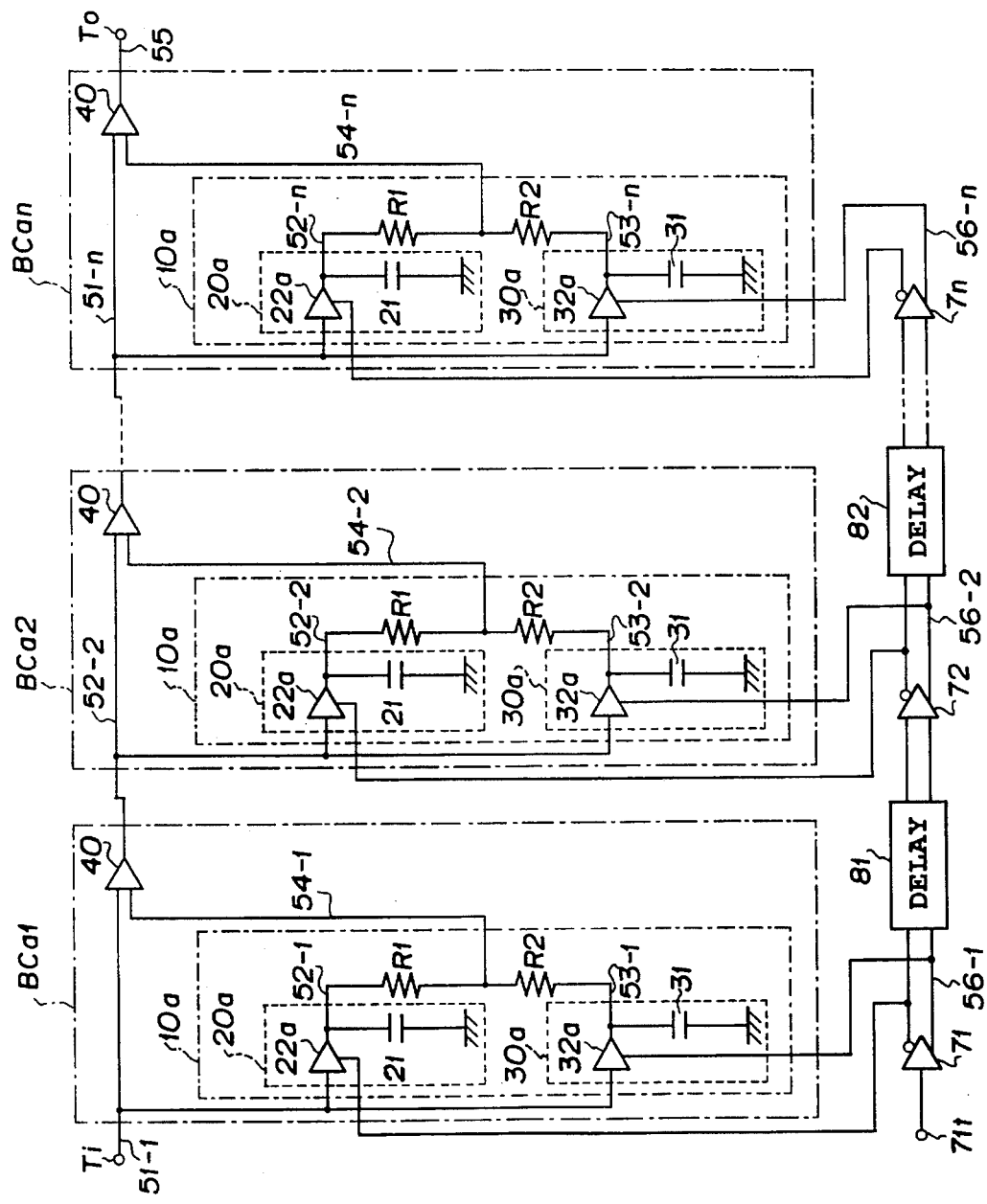
FIG. 13 is a circuit diagram showing a fourth embodiment in accordance with the present invention, in which basic circuits BCa1 as shown in FIG. 11 are multi-staged.
Figure 14A:
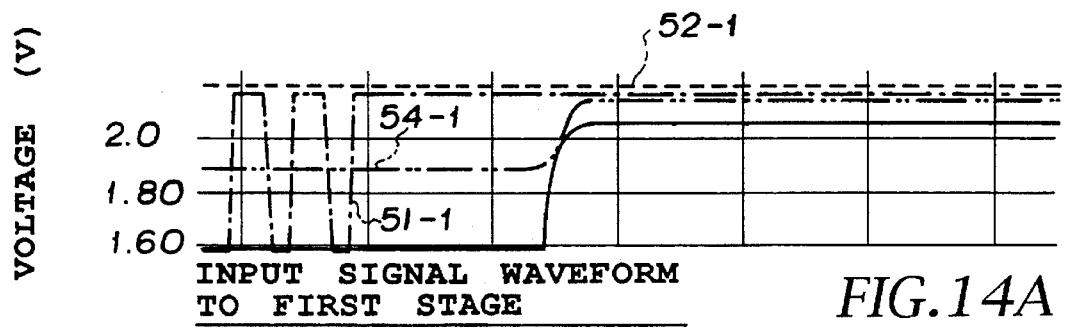
FIGS. 14A–14E are diagrams illustrating simulation results in the fourth embodiment as shown in FIG. 13, when the number of stages is three.
Figure 14B:
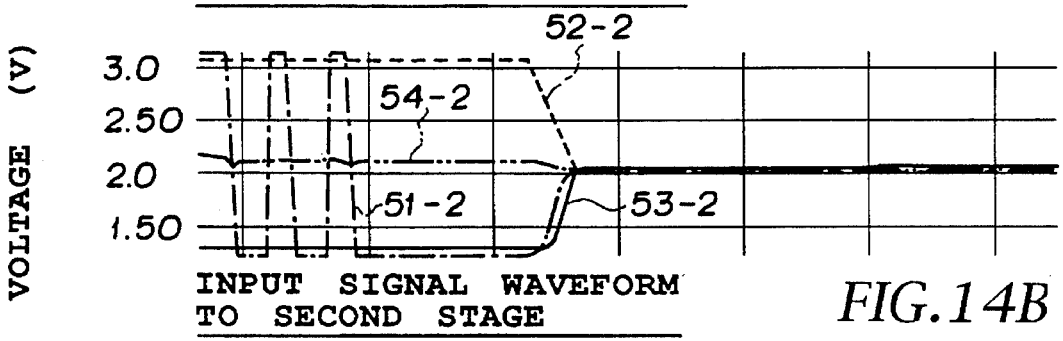
Figure 14C:
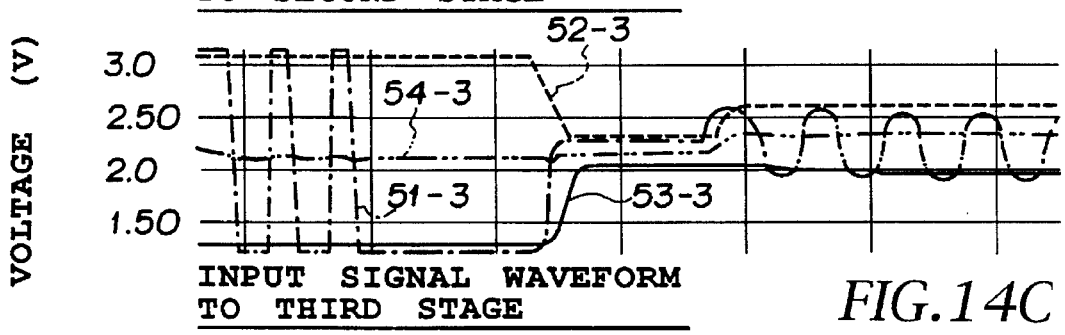
Figure 14D:
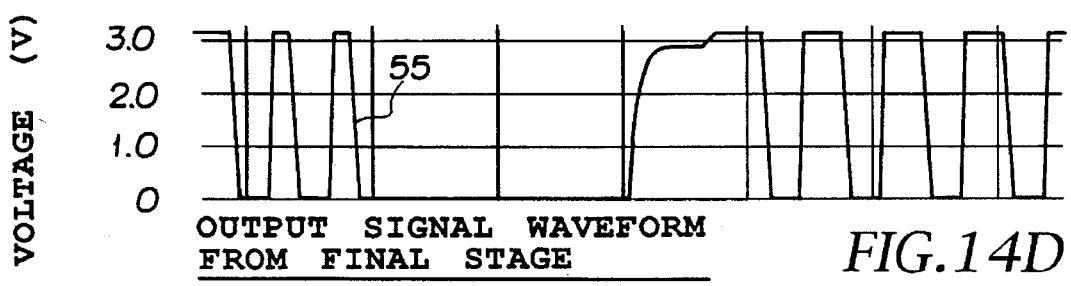
Figure 14E:
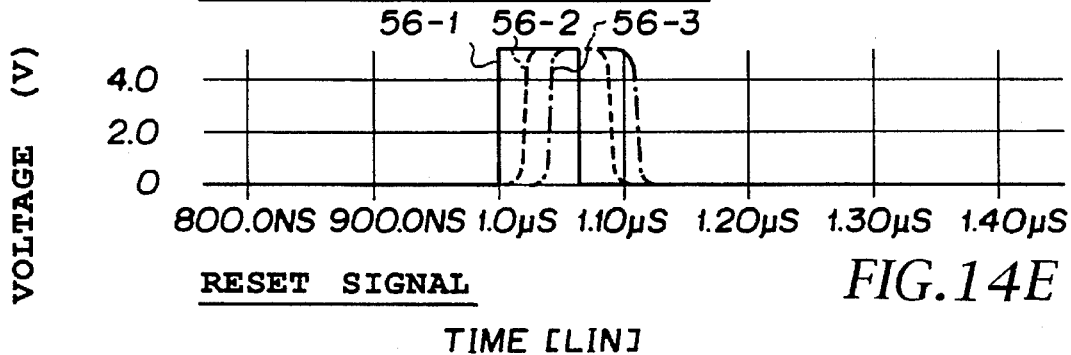

FIG. 13 is a circuit diagram showing a fourth embodiment in accordance with the present invention, in which a plurality of basic circuits BCa1 as shown in FIG. 11 are connected in cascade.

More specifically, the basic circuits BCa1, BCa2, ..., and BCan, which are identical to the basic circuit BCa1, are connected in cascade, and the individual ATCs 10a in the basic circuits BCa1, BCa2, ..., and BCan can be reset sequentially by an external reset signal so that the input signal and output signal of each ATC 10a are made equipotential by the reset signal. For this purpose, delay circuits 81, 82, ... are provided between the buffer amplifiers 71, 72, ... and 7n connected to the basic circuits BCa1, BCa2, ..., and BCan, respectively, and the reset signal terminal 71t of the first basic circuit BCa1 is made the reset signal terminal of the entire circuit.

The delay circuits 81, 82, ... provide the reset signals for the respective stages with a delay, and this will stabilize the reset operation. If all the stages are reset simultaneously, the outputs of all the stages will change at the same time. Thus, the second and the following stages will be influenced by the response characteristics of the output of the preceding stages, which may cause reset errors. To prevent this, the delay circuits 81, 82, ... are interposed between the buffer amplifiers 71, 72, ..., and 7n so that the respective stages are correctly reset to the initial state.

FIGS. 14A–14D illustrate results of a simulation carried out in the fourth embodiment as shown in FIG. 13, in which the number of stages was three. It was assumed in the simulation that the code rate of the input signal was 30 Mb/s, and that the amplifiers were a differential amplifier. In addition, the reset signal was assumed to have a pulse width of 60 ns.

FIGS. 14A–14E illustrate the input signal waveforms 51-1, 51-2 and 51-3 at the input terminals of the limiting amplifiers 40 of the respective stages, the output signal waveforms 52-1, 52-2 and 52-3 of the top-hold circuits 20a of the respective stages, the output signal waveforms 53-1, 53-2 and 53-3 of the bottom-hold circuits 30a of the respective stages, the output signal waveforms 54-1, 54-2 and 54-3 of the ATCs 10a of the respective stages, and the output signal waveform 55 of the final stage.

The simulation results were obtained when the input signal waveform 51-1 of a large amplitude of 0.65 V had been applied to the first stage, and subsequently, the input signal was made zero, followed by the application of the reset signal, and then, the input signal of a small amplitude of 0.0065 V was applied to the first stage.

It will be seen from these figures that the circuits of the respective stages were sequentially reset to the initial state by the delayed reset signal, so that the outputs of the top-hold circuit 20a, bottom-hold circuit 30a, and ATC 10a were made substantially equipotential, and that instantaneous responses were obtained when the small amplitude signal was inputted thereafter. Since this embodiment can tolerate the offset variations, it is very suitable for an integrated circuit.

Although the ATCs 10 and 10a of the above embodiments output the middle value between the top value and the bottom value, as the reference voltage, the reference voltage is not restricted to the middle value. A value about the middle value between the top value and the bottom value may be outputted as the reference voltage.

The above described embodiments 1–4 can be applied not only to the optical receiver circuit, but also to wireless communications systems or measurement systems, which require a high gain, wide dynamic range, low jitter limiting amplifier.

Figure 15:
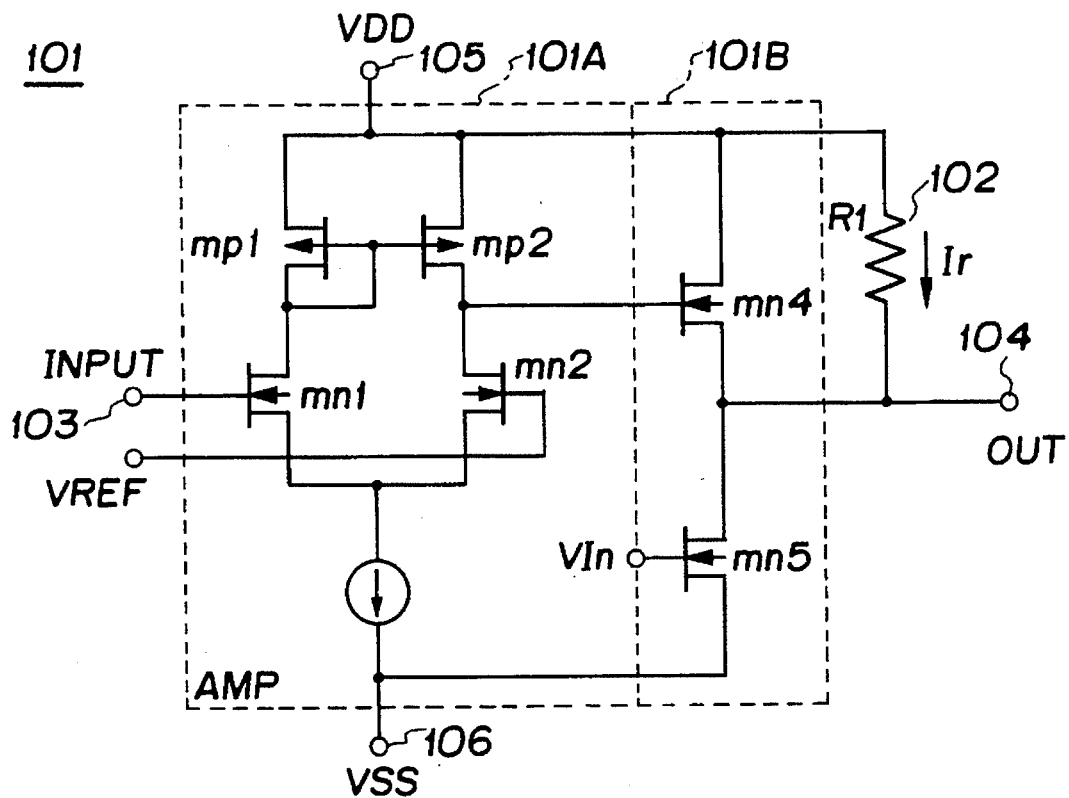
FIG. 15 is a circuit diagram showing a conventional limiting amplifier.

In the above described embodiments 1–4, the limiting amplifier 40 plays an important role. A conventional limiting amplifier as shown in FIG. 15 has been used as such a type of amplifier. This amplifier 101 includes a differential amplifier 101A and an output stage 101B. In addition, the amplifier 101 includes an output limiting resistor 102, an input terminal 103, an output terminal 104, a drain supply voltage terminal 105, and a source supply voltage terminal 106.

Figure 16A:
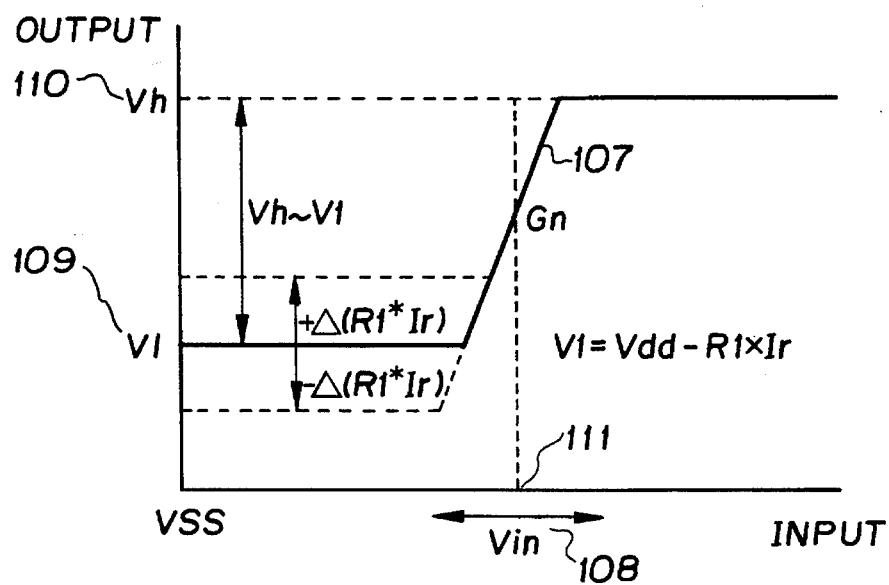
FIGS. 16A and 16B are graphs illustrating the input-output characteristics of the conventional limiting amplifier.
Figure 16B:
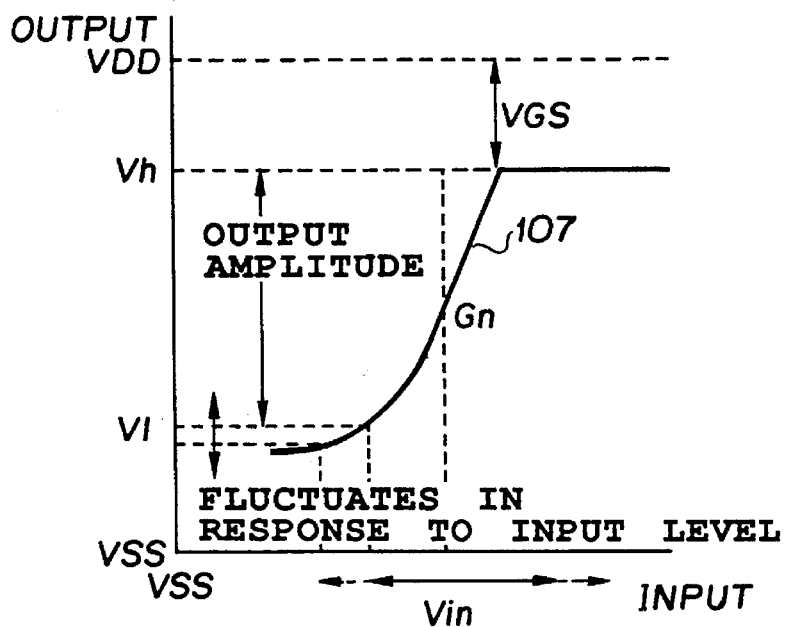

FIGS. 16A and 16B show typical relationships between the input signal voltage and output signal voltage of the limiting amplifier. In these figures, the reference numeral 107 designates the input-output characteristics of the conventional limiting amplifier 101, 108 designates the input signal, 109 designates the lower limit value V1 of the limited output of the limiting amplifier, 110 designates the upper limit value Vh of the limited output, and 111 designates the central value of the input signal.

The output amplitude of the conventional limiting amplifier 101 is limited as follows: First, the upper limit of the output is determined by Vh which is determined by a constant gate-source voltage VGS of a transistor mn4 when Ir=0, as will be described later. On the other hand, the lower limit of the output is given by V1=VDD−R1×It, which is determined by a saturation current It. The saturation current Ir in turn is determined by the resistor 102 (whose value is R1) and the DC characteristics of the transistors mn4 and mn5. Thus, the limiting amplifier 101 limits the output amplitude between V1–Vh as shown in FIG. 16A.

The values R1 and It, however, will be influenced by a fabrication process of the IC. The value R1 of the resistor 102 will be changed owing to deviations of sheet resistances and contact resistances from the design values, and the current Ir will be influenced by the variations in the threshold voltage of a current source transistor mn5 in the output stage 101B of the limiting amplifier 101, because Ir is determined by the DC characteristics of the transistor mn5.

The differential amplifier 101A itself will operate as a limiting amplifier because its load current is limited by a constant current source. Using FETs (Field Effect Transistors) in the constant current source of the differential amplifier employing FETs, however, presents a problem in that the lower limit of the output will fluctuate in response to the input signal level as shown in FIG. 16B. This is because the FET used in the constant current source has a large drain conductance, and this will cause the reduction of the drain-source voltage of the FET, which will hinder the FET from carrying out a constant current source function, and will cause fluctuations of the constant current.

Thus, the conventional limiting amplifier has a problem in that the limiting characteristics of the output will fluctuate owing to the characteristics (current-voltage characteristics) of the transistors, or the variations in the resistor. In addition, it is difficult to stably maintain the limiting level of the output against the changes in the input signal level. This arises a problem in that it is difficult to make a matching between the output of a limiting amplifier and the input range of the next stage, when the limiting amplifier is used in a multi-staged configuration or the output of the limiting amplifier undergoes a signal processing of the next stage. The following embodiments 5–7 can implement a limiting amplifier meeting the following requirements.

(1) The upper and lower limits of the limited output can be correctly set by only utilizing the current-voltage characteristics of the transistors of the output source-follower stage without using a resistor.

(2) The upper and lower limits of the limited output can be stably set at a desired value.

(3) The output should have a good waveform. This will be achieved by utilizing a complementary effect of a cascade connection of amplifiers composed of different conductivity type transistors.

EMBODIMENT 5

A fifth embodiment includes cascaded two amplifiers of different conductivity types, and limits the upper and lower limits of the output by the source-gate voltages of the FETs of the output stages of the respective amplifiers. The second stage amplifier must be a non-inverted amplifier in this embodiment.

Figure 17A:
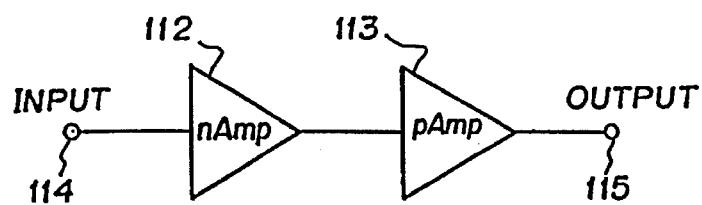
FIGS. 17A–17C are circuit diagrams showing a limiting amplifier of a fifth embodiment in accordance with the present invention.
Figure 17B:
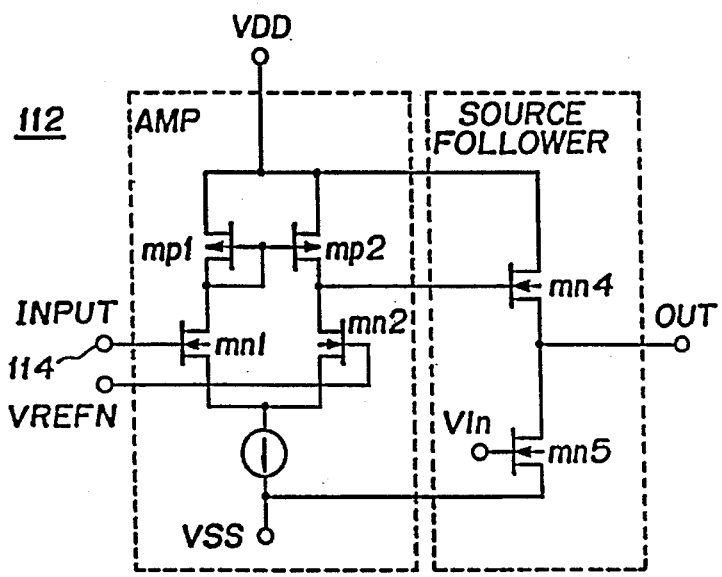
Figure 17C:
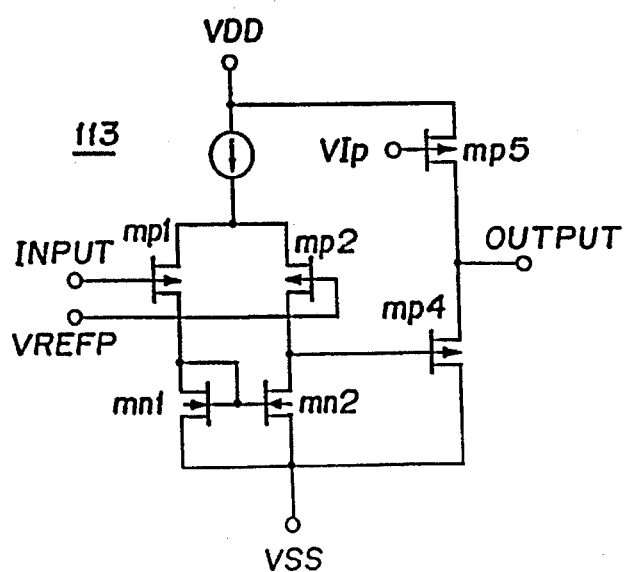

FIGS. 17A–17C show the limiting amplifier of the fifth embodiment in accordance with the present invention. FIG. 17A show the entire configuration of the limiting amplifier, FIG. 17B shows a circuit configuration of an n-channel drive CMOS amplifier 112, and FIG. 17C shows a circuit configuration of a p-channel drive CMOS amplifier 113. In these figures, the reference numeral 114 designates an input terminal, and 115 designates an output terminal.

This embodiment differs from the conventional limiting amplifier in that it implements the limiting characteristics of the CMOS limiting amplifier by using the transistor characteristics without using a resistor. In other words, both the upper and lower limits of the output are determined by the transistor characteristics. More specifically, the cascade connection of the n-channel drive CMOS amplifier 112 and the p-channel drive CMOS amplifier 113 makes it possible to determine the upper and lower limits of the output of the limiting amplifier by the gate-source voltage Vgs of the transistors.

The operation of setting the upper and lower limits of the output of the limiting amplifier will be described below.

Figure 18A:
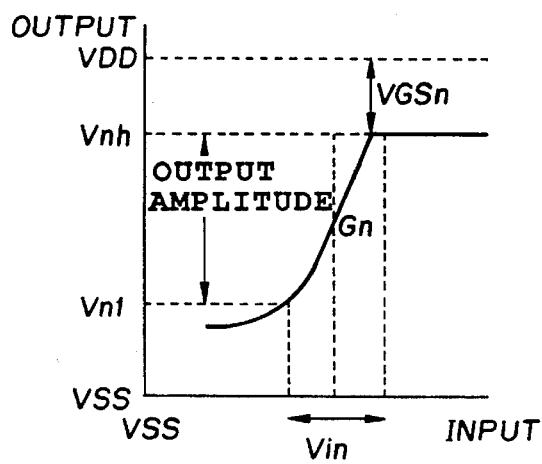
FIGS. 18A–18E are diagrams illustrating the limiting operation of the first stage amplifier 112 of the fifth embodiment.

FIGS. 18A–18E illustrate the operation of setting the upper and lower limits of the n-channel amplifier 112. As shown in FIG. 18A, the upper limit voltage Vnh of the n-channel amplifier 112 will be determined by the following equation.

$$Vnh = VDD - VGSn$$

where VDD is the drain supply voltage, and VGSn is the gate-source voltage of the transistor mn4 of the output stage.

Figure 18B:
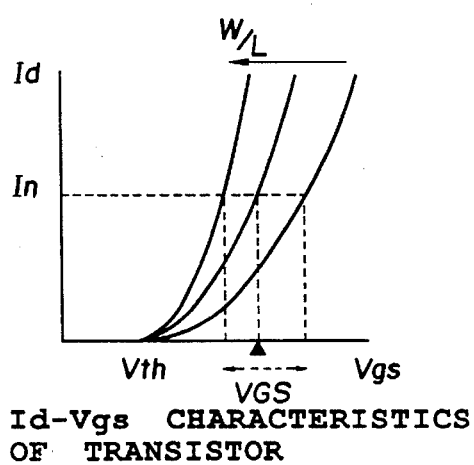

This relationship will be described. First, relationships between the gate-source voltage Vgs and the drain current Id of a transistor are generally as shown in FIG. 18B. The drain current Id is proportional to the square of the difference between the gate-source voltage Vgs and the threshold voltage Vth, and its constant of proportionality is determined by the ratio W/L (referred to as a transistor size below), where W and L are the channel width and the channel length of the transistor, respectively. Accordingly, maintaining the gate-source voltage Vgs at a constant value VGS will make the drain current ID constant. Conversely, maintaining the drain current ID at a constant value will make Vgs a constant value VGS.

Figure 18C:
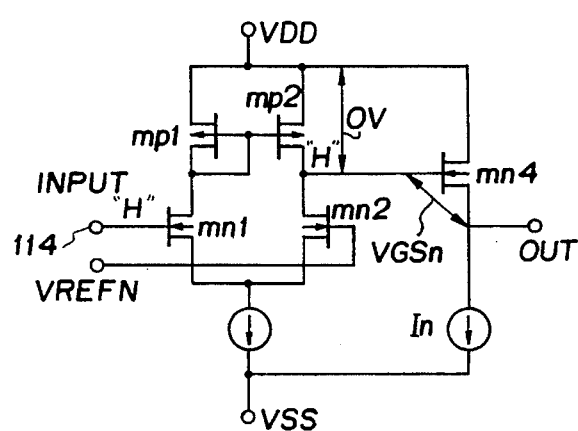

The gate voltage of the transistor mn5 of the n-channel amplifier 112 is kept constant, and hence, it functions as a constant current source that supplies the transistor ran4 of the output stage with a constant current In. Accordingly, the gate-source voltage Vgs of the transistor mn4 of the output stage is maintained at a constant value VGS which is determined by the Id-Vgs characteristics of the transistor and the constant current In. Since the output voltage of the n-channel amplifier 112 equals the gate voltage of the transistor mn4 minus VGS, it takes a maximum value when the gate voltage is maximum. Since the gate voltage becomes maximum when it is equal to the drain voltage as shown in FIG. 18C, the upper limit voltage of the n-channel amplifier 112 is determined by the above-mentioned equation. Thus, the upper limit of the output voltage of the n-channel amplifier 112 is determined by VDD and VGS. The value VGS can be controlled by changing the transistor size of the transistor mn4, changing the constant current In by varying the transistor size of the transistor mn5.

On the other hand, the lower limit voltage Vnl of the n-channel amplifier 112 will be changed in response to the input signal level as shown in FIG. 16B.

Figure 1:
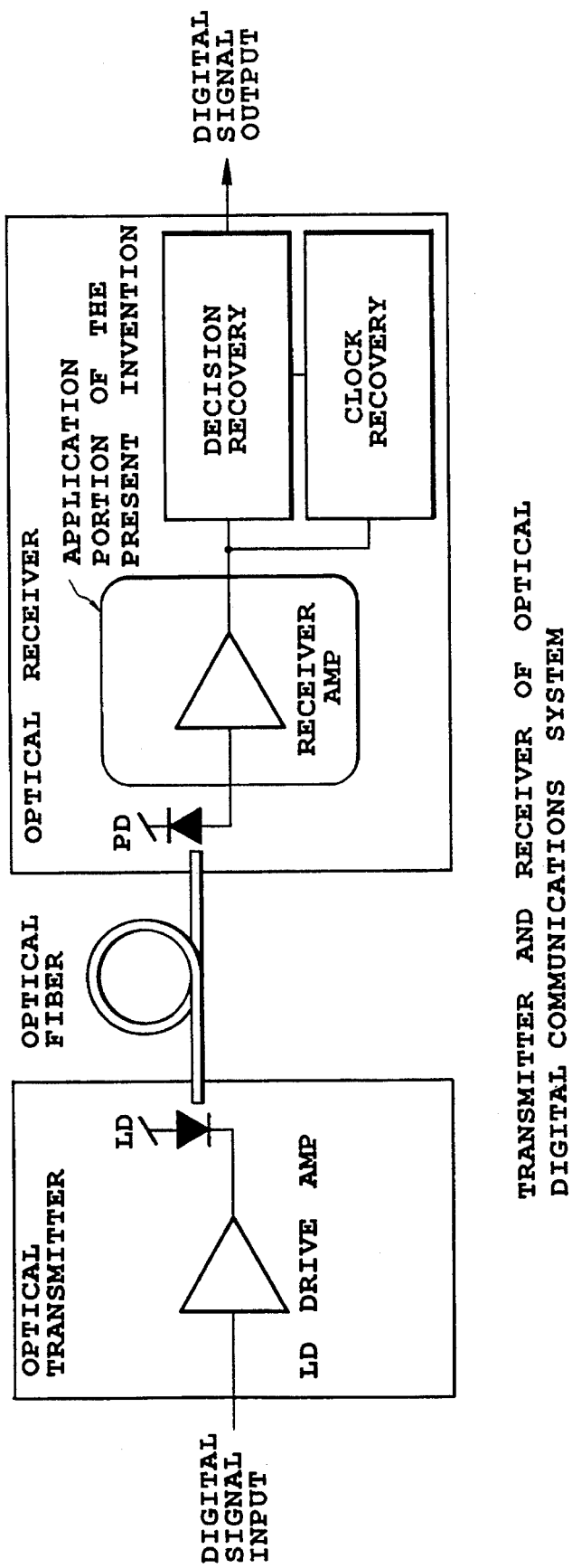
FIG. 1 is a schematic block diagram showing an optical digital communications system.
Figure 18D:
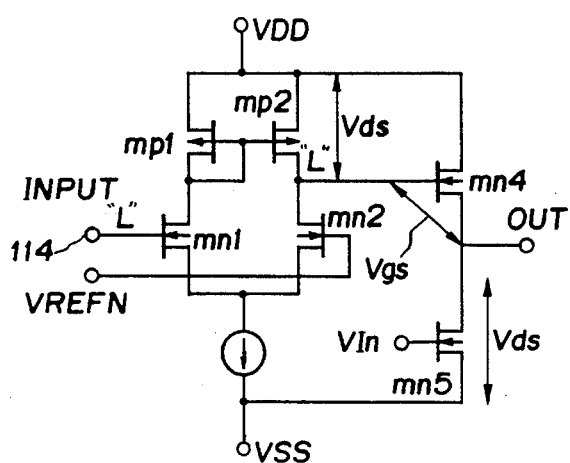
Figure 18E:
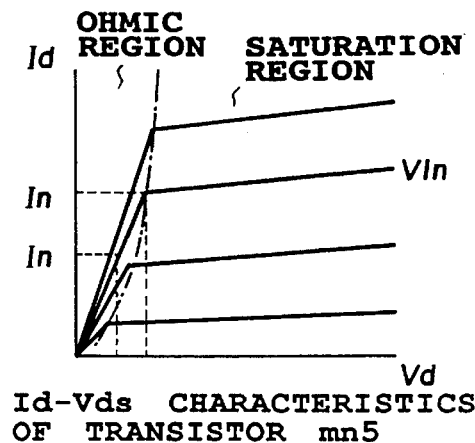

This will be explained in more detail. As shown in FIG. 18D, if the input voltage to the n-channel amplifier 112 drops, the drain voltage of the transistor mn2 will also drop. Thus, if the gate-source voltage Vgs of the source follower transistor mn4 of the output stage approaches the threshold value Vth, the drain current of the transistor mn4 approaches zero. In this case, the operation of the transistor mn5 of the output stage, which has been functioning as a constant current source, moves into the linear ohmic region as shown in FIG. 1BE, so that the drain-source voltage Vds of the transistor mn5 changes in response to the input signal level. As a result, the lower level voltage of the n-channel amplifier 112 will change in response to the input signal level.

Figure 19A:
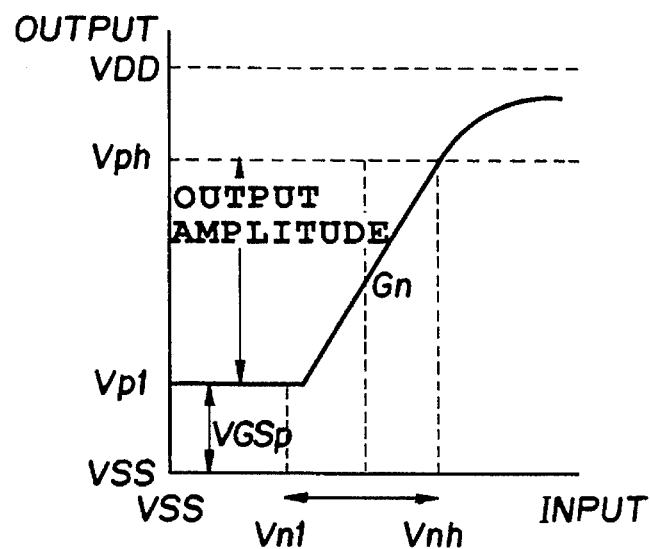
FIGS. 19A and 19B are diagrams illustrating the limiting operation of the second stage amplifier 113 of the fifth embodiment.
Figure 19B:
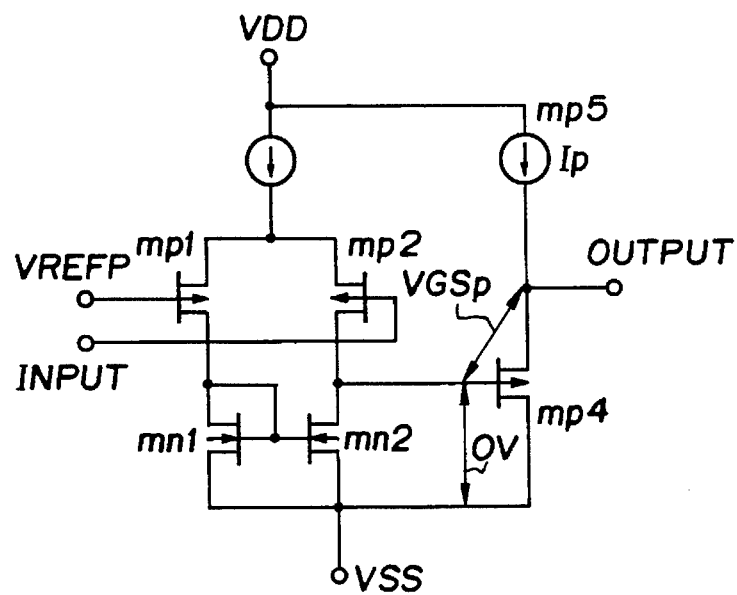

Next, the operation for setting the upper and lower limit values of the p-channel amplifier 113 will be explained with reference to FIGS. 19A and 19B. First, the lower limit value Vp1 is given by the following equation as shown in FIG. 19A.

$$Vp1=VSS+VGSp$$

where VGSp is the gate-source voltage of the source follower transistor top4 of the output stage, as shown in FIG. 19B. This relationship will be described referring to FIG. 19B. As in the n-channel amplifier 112, the transistor mp5 functions as a constant current source generating a constant current Ip. Therefore, the gate-source voltage Vgs of the transistor mp4 of the output stage is maintained at a constant value VGSp. Thus, the output of the p-channel amplifier 113 takes a lower limit value when the gate voltage equals VSS, and that lower limit value is given the above-mentioned equation. The value VGSp can be controlled by changing the transistor size of the transistor mp4, or by changing the constant current Ip by varying the transistor size of the transistor mp5. Thus, the lower limit value of the p-channel amplifier 113 is determined by the transistor characteristics and VSS.

On the other hand, the upper limit value Vph of the p-channel amplifier 113 will fluctuate in response to the input signal level as the low limit value of the n-channel amplifier 112. The upper limit of the input signal to the p-channel amplifier 113, however, has been limited at Vnh. Therefore, the upper limit of the output of the p-channel amplifier 113 is limited to Vph that corresponds to Vnh. As a result, the output of the p-channel amplifier 113 takes the lower limit VP1 and the upper limit Vph as shown in FIG. 19A.

Thus, the upper and lower limits of the limited output can be determined by the gate-source voltages VGS of the source follower transistors of the n-channel and p-channel amplifiers 112 and 113 in this embodiment. Since this embodiment does not use a resistor, it is not influenced by variations in the resistor, thereby stably maintaining the upper and lower limits of the limited output. In addition, combining the two amplifiers of the different conductivity types makes it possible to obtain a high-quality output waveform of good symmetry due to the complementary effect. Furthermore, the amplitude and the upper and lower limit values of the limited output can be determined at a desired value as a design parameter.

The conductivity type of the amplifier 112 and that of the amplifier 113 can be exchanged without losing the effects describe above. In addition, the gain of each amplifier can be set at a desired value without any adverse effect on the limiting operation. Moreover, it is not required that the first amplifier 112 be a non-inverting amplifier. In other words, the differential amplifier of the n-channel amplifier 112 can be used by exchanging the signal input terminal and the reference voltage terminal.

EMBODIMENT 6

Figure 20A:
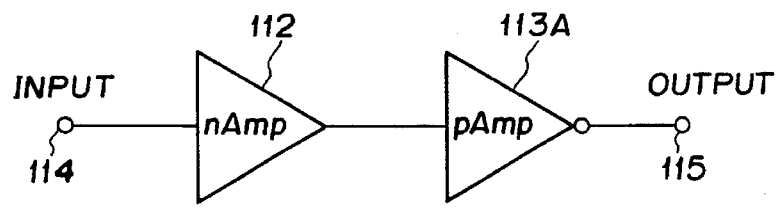
FIGS. 20A–20C are circuit diagrams showing a limiting amplifier of a sixth embodiment in accordance with the present invention.
Figure 20B:
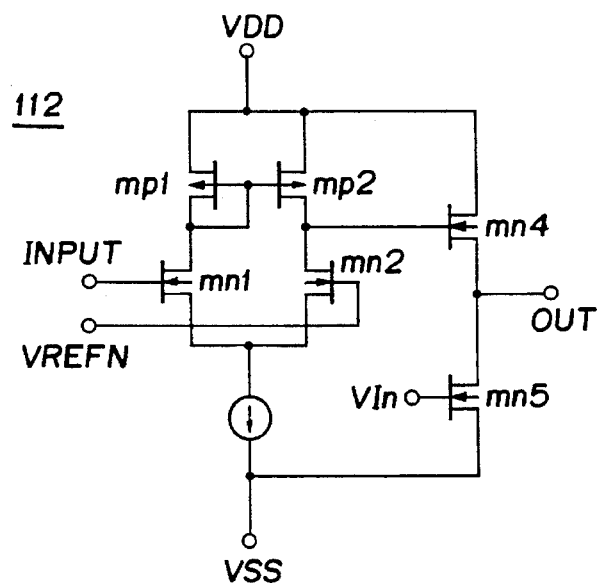
Figure 20C:
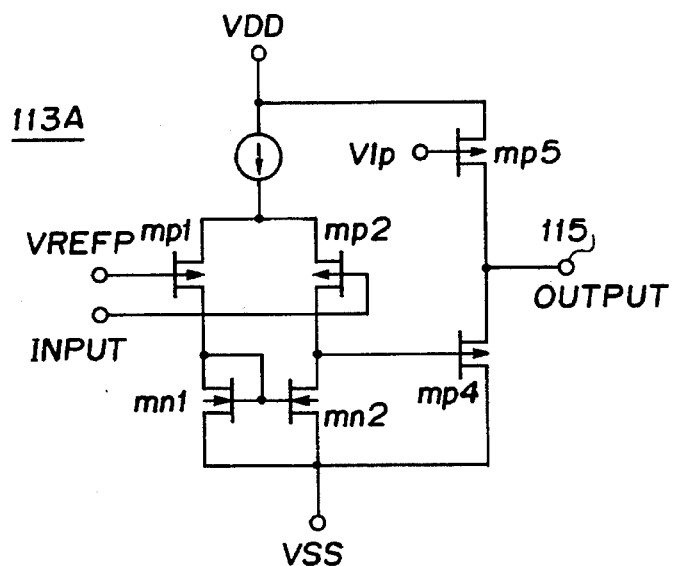

FIGS. 20A–20C show a sixth embodiment, which differs from the fifth embodiment in the following points:

(1) An inverting amplifier is employed as a second stage p-channel amplifier 113A. More specifically, the signal input terminal and the reference voltage terminal of FIG. 20C are exchanged for those of FIG. 17C.

Figure 21A:
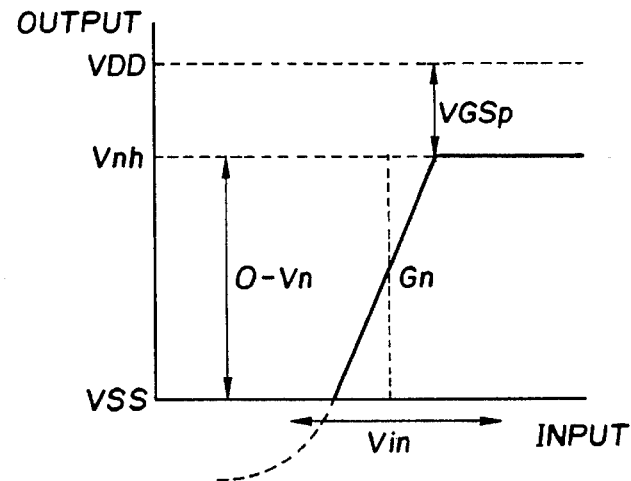
FIGS. 21A–21C are graphs illustrating the limiting operation of the limiting amplifier of the sixth embodiment.

(2) The gain of the differential amplifier of the first stage n-channel amplifier 112 is increased, and the gate-source voltage Vgs of the source follower transistor mn4 is increased in comparison with those of the n-channel amplifier 112 of FIG. 17B. This will make the source supply voltage VSS the lower limit value of the n-channel amplifier 112 as shown in FIG. 21A. More specifically, the gate voltage of the source follower transistor mn4 will drop below the threshold voltage Vth when the input signal level drops below a certain level, and this will make the drain current zero. As a result, the drain current of the constant current source transistor mn5 becomes zero, and its drain-source voltage also falls to zero. Thus, the output of the n-channel amplifier 112 is limited to the source supply voltage VSS.

Figure 21B:
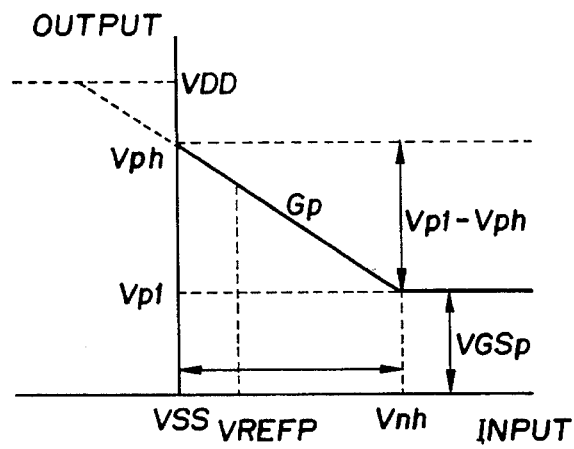

(3) The gain of the second stage p-channel amplifier 113A is decreased in comparison with that of the p-channel amplifier 113 in FIG. 17C. In addition, the reference voltage Vrefp of the p-channel amplifier 113A is biased from the center of the input range toward the source supply voltage VSS. Thus, the input-output characteristics of the p-channel amplifier 113A is as shown in FIG. 21B, in which the upper limit voltage Vph of the p-channel amplifier 113A, which corresponds to the lower limit input VSS from the first stage n-channel amplifier 112, is set such that it does not reach the drain voltage VDD.

Figure 21C:
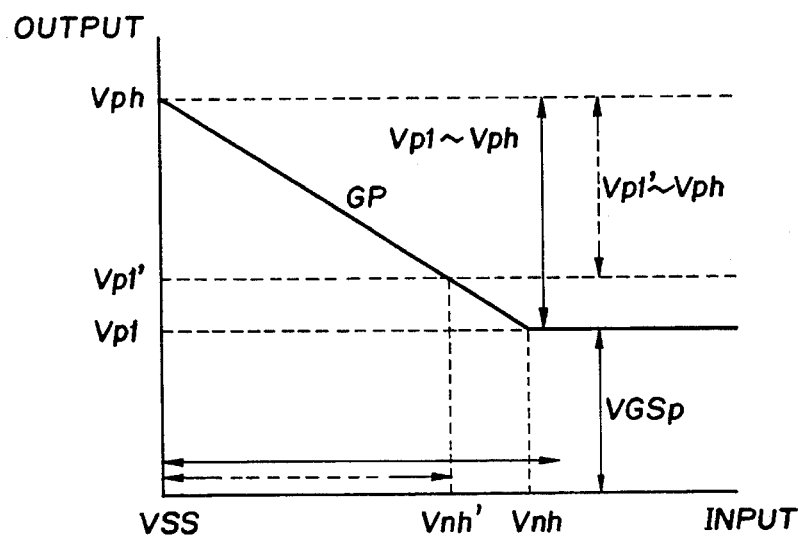

The lower limit of the limited output of the p-channel amplifier 113A is determined either by the gate-source voltage VGSp of the source follower transistor mp4, or by the upper limit voltage Vnh' of the output of the first stage n-channel amplifier 112 as shown in FIG. 21C. In the latter case, the lower limit can be determined by the gate-source voltage VGSn of the source follower transistor mn4.

Thus, the limiting operation can be achieved without using a resistor, even if the second stage p-channel amplifier is an inverting amplifier. Therefore, the upper and lower limits of the limited output can be stabilized independently of variations in resistors.

Figure 22A:
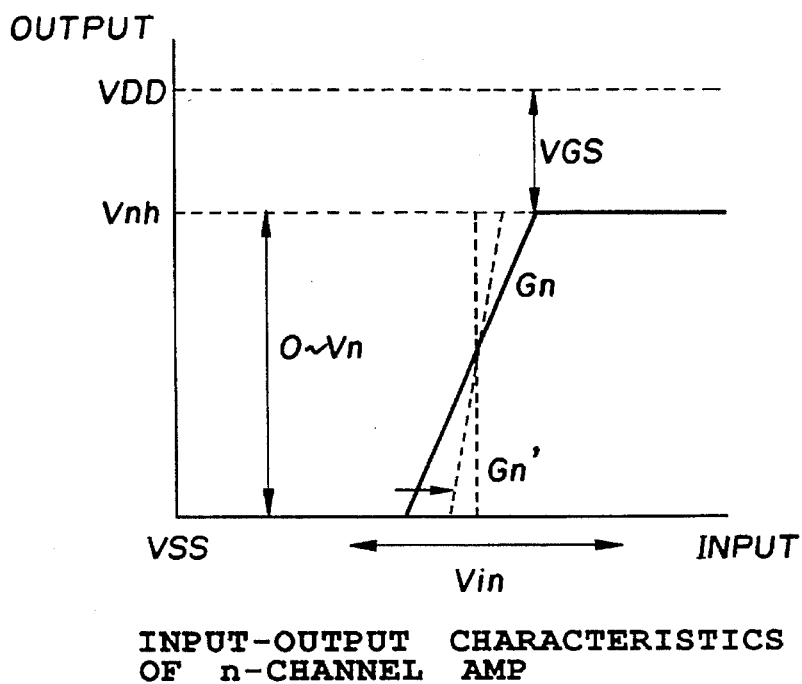
FIGS. 22A and 22B are graphs illustrating gain sharing between the two amplifiers of the limiting amplifier of the sixth embodiment.
Figure 22B:
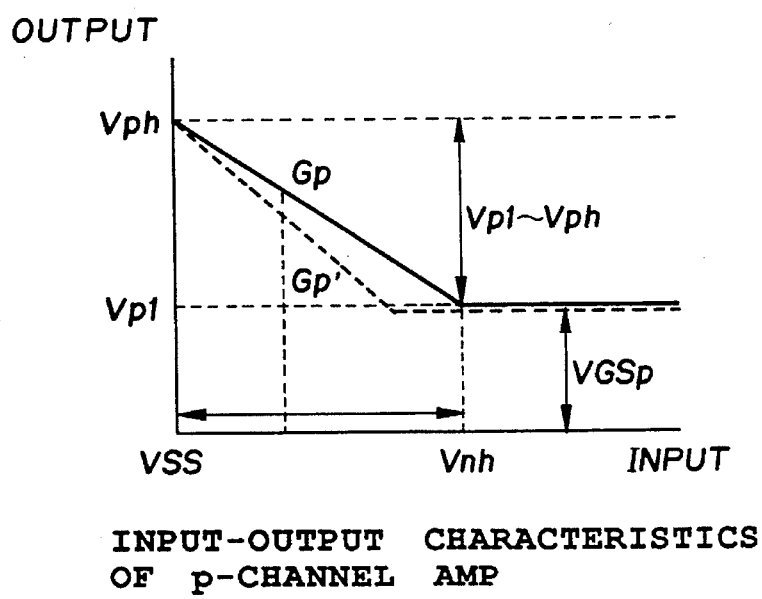

A rather arbitrary gain sharing can be implemented between the n-channel amplifier 112 and the p-channel amplifier 113A. FIGS. 22A and 22B illustrate the states when the gain of the n-channel amplifier 112 and that of the p-channel amplifier 113A are changed. Since the upper and lower limits of respective amplifiers are determined independently of the gains, a desired gain sharing can be determined in a certain range.

EMBODIMENT 7

Figure 23A:
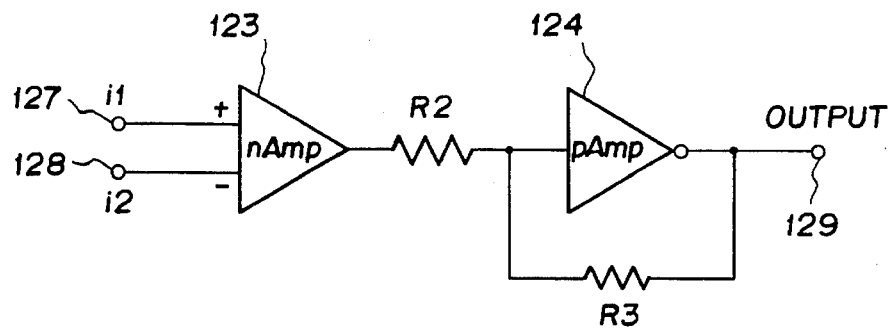
FIGS. 23A–23C are circuit diagrams showing a limiting amplifier of a seventh embodiment in accordance with the present invention.
Figure 23B:
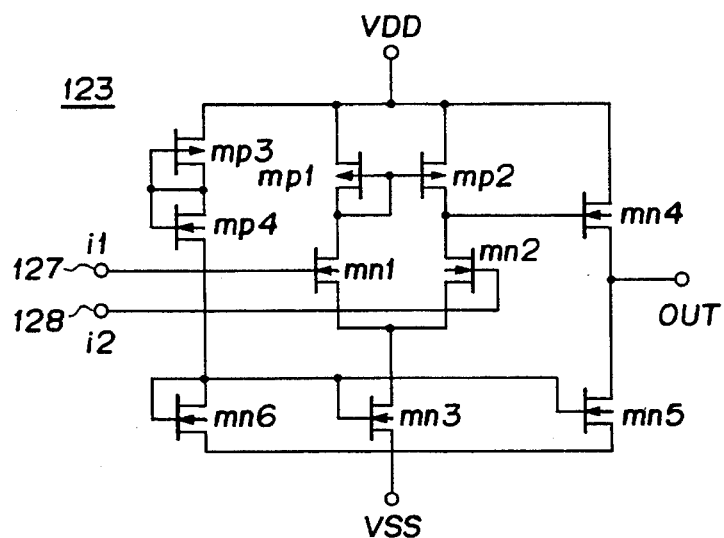
Figure 23C:
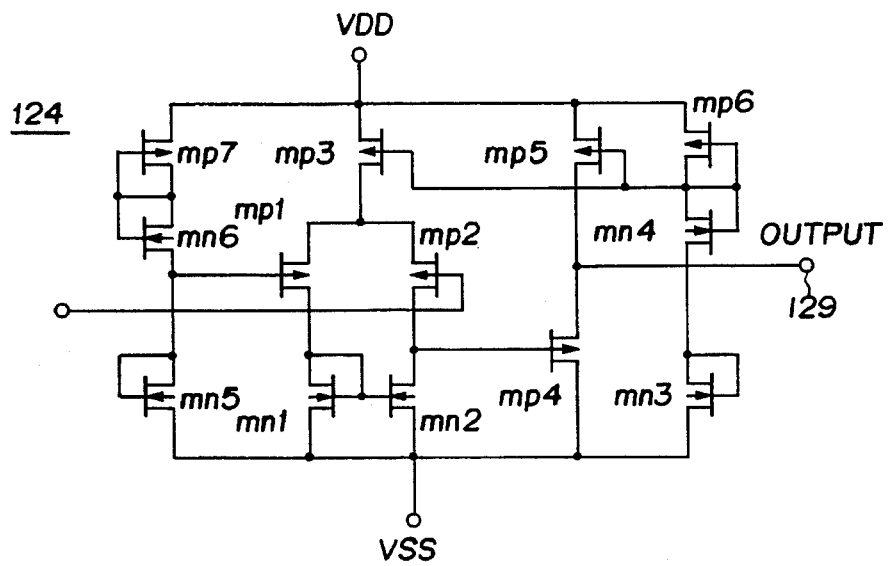

FIGS. 23A–23C show a seventh embodiment in accordance with the present invention.

The limiting amplifier of this embodiment also includes an n-channel amplifier 123 and a p-channel amplifier 124 as its basic part as in the above described sixth embodiment. The p-channel amplifier 124 is an inverting amplifier, which constitutes a voltage follower circuit together with resistors R2 and R3. The reference voltage of the p-channel amplifier 124 is generated by an internal voltage source including three transistors mn5, mn6 and mp7.

Figure 24A:
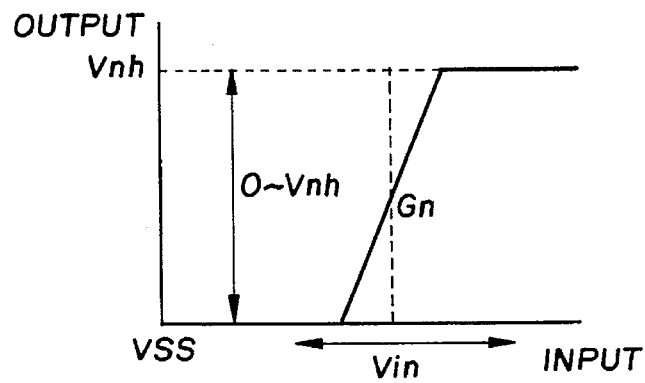
FIGS. 24A–24D are graphs illustrating input-output characteristics of the limiting amplifier of the seventh embodiment.
Figure 24B:
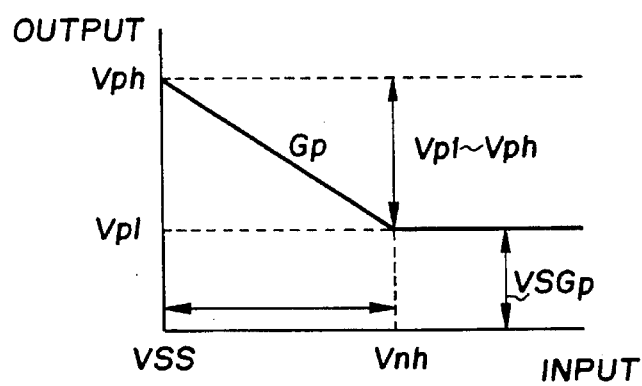
Figure 24C:
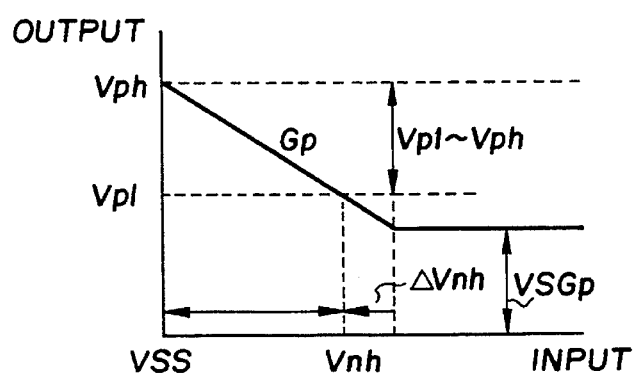
Figure 24D:
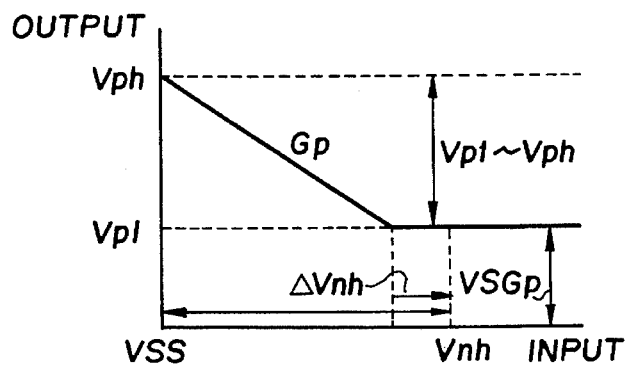

FIG. 24A–24D are graphs for explaining the upper and lower limits of the limiting amplifier. FIGS. 24A and 24B illustrate the upper and lower limits of the n-channel amplifier 123 and the p-channel amplifier 124, respectively, as FIGS. 21A and 21B. The lower limit voltage of the limited output is determined either by the upper limit voltage Vnh of the n-channel amplifier 123 as shown in FIG. 24C, or by the lower limit voltage Vpl of the p-channel amplifier 124 as shown in FIG. 24D. In other words, the lower limit of the limited output is determined either by the gate-source voltage VGSn of the source follower transistor mn4 of the n-channel amplifier 123, or by the gate-source voltage VGSp of the source follower transistor mp4 of the p-channel amplifier 124. On the other hand, the upper limit of the limited output is determined in the same way as in the sixth embodiment.

Since the present embodiment employs a voltage follower consisting of the p-channel amplifier 124 and the resistors R2 and R3, as the second stage amplifier, the following advantages can be gained.

(1) This makes possible a wide frequency range operation, and a large capacitive load drive.

(2) A desired gain can be achieved by selecting the resistance ratio of the resistors R2 and R3. Since a high accuracy resistance ratio can be established between resistors in a monolithic circuit, a stable gain can be obtained.

EMBODIMENT 8

Figure 25C:
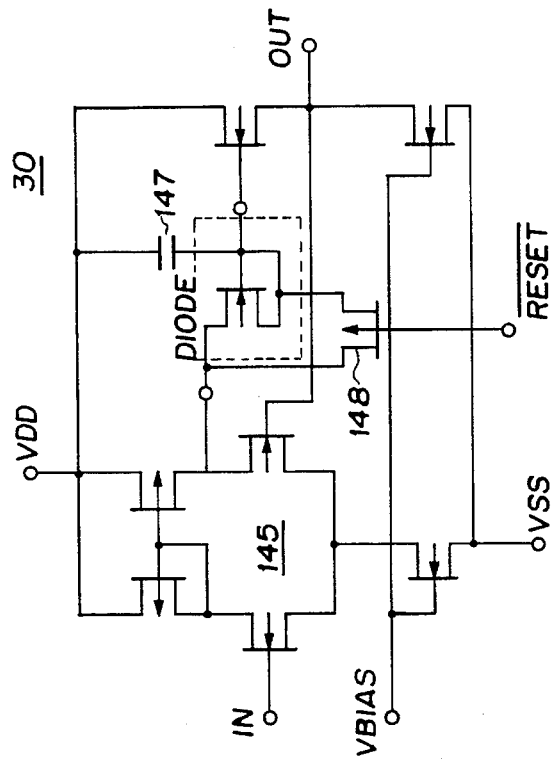
FIGS. 25C and 25D are a circuit diagram and an equivalent circuit diagram of its part, showing a bottom-hold circuit of the eighth embodiment in accordance with the present invention.
Figure 25D:
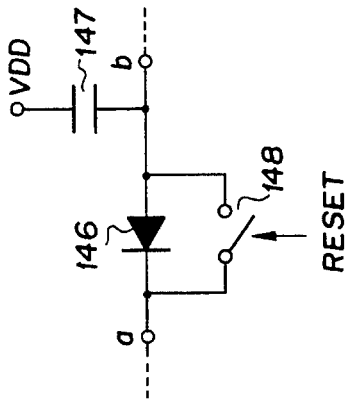
Figure 25A:
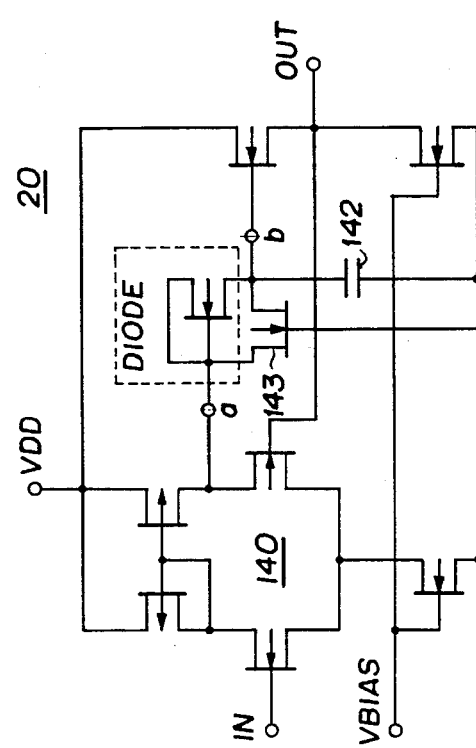
FIGS. 25A and 25B are a circuit diagram and an equivalent circuit diagram of its part, showing a top-hold circuit of an eighth embodiment in accordance with the present invention.

FIGS. 25A and 25D show an example of the top-hold circuit 20 and an example of the bottom-hold circuit 30 used in the embodiments 1–4.

Figure 25B:
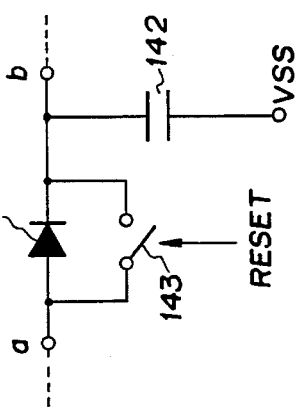

FIG. 25B shows a major part of the top-hold circuit 20. The top value of a differential amplifier 140 is held by a capacitor 142 through a diode 141. The electric charge in the capacitor 142 is discharged by turning on a reset switch 143.

FIG. 25D shows a major part of the bottom-hold circuit 30. The bottom value of a differential amplifier 145 is held by a capacitor 147 through a diode 146. The electric charge in the capacitor 147 is discharged by turning on a reset switch 148.

In the above described embodiments 1–4, the middle value between the output of the top-hold circuit 20 (or 20a) that holds a maximum value of the input burst signal, and the output value of the bottom-hold circuit 30 (or 30a) that holds a minimum value thereof, is set as the reference voltage of the amplifier 40. Thus, the offset compensation is carried out so that burst signals of different levels are received instantaneously and amplified stably.

Figure 26A:
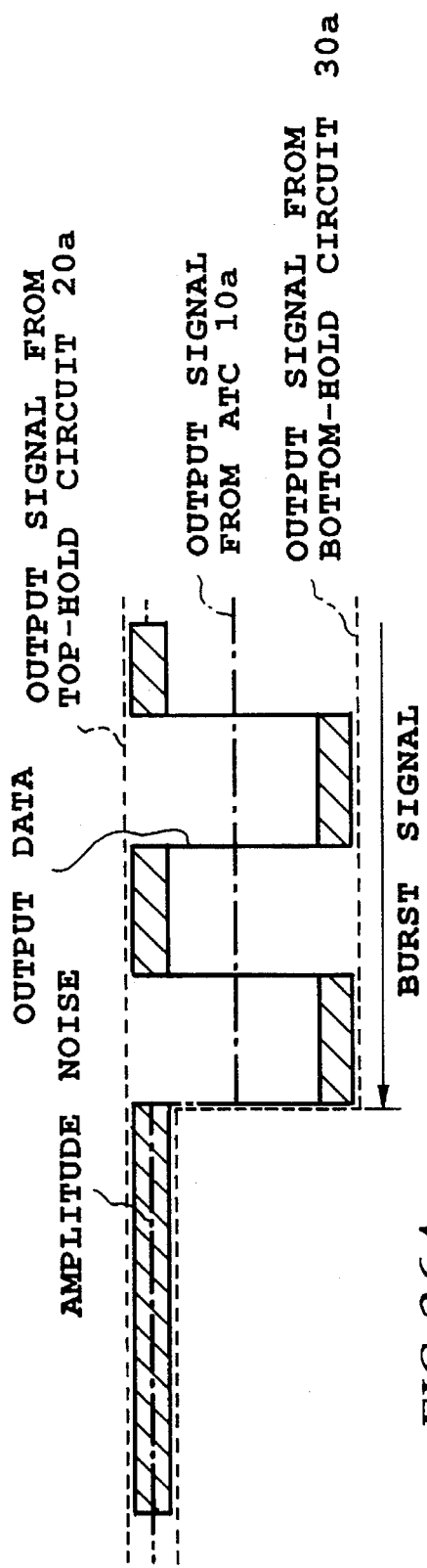
FIGS. 26A and 26B are waveform diagrams illustrating noise generating mechanism in the third embodiment as shown in FIG. 11.

FIG. 26A illustrates received data inputted to the amplifier BCa1 of the third embodiment as shown in FIG. 11, amplitude noise superimposed on the received data, the output signal from the top-hold circuit 20a, the output signal from the bottom-hold circuit 30a, and the output signal from the ATC 10a. The ordinate of this figure represents voltage, and the abscissa represents time.

Figure 26B:
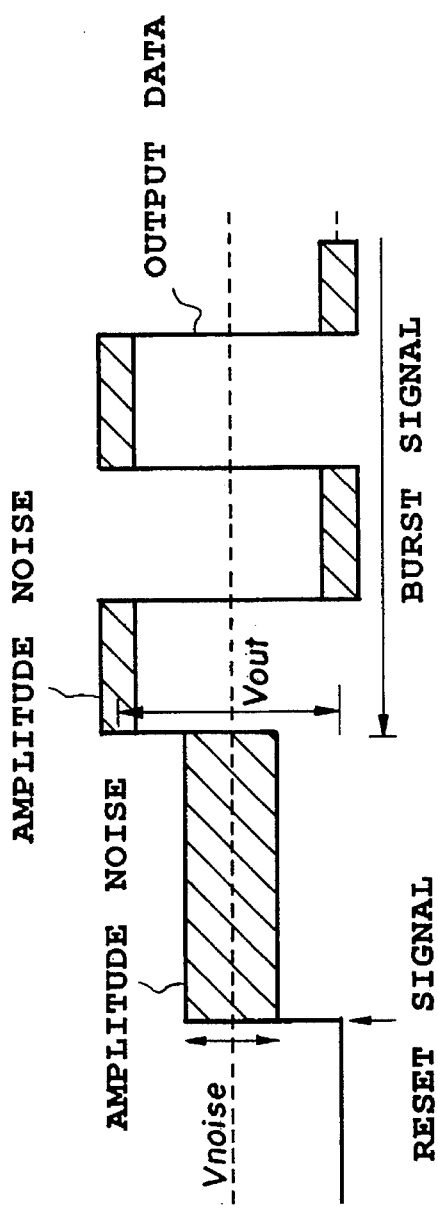

FIG. 26B illustrates the output data of the final stage amplifier BCan, and amplified noise in a multi-staged configuration of the amplifiers BCa1–BCan. The ordinate of this figure represents voltage, and the abscissa represents time.

The third embodiment as shown in FIG. 11 has a reset function which makes the input and output voltages of the top-hold circuit 20a equal, and those of the bottom-hold circuit 30a equal, by a reset signal inputted to the ATC 10a. Thus, applying the reset signal to the ATC 10a makes the input signal and the output signal of the ATC 10a equipotential. As a result, even if the input data changes from a large amplitude to a small amplitude, the offset compensation is carried out instantaneously. In this case, noise Vnoise occurs about the output signal of the ATC 10a, and the noise is also superimposed on a burst signal as shown in FIG. 26B. This is because when the circuits are reset, the reference voltage of the limiting amplifier 40 is set approximately at the center of the linear operating region, and this increases the gain of the limiting amplifier 40 for the noise. In FIG. 26B, $V_{out}$ represents the voltage amplitude of the output signal.

Figure 27A:
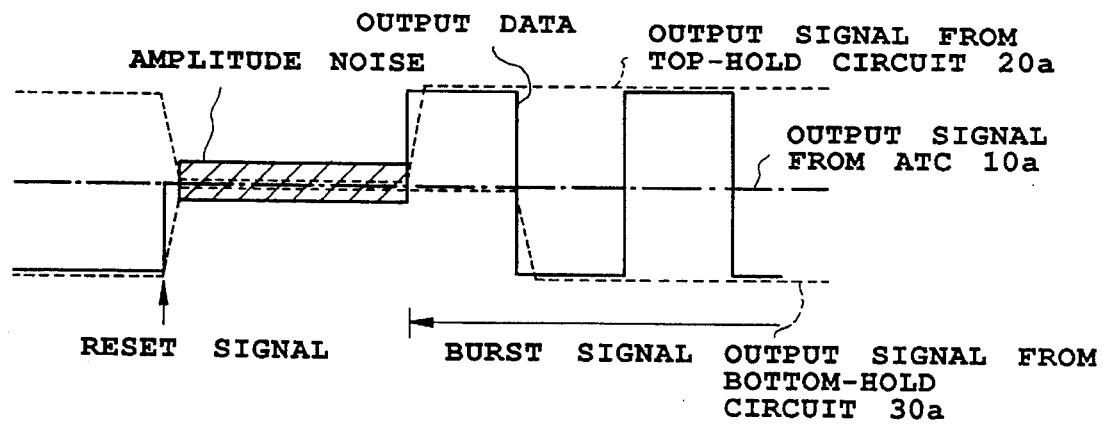
FIGS. 27A and 27B are a waveform diagram and a graph illustrating noise and its voltage in the fourth embodiment as shown in FIG. 13.

FIG. 27A illustrates, in the case where the amplifiers BCa1 are multi-staged, the output data from the final stage amplifier, and the output signal of the ATC 10a of the final stage amplifier, in addition to the output signals from the top-hold circuit 20a and the bottom-hold circuit 30a of the final stage amplifier. In this figure, the ordinate represents voltage and abscissa represents time.

When the multi-staged circuit of the amplifiers BCa1 receives a burst signal, the noise superimposed on the burst signal will be limited by the limiting amplifier 40. This situation, however, will be changed by the reset signal. More specifically, the reset signal will set the reference voltage of each amplifier at an optimum value that makes its gain maximum. In other words, the reset signal sets the reference voltage at the center of the linear operating region of the limiting amplifier 40, thereby establishing the maximum gain. This presents a problem in that the adverse effect of the noise will be increased during a signal-less period from the occurrence of the reset signal to the input of a burst signal.

Figure 27B:
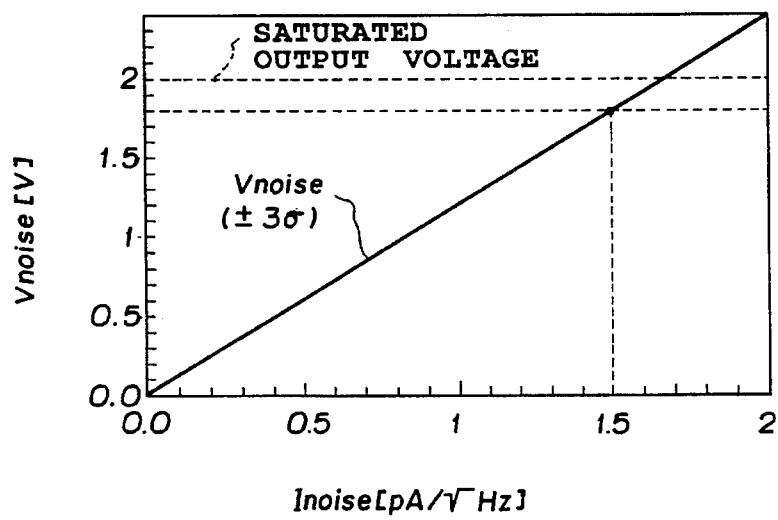

FIG. 27B illustrates the relationships between the equivalent noise current density referred to input, and the output noise voltage, under the conditions that the output of the preamplifier (see, FIG. 2) is inputted to the amplifier BCa1 of the third embodiment as shown in FIG. 11, and that the dominant factor of the noise superimposed is white noise of the preamplifier.

The output noise voltage Vnoise of the preamplifier is given by the following equation.

$$V_{noise}=A_v\times\{F_w\times(Z_{in}\times I_{noise})^2\}^{1/2}$$

where Av is the voltage gain of the preamplifier, Fw is a noise bandwidth, Zin is the input impedance of the preamplifier, $I_{noise}$ is the equivalent noise current density of the preamplifier referred to its input. The output noise voltage $V_{noise}$ takes a rather large value of 1.8 V when $I_{noise}$=1.5 pA/√Hz. In particular, since the amplifier BCa1 has a limiting function, the output voltage is saturated. This will further increase the ratio of the noise voltage $V_{noise}$ to the output voltage $V_{out}$, thereby increasing the effect of the noise.

Thus, the amplifier presents a problem in that the noise, which occurs during the signal-less period from the reset signal occurrence to the burst signal input, is liable to be recognized as the start of the burst signal of the input data, and this may lead to bit errors.

The following embodiments 9–14 are proposed to provide an amplifier that can prevent the bit errors during the signal-less period from the reset signal occurrence to the burst signal input while receiving the input data including burst signals. This can be achieved by deviating the reference voltage of the amplifier from the linear operating region during the signal-less period from the reset signal occurrence to the burst signal input. According to this, the output of the amplifier is maintained at a low level between consecutive burst signals, thereby preventing bit errors during the signal-less period.

EMBODIMENT 9

Figure 28A:
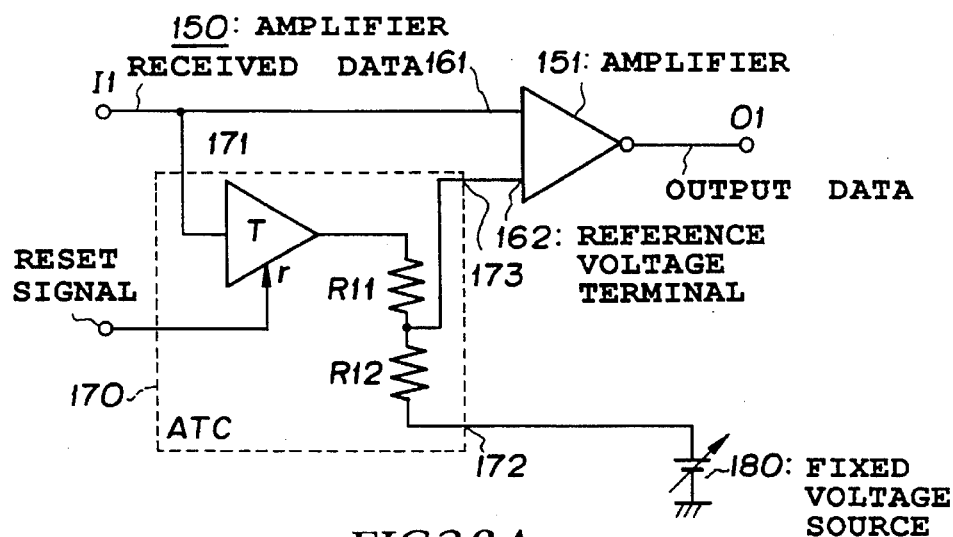
FIG. 28A is a circuit diagram showing an amplifier of a ninth embodiment in accordance with the present invention.
Figure 28B:
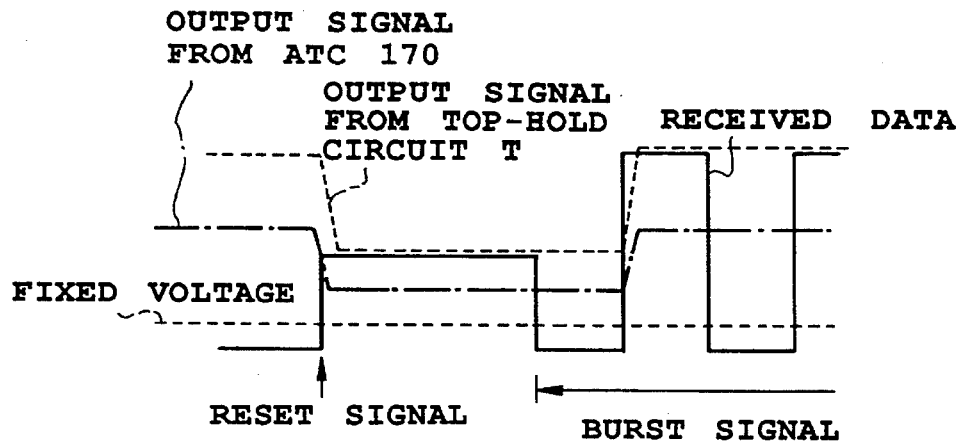
FIGS. 28B and 28C are diagrams illustrating main waveforms of the ninth embodiment.
Figure 28C:
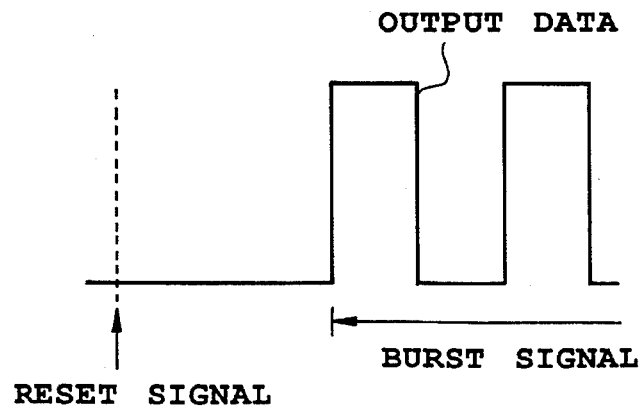

FIG. 28A is a circuit diagram showing an amplifier 150 of a ninth embodiment in accordance with the present invention, and FIGS. 28B and 28C are diagrams illustrating the operation of the amplifier 150.

The amplifier 150, which includes an amplifier 151 and an ATC 170, receives the input data including a burst signal at the input terminal I1, and produces the output data from the output terminal O1.

The amplifier 151 comprises an input terminal 161, to which the received data is applied, and a reference voltage input terminal 162, to which the reference voltage is applied. The amplifier 151 is a limiting amplifier which inversely amplifies the received data.

The ATC 170 generates the reference voltage applied to the reference voltage input terminal of the amplifier 151. The ATC 170 includes a top-hold circuit T holding a maximum value of the received data, and generates the middle voltage between the fixed voltage of a fixed voltage source 180 and the maximum value held by the top-hold circuit T. The middle voltage is supplied to the reference voltage input terminal 162 of the amplifier 151 as the reference voltage. More specifically, a serial circuit of resistors R11 and R12 is connected between the output terminal of the top-hold circuit T and the fixed voltage source 180, and the connecting point of the resistors R11 and R12 is led out as an output terminal 173 of the ATC 170. Then, the output terminal 173 is connected to the reference voltage input terminal 162 of the amplifier 151. The input terminal 171 of the ATC 170 is connected to the input terminal I1 of the amplifier 150. One end of the serial circuit of the resistors R11 and R12 is led out as an output terminal 172 of the ATC 170, which is connected to the fixed voltage source 180.

The top-hold circuit T of the ATC 170 has a reset terminal r, and the input and output signals of the top-hold circuit T are made equipotential when a reset signal is applied to the reset terminal r from the outside.

Next, the operation of this embodiment will be described.

FIG. 28B illustrates waveforms of this embodiment. As is shown in FIG. 28B, the output signal of the ATC 170, that is, the reference voltage of the amplifier 151 is set at a value lower than the signal-less level (which is set at the center of the received data) during the signal-less period from the occurrence of the reset signal to the input of the burst signal. Thus, the output data from the amplifier 150 is set at a low value during the signal-less period because the amplifier 151 is an inverting limiting amplifier. The low value of the output data from the amplifier 150 during the signal-less period can prevent bit errors between consecutive burst signals.

As described above, the middle voltage between the output of the top-hold circuit T and the fixed voltage of the fixed voltage source 180 is generated from the voltage divider consisting of the resistors R11 and R12, and is supplied to the reference voltage input terminal 162 of the amplifier 151. In addition, since the top-hold circuit T follows maximum values of burst signals after it has been reset, the reference voltage applied to the reference voltage input terminal 162 of the amplifier 151 approaches an optimum value.

FIG. 28C illustrates the output data from the amplifier 150 from the occurrence of the reset signal to the input of the burst signal.

The fixed voltage of the fixed voltage source 180 is set at a value which is lower than the voltage at the input terminal I1 (signal-less level) during the signal-less period from the occurrence of the reset signal to the input of the burst signal, and which causes the output data from the amplifier 151 to take the low value as shown in FIG. 28C. Thus, the fixed voltage is determined considering the amplification factor of the amplifier 151, the resistances of the resistors R11 and R12, and the like. The resistances of the resistors R11 and R12 need not be the same: They can be selected at desired values as long as they meet the condition that the output data from the amplifier 151 is set at the low value during the signal-less period.

EMBODIMENT 10

Figure 29A:
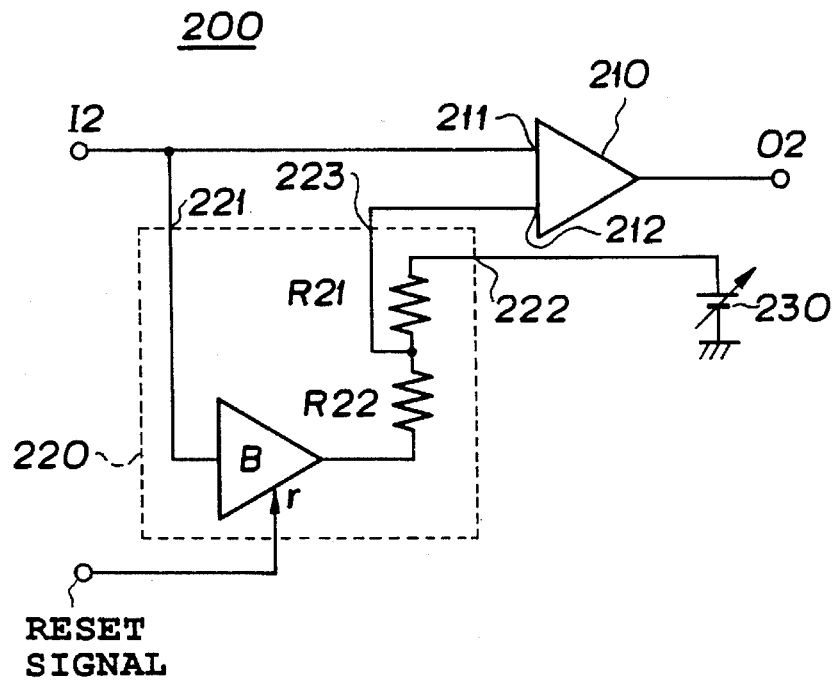
FIG. 29A is a circuit diagram showing an amplifier of a tenth embodiment in accordance with the present invention.
Figure 29B:
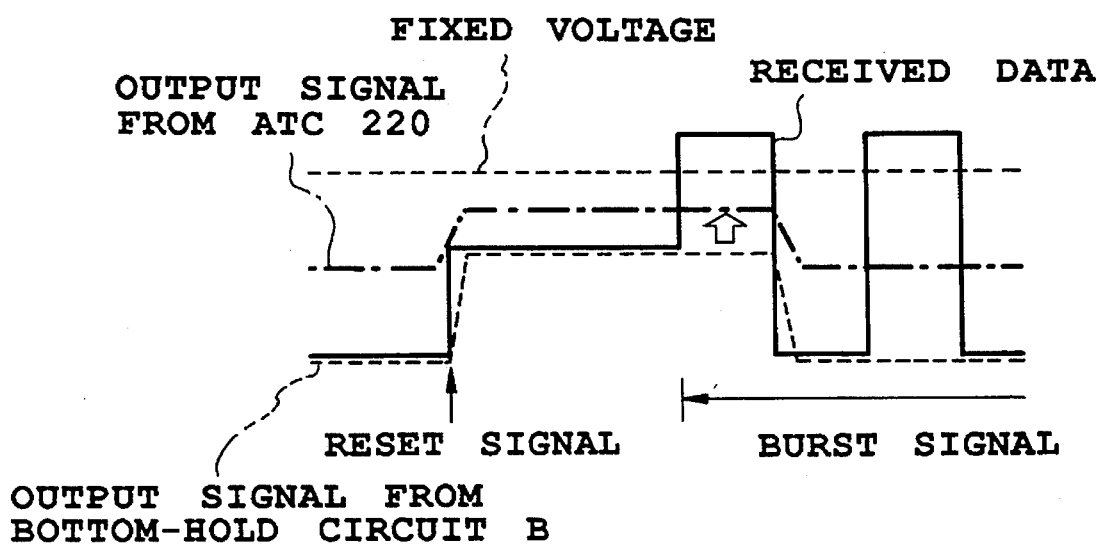
FIG. 29B is a diagram illustrating main waveforms of the tenth embodiment.

FIG. 29A is a circuit diagram showing an amplifier 200 of a tenth embodiment in accordance with the present invention, and FIG. 29B is a diagram illustrating the operation of the amplifier 200.

The amplifier 200, which includes an amplifier 210 and an ATC 220, receives the input data including a burst signal at the input terminal I2, and produces the output data from the output terminal O2.

The amplifier 210 comprises an input terminal 211, to which the received data is applied, and a reference voltage input terminal 212, to which the reference voltage is applied. The amplifier 210 is a limiting amplifier which carries out a non-inverting amplification of the received data on the basis of the reference voltage.

The ATC 220 generates the reference voltage applied to the reference voltage input terminal of the amplifier 210. The ATC 220 includes a bottom-hold circuit B holding a minimum value of the received data, and generates the middle voltage between the fixed voltage of a fixed voltage source 230 and the minimum value held by the bottom-hold circuit B. The middle voltage is supplied to the reference voltage input terminal 212 of the amplifier 210 as the reference voltage. More specifically, a serial circuit of resistors R21 and R22 is connected between the output terminal of the bottom-hold circuit B and the fixed voltage source 230, and the connecting point of the resistors R21 and R22 is led out as an output terminal 223 of the ATC 220. Then, the output terminal 223 is connected to the reference voltage input terminal 212 of the amplifier 210. The input terminal 221 of the ATC 220 is connected to the input terminal I2 of the amplifier 200. One end of the serial circuit of the resistors R21 and R22 is led out as an output terminal 222 of the ATC 220, which is connected to the fixed voltage source 230.

The bottom-hold circuit B of the ATC 220 has a reset terminal r, and the input and output signals of the bottom-hold circuit B are made equipotential when a reset signal is applied to the reset terminal r from the outside.

Next, the operation of this embodiment will be described.

FIG. 29B illustrates waveforms of this embodiment. As shown in this figure, the output signal of the ATC 220, that is, the reference voltage of the amplifier 210 is set at a value higher than the signal-less level of the received data (which is set at the center of the received data) during the signal-less period from the occurrence of the reset signal to the input of the burst signal. Thus, the output data from the amplifier 200 is set at a low value during the signal-less period. The low value of the output data from the amplifier 200 during the signal-less period can prevent bit errors between consecutive burst signals.

As described above, the middle voltage between the output voltage of the bottom-hold circuit B and the fixed voltage of the fixed voltage source 230 is generated from the voltage divider consisting of the resistors R21 and R22, and is supplied to the reference voltage input terminal 212 of the amplifier 210. In addition, since the bottom-hold circuit B follows minimum values of burst signals after it has been reset, the reference voltage applied to the reference voltage input terminal 212 of the amplifier 210 approaches an optimum value.

The output data from the amplifier 200 from the occurrence of the reset signal to the input of the burst signal take the same waveform as shown in FIG. 28C.

The fixed voltage of the fixed voltage source 230 is set at a value which is higher than the voltage at the input terminal I2 (signal-less level) during the signal-less period from the occurrence of the reset signal to the input of the burst signal, and which causes the output data from the amplifier 210 to take the low value as shown in FIG. 28C. Thus, the fixed voltage is determined depending on the amplification factor of the amplifier 210, the resistances of the resistors R21 and R22, and the like. The resistances of the resistors R21 and R22 need not be the same. They can be selected at desired values as long as they meet the condition that the output data from the amplifier 210 is set at the low value.

EMBODIMENT 11

Figure 30A:
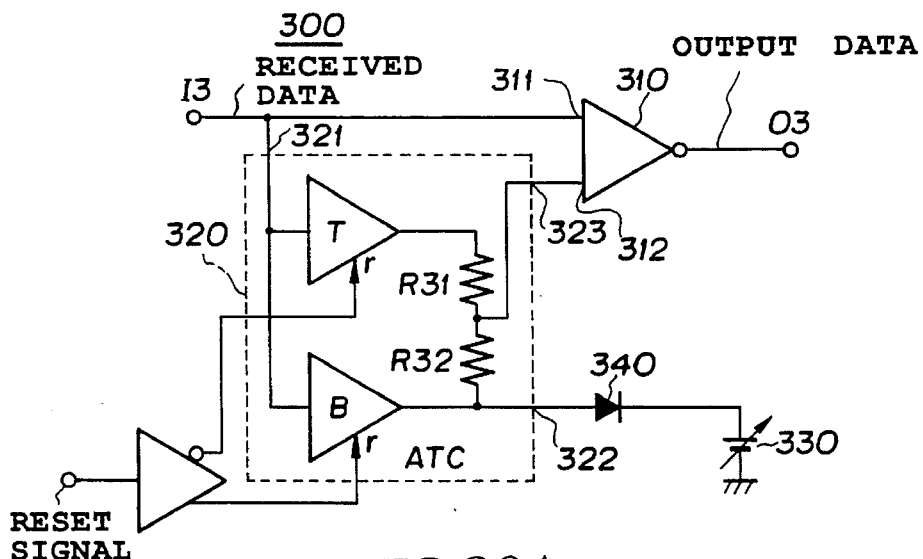
FIG. 30A is a circuit diagram showing an amplifier of an eleventh embodiment in accordance with the present invention.
Figure 30B:
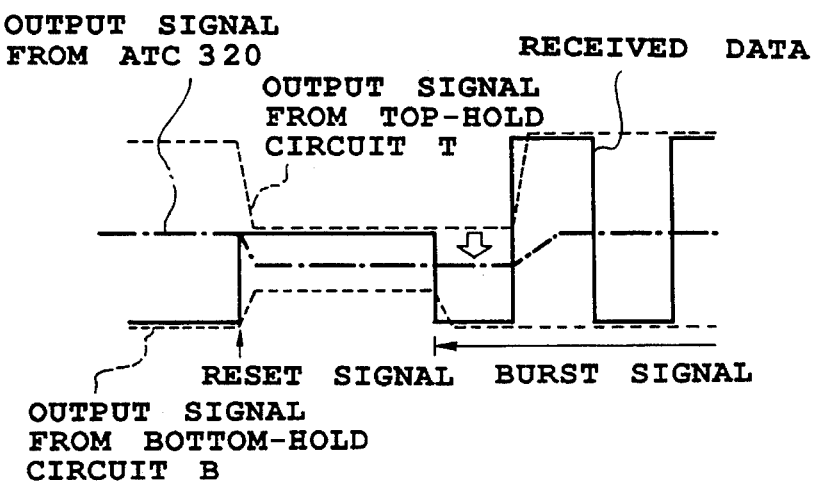
FIGS. 30B and 30C are diagrams illustrating main waveforms of the eleventh embodiment.
Figure 30C:
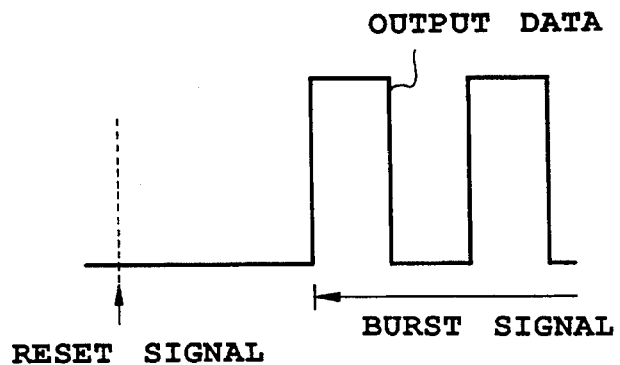

FIG. 30A is a circuit diagram showing an amplifier 300 of an eleventh embodiment in accordance with the present invention, and FIGS. 30B and 30C are diagrams illustrating the operation of the amplifier 300.

The amplifier 300, which includes an amplifier 310 and an ATC 320, receives the input data including a burst signal at the input terminal I3, and produces the output data from the output terminal O3.

The amplifier 310 comprises an input terminal 311, to which the received data is applied, and a reference voltage input terminal 312, to which the reference voltage is applied. The amplifier 310 is a limiting amplifier which carries out an inverting amplification of the received data on the basis of the reference voltage.

The ATC 320 generates the reference voltage applied to the reference voltage input terminal 312 of the amplifier 310. The ATC 320 includes the top-hold circuit T holding a maximum value of the received data, the bottom-hold circuit B holding a minimum value of the received data, and a clamping diode 340 whose anode is connected to the output of the bottom-hold circuit B, and whose cathode is connected to a fixed voltage source 330. The ATC 320 generates the middle voltage between the output voltage of the top-hold circuit T and the output voltage of the bottom-hold circuit B, and supplies it to the reference voltage input terminal 312 of the amplifier 310 as the reference voltage.

More specifically, a serial circuit of resistors R31 and R32 is connected between the output terminal of the top-hold circuit T and the output terminal of the bottom-hold circuit B, and the connecting point of the resistors R31 and R32 is led out as an output terminal 323 of the ATC 320. Then, the output terminal 323 is connected to the reference voltage input terminal 312 of the amplifier 310. The input terminal 321 of the ATC 320 is connected to the input terminal I3 of the amplifier 300. One end of the serial circuit of the resistors R31 and R32 is led out as an output terminal 322 of the ATC 320, which is connected to the fixed voltage source 330.

The top-hold circuit T and the bottom-hold circuit B of the ATC 320 have a reset terminal r, and the input and output signals of the top-hold circuit T and those of the bottom-hold circuit B are made equipotential when a reset signal is applied to the reset terminals r through a buffer amplifier.

Next, the operation of this embodiment will be described.

FIG. 30B illustrates waveforms of this embodiment. As shown in this figure, the output signal of the ATC 320, that is, the reference voltage of the amplifier 310 is set at a value lower than the signal-less level of the received data (which is set at the center of the received data) during the signal-less period from the occurrence of the reset signal to the input of the burst signal. This is carried out because the output of the bottom-hold circuit B is clamped by the clamping diode 340. Thus, the output data from the amplifier 300 is set at a low value during the signal-less period because the amplifier 310 is an inverting limiting amplifier. The low value of the output data from the amplifier 300 during the signal-less period can prevent bit errors between consecutive burst signals.

In addition, since the top-hold circuit T follows maximum values of burst signals, and the bottom-hold circuit B follows minimum values of burst signals after they have been reset, the reference voltage applied to the reference voltage input terminal 312 of the amplifier 310 approaches an optimum value.

FIG. 30C illustrates the output data from the amplifier 300 from the occurrence of the reset signal to the input of the burst signal in this embodiment.

The fixed voltage of the fixed voltage source 330 is set at a value which is lower than the voltage at the input terminal I3 (signal-less level) during the signal-less period from the occurrence of the reset signal to the input of the burst signal, and which causes the output data from the amplifier 310 to take the low value as shown in FIG. 30C. Thus, the fixed voltage is determined depending on the amplification factor of the amplifier 310, the resistances of the resistors R31 and R32, and the like. The resistances of the resistors R31 and R32 need not be the same: They can be selected at desired values as long as they meet the condition that the output data from the amplifier 310 is set at the low value.

EMBODIMENT 12

Figures 31A, 31B:
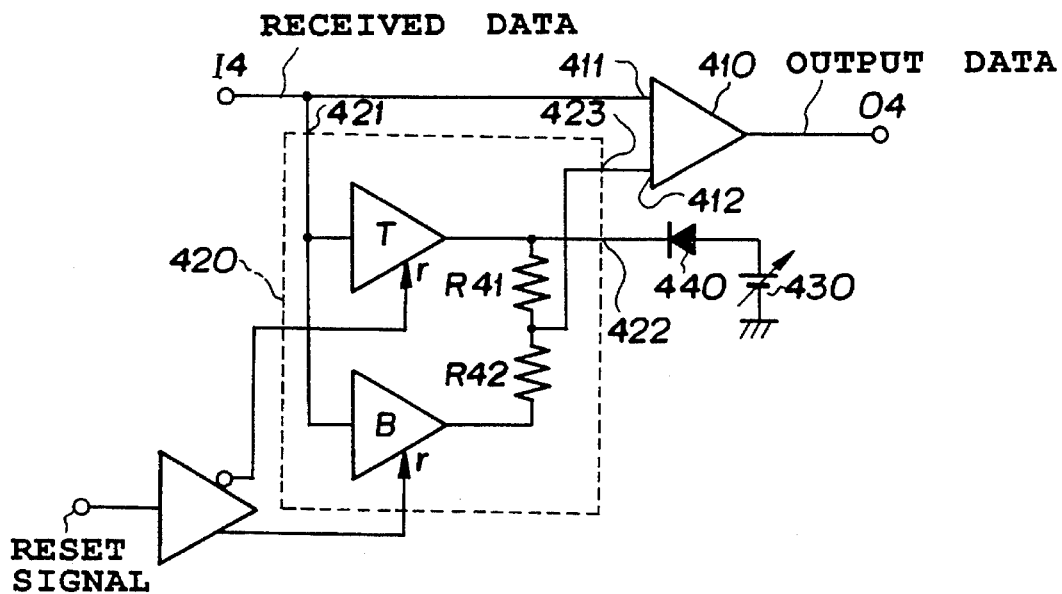
FIG. 31A is a circuit diagram showing an amplifier of a twelfth embodiment in accordance with the present invention.
FIG. 31B is a diagram illustrating main waveforms of the twelfth embodiment.

FIG. 31A is a circuit diagram showing an amplifier 400 of a twelfth embodiment in accordance with the present invention, and FIG. 31B is a diagram illustrating the operation of the amplifier 400.

The amplifier 400, which includes an amplifier 410 and an ATC 420, receives the input data including a burst signal at the input terminal I4, and produces the output data from the output terminal O4.

The amplifier 410 comprises an input terminal 411, to which the received data is applied, and a reference voltage input terminal 412, to which the reference voltage is applied. The amplifier 410 is a limiting amplifier which carries out a non-inverting amplification of the received data on the basis of the reference voltage.

The ATC 420 generates the reference voltage applied to the reference voltage input terminal 412 of the amplifier 410. The ATC 420 includes the top-hold circuit T holding a maximum value of the received data, the bottom-hold circuit B holding a minimum value of the received data, and a clamping diode 440 whose cathode is connected to the output of the top-hold circuit T, and whose anode is connected to a fixed voltage source 430. The ATC 420 generates the middle voltage between the output voltage of the top-hold circuit T and the output voltage of the bottom-hold circuit B, and supplies it to the reference voltage input terminal 412 of the amplifier 410 as the reference voltage.

More specifically, a serial circuit of resistors R41 and R42 is connected between the output terminal of the top-hold circuit T and the output terminal of the bottom-hold circuit B, and the connecting point of the resistors R41 and R42 is led out as an output terminal 423 of the ATC 420. Then, the output terminal 423 is connected to the reference voltage input terminal 412 of the amplifier 410. The input terminal 421 of the ATC 420 is connected to the input terminal I4 of the amplifier 400. One end of the serial circuit of the resistors R41 and R42 is led out as an output terminal 422 of the ATC 420, which is connected to the fixed voltage source 430.

The top-hold circuit T and the bottom-hold circuit B of the ATC 420 have a reset terminal r, and the input and output signals of the top-hold circuit T and those of the bottom-hold circuit B are made equipotential when a reset signal is applied to the reset terminals r through the buffer amplifier.

Next, the operation of this embodiment will be described.

FIG. 31B illustrates waveforms of this embodiment. As shown in this figure, the output signal of the ATC 420, that is, the reference voltage of the amplifier 410 is set at a value higher than the signal-less level of the received data (which is set at the center of the received data) during the signal-less period from the occurrence of the reset signal to the input of the burst signal. This is because the output of the top-hold circuit T is clamped to the fixed voltage by the clamping diode 440. Thus, the output data from the amplifier 400 is set at a low value during the signal-less period because the amplifier 410 is a non-inverting limiting amplifier. The low value of the output data from the amplifier 400 during the signal-less period can prevent bit errors between consecutive burst signals.

In addition, since the top-hold circuit T follows maximum values of burst signals, and the bottom-hold circuit B follows minimum values of burst signals after they have been reset, the reference voltage applied to the reference voltage input terminal 412 of the amplifier 410 approaches an optimum value.

The waveform of the output data from the amplifier 400 from the occurrence of the reset signal to the input of the burst signal in this embodiment is the same as that shown in FIG. 30C.

The fixed voltage of the fixed voltage source 430 is set at a value which is higher than the voltage at the input terminal I4 (signal-less level) during the signal-less period from the occurrence of the reset signal to the input of the burst signal, and which causes the output data from the amplifier 410 to take the low value as shown in FIG. 30C. Thus, the fixed voltage is determined depending on the amplification factor of the amplifier 410, the resistances of the resistors R41 and R42, and the like. The resistances of the resistors R41 and R42 need not be the same: They can be selected at desired values as long as they meet the condition that the output data from the amplifier 410 is set at the low value.

EMBODIMENT 13

Figure 32A:
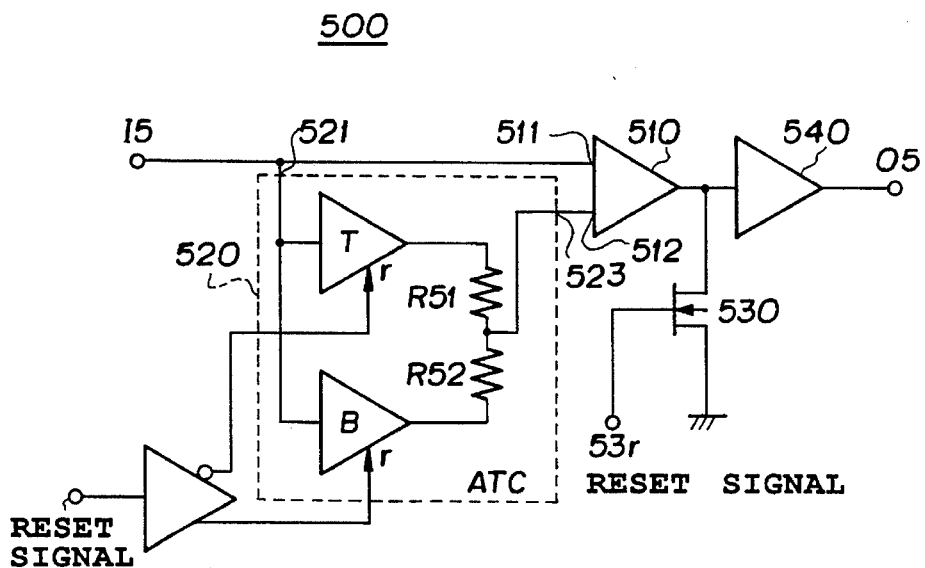
FIG. 32A is a circuit diagram showing an amplifier of a thirteenth embodiment in accordance with the present invention.
Figure 32B:
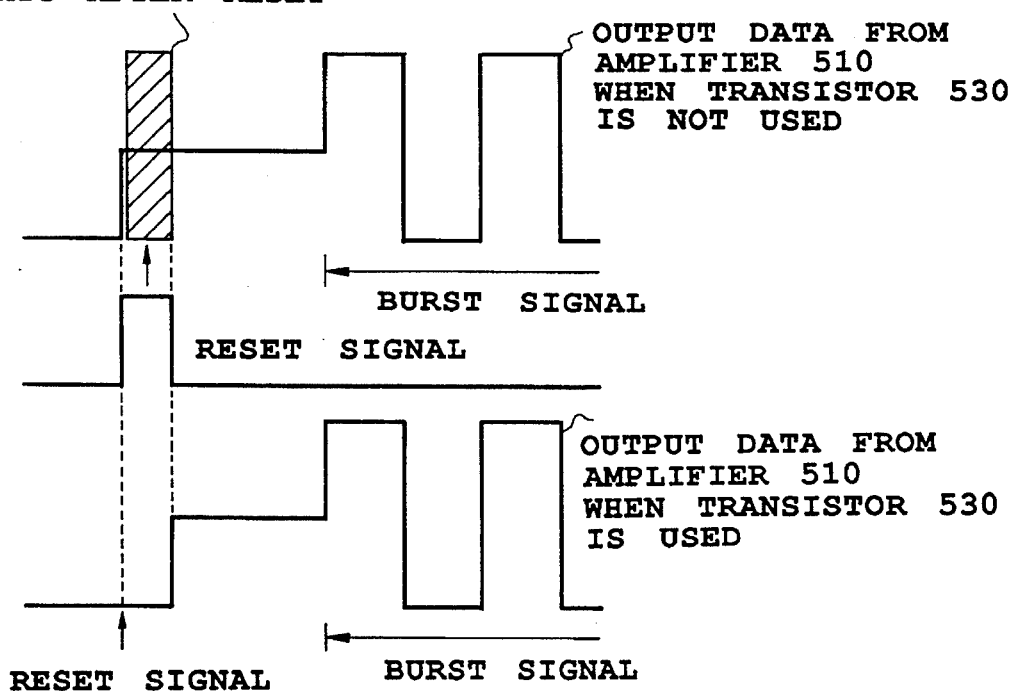
FIG. 32B is a diagram illustrating main waveforms of the thirteenth embodiment.

FIG. 32A is a circuit diagram showing an amplifier 500 of a thirteenth embodiment in accordance with the present invention, and FIG. 32B is a diagram illustrating the operation of the amplifier 500.

The amplifier 500, which includes an amplifier 510, an ATC 520, a transistor 530, and a buffer amplifier 540, receives the input data including a burst signal at the input terminal I5, and produces the output data from the output terminal O5.

The amplifier 510 comprises an input terminal 511, to which the received data is applied, and a reference voltage input terminal 512, to which the reference voltage is applied. The amplifier 510 is a limiting amplifier which carries out a non-inverting amplification of the received data on the basis of the reference voltage.

The ATC 520 generates the reference voltage applied to the reference voltage input terminal 512 of the amplifier 510. The ATC 520 includes the top-hold circuit T holding a maximum value of the received data, and the bottom-hold circuit B holding a minimum value of the received data. The ATC 520 generates the middle voltage between the output voltage of the top-hold circuit T and the output voltage of the bottom-hold circuit B, and supplies it to the reference voltage input terminal 512 of the amplifier 510 as the reference voltage.

More specifically, a serial circuit of resistors R51 and R52 is connected between the output terminal of the top-hold circuit T and the output terminal of the bottom-hold circuit B, and the connecting point of the resistors R51 and R52 is led out as an output terminal 523 of the ATC 520. Then, the output terminal 523 is connected to the reference voltage input terminal 512 of the amplifier 510. The input terminal 521 of the ATC 520 is connected to the input terminal I5 of the amplifier 500.

The top-hold circuit T and the bottom-hold circuit B of the ATC 520 have a reset terminal r, and the input and output signals of the top-hold circuit T and bottom-hold circuit B are made equipotential when a reset signal is applied to the reset terminals r through the buffer amplifier.

The transistor 530 is an n-channel MOSFET, and the drain is connected to the output terminal of the non-inverting amplifier 510, the source is grounded, and the gate is connected to a reset terminal 53r, to which the reset signal is applied.

Next, the operation of this embodiment will be described.

FIG. 32B illustrates waveforms of this embodiment.

An unstable operation of the ATC 520 at a reset will cause noise while a reset signal is applied to the reset terminal 53r, as shown at the top of FIG. 32B. The reset signal, however, turns on the transistor 530, thereby grounding the output terminal of the amplifier 510. Thus, the output data is forced to take the low value during the reset signal. This will eliminate the noise during the reset signal period as shown at the bottom of FIG. 32B.

Although the waveform at the top of FIG. 32B is depicted as if the reset signal ended before starting to receive the burst signal, the end timing of the reset signal is set in such a manner that it approximately agrees with the start timing of receiving the burst signal, which is known beforehand. In other words, the reset signal is generated before starting to receive the burst signal by a predetermined number of bits, and is continued for the predetermined number of bits from the generation. This makes it possible to eliminate the amplitude noise during the signal-less period from the occurrence of the reset signal to the start of receiving the burst signal.

To accomplish this function, the reset signal, which is applied to the top-hold circuit T and the bottom-hold circuit B, may be applied to the gate of the transistor 530 after it is delayed by a certain amount of time. This will ensure that the noise, which is due to unstable operation of the ATC 520 after the reset, and may remain after the completion of the reset operation, is completely eliminated.

The ATC 520 in FIG. 32A is the same as that of the third embodiment as shown in FIG. 11. The ATC 520 can be replaced with the combination of the ATC 170 and the fixed voltage source 180 as shown in FIG. 28A, with the combination of the ATC 220 and the fixed voltage source 230 as shown in FIG. 29A, with the combination of the ATC 320, the fixed voltage source 330 and the diode 340 as shown in FIG. 30A, or with the combination of the ATC 420, the fixed voltage source and the diode 440 as shown in FIG. 31A. In these cases, the end timing of the reset signal need not be set such that it agrees with the start timing of receiving the burst signal. That is, the reset signal may be ended before starting to receive the burst signal, because the noise due to the unstable operation of the ATC immediately after the reset is eliminated by the transistor 530, and the amplitude noise during the remainder of the signal-less duration is eliminated by the operation described in the ninth to twelfth embodiments.

EMBODIMENT 14

Figure 33:
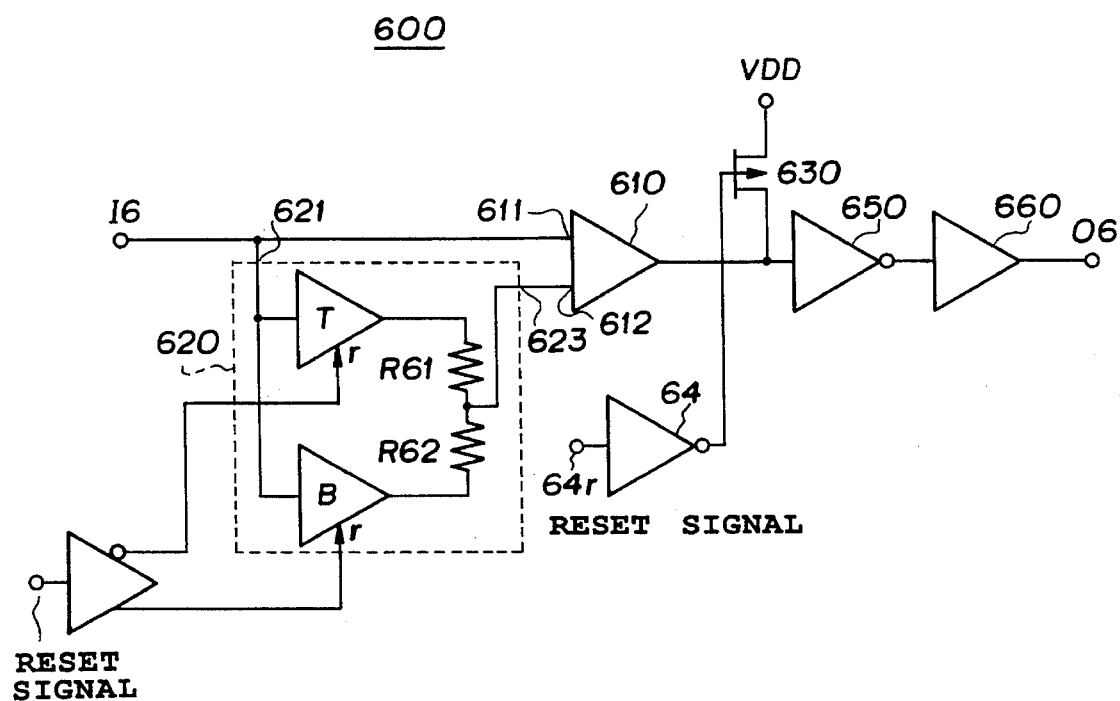
FIG. 33 is a circuit diagram showing an amplifier of a fourteenth embodiment in accordance with the present invention.

FIG. 33 shows the circuit of an amplifier 600 of a fourteenth embodiment in accordance with the present invention.

The amplifier 600, which includes an amplifier 610, an ATC 620, a transistor 630, inverters 640 and 650, and a buffer amplifier 660, receives the input data including a burst signal at the input terminal I6, and produces the output data from the output terminal O6.

The amplifier 610 is the same as the amplifier 510, and comprises an input terminal 611, to which the received data is applied, and a reference voltage input terminal 612, to which the reference voltage is applied. The amplifier 610 is a limiting amplifier which carries out a non-inverting amplification of the received data on the basis of the reference voltage.

The ATC 620 is the same as the ATC 520, and generates the reference voltage applied to the reference voltage input terminal 612 of the amplifier 610. The ATC 620 includes the top-hold circuit T holding a maximum value of the received data, and the bottom-hold circuit B holding a minimum value of the received data. The ATC 620 generates the middle voltage between the output voltage of the top-hold circuit T and the output voltage of the bottom-hold circuit B, and supplies it to the reference voltage input terminal 612 of the amplifier 610 as the reference voltage.

More specifically, a serial circuit of resistors R61 and R62 is connected between the output terminal of the top-hold circuit T and the output terminal of the bottom-hold circuit B, and the connecting point of the resistors R61 and R62 is led out as an output terminal 623 of the ATC 620. Then, the output terminal 623 is connected to the reference voltage input terminal 612 of the amplifier 610. The input terminal 621 of the ATC 620 is connected to the input terminal I6 of the amplifier 600.

The top-hold circuit T and the bottom-hold circuit B of the ATC 620 have a reset terminal r, and the input and output signals of the top-hold circuit T and bottom-hold circuit B are made equipotential when a reset signal is applied to the reset terminals r through the buffer amplifier.

The transistor 630 is a p-channel MOSFET, and the drain is connected to the output terminal of the non-inverting amplifier 610, the source is connected to the power supply VDD, and the gate is connected through an inverter 640 to a reset terminal 64r, to which the reset signal is applied.

Next, the operation of this embodiment will be described.

Major waveforms of this embodiment are the same as those of FIG. 32B. An unstable operation of the ATC 620 at a reset will cause noise while a reset signal is applied to the reset terminal 64r, as shown at the top of FIG. 32B. The reset signal, however, turns on the transistor 630, thereby clamping the output terminal of the amplifier 610 to VDD. Thus, the output data is forced to take the high value during the reset signal. This will eliminate the noise during the reset signal period as shown at the bottom of FIG. 32B.

The end timing of the reset signal is set in such a manner that it approximately agrees with the start timing of receiving the burst signal, which is known beforehand. In other words, the reset signal is generated before starting to receive the burst signal by a predetermined number of bits, and is ended after that predetermined number of bits from the generation. This makes it possible to eliminate the amplitude noise during the signal-less period from the occurrence of the reset signal to the start of receiving the burst signal.

To accomplish this function, the reset signal, which is applied to the top-hold circuit T and the bottom-hold circuit B, may be applied to the gate of the transistor 630 after it is delayed by a certain amount of time. This will ensure that the noise, which is due to unstable operation of the ATC 620 after the reset, and may remain after the completion of the reset operation, is completely eliminated.

The ATC 620 in FIG. 33 is the same as that of the third embodiment as shown in FIG. 11. The ATC 620 can be replaced with the combination of the ATC 170 and the fixed voltage source 180 as shown in FIG. 28A, with the combination of the ATC 220 and the fixed voltage source 230 as shown in FIG. 29A, with the combination of the ATC 320, the fixed voltage source 330 and the diode 340 as shown in FIG. 30A, or with the combination of the ATC 420, the fixed voltage source and the diode 440 as shown in FIG. 31A. In these cases, the end timing of the reset signal need not be set such that it agrees with the start timing of receiving the burst signal. That is, the reset signal may be ended before starting to receive the burst signal, because the noise due to the unstable operation of the ATC immediately after the reset is eliminated by the transistor 630, and the amplitude noise during the remainder of the signal-less duration is eliminated by the operation described in the ninth to twelfth embodiments.

When a plurality of amplifiers are connected in cascade as the amplifiers 610, 650 and 660 in FIG. 33, the transistor 630 or 530 may be connected to the input terminal of any one of the post stage amplifiers. In this case, the transistor 630 should be connected to the input terminal if the post stage amplifier is a non-inverting amplifier, and the transistor 530 should be connected to the input terminal if the post stage amplifier is an inverting amplifier.

Furthermore, the above-described embodiments 9–14 are applicable to the final stage of the multi-staged configurations of FIGS. 6 and 13.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An amplifier comprising:
    a limiting amplifier including a signal input terminal and a reference voltage input terminal, for amplifying an input signal applied to the signal input terminal and for producing a limited output signal when an amplitude of the input signal is greater than a predetermined value and a level of the input signal is within a predetermined range with regard to a reference voltage applied to the reference voltage input terminal; and an automatic threshold control circuit for supplying the reference voltage input terminal of said limiting amplifier with a substantially middle value between a top value of the input signal and a bottom value of the input signal as the reference voltage, and comprising:

a top-hold circuit for detecting and holding a top value of the input signal, a bottom-hold circuit for detecting and holding a bottom value of the input signal, said top hold circuit including:

a first voltage follower circuit including a first differential amplifier;

a first source follower having an output connected to an inverting input of said first differential amplifier;

a first diode-connected FET connected between an output of said first differential amplifier and an input of said first source follower; and a top-hold capacitor connected to the input of said first source follower to store the top value of the input signal provided through said first diode-connected FET, said first source follower outputting the top value stored in said top-hold capacitor, and said bottom-hold circuit includes:

a second voltage follower circuit including a second differential amplifier;

a second source follower having an output connected to an inverting input of said second differential amplifier;

a second diode-connected FET connected between an output of said second differential amplifier and an input of said second source follower; and a bottom-hold capacitor connected to the input of said second source follower to store the bottom value of the input signal provided through said second diode-connected FET, said second source follower outputting the bottom value stored in said bottom-hold capacitor; and a voltage divider for producing the substantially middle value between the top value and the bottom value as the reference voltage.

2. The amplifier as claimed in claim 1, said top-hold circuit comprises a first reset signal terminal, and first switching device connected in parallel with said first diode-connected FET, a gate of said first switching device being connected to said first reset signal terminal, and said bottom-hold circuit comprises a second reset signal terminal, and a second switching device connected in parallel with said second diode-connected FET, a gate of said second switching device connected to said second reset signal terminal, and each of said top-hold circuit and said bottom-hold circuit produces an output signal of substantially the same predetermined level when the top-hold circuit and the bottom-hold circuit are reset by a reset signal externally supplied to each said reset signal terminal before starting to receive the receiving signal.

3. The amplifier as claimed in claim 2, wherein said limiting amplifier comprises a first amplifier and at least one additional amplifier connected in cascade to the output of said first amplifier and further comprising a transistor including drain, source and gate, the drain of the transistor being connected to a signal input terminal of one of said additional amplifiers, the source of the transistor being connected to a common terminal, and the gate of the transistor being provided with the reset signal.

4. The amplifier as claimed in claim 2, wherein said limiting amplifier comprises a first amplifier and at least one additional amplifier connected in cascade to the output of said first amplifier and further comprising a transistor including drain, source and gate, the drain of the transistor being connected to a signal input terminal of one of said additional amplifiers, the source of the transistor being connected to a common terminal, and the gate of the transistor being provided with the reset signal, wherein the reset signal is ended in accordance With a start timing of receiving the input signal.

5. The amplifier as claimed in claim 1, wherein said limiting amplifier comprises:

a first amplifier including a first amplifying stage and a first output stage, said first amplifying stage and said first output stage including transistors of a first conductivity type; and a second amplifier, including a second amplifying stage and a second output stage, connected in cascade with said first amplifier, said second amplifying stage and said second output stage including transistors of a second conductivity type;

wherein said second amplifier is a non-inverting amplifier, and one of upper and lower limits of the limited output signal is limited by said first output stage, and the other of the upper and lower limits of the limited output signal is limited by said second output stage.

6. The amplifier as claimed in claim 5, wherein said first output stage comprises a serial connection of a first source follower transistor and a first constant current source transistor and said second output stage comprises a serial connection of a second source follower transistor and a second constant current source transistor, and wherein said one of upper and lower limits of the limited output signal is limited by a characteristic of said first source follower transistor and said other of the upper and lower limits of the limited output signal is limited by a characteristic of said second source follower transistor.

7. The amplifier as claimed in claim 6, wherein said first amplifying stage comprises a first differential amplifier including a first plurality of active load transistors of said second conductivity type and a pair of transistors of said first conductivity type for driving said first plurality of active load transistors, and said second amplifying stage comprises a second differential amplifier including a second plurality of active load transistors of said first conductivity type and a pair of transistors of said second conductivity type for driving said second plurality of active load transistors.

8. The amplifier as claimed in claim 6, wherein the characteristic of the first source follower transistor includes a gate-source voltage of the first source follower transistor, and the characteristic of the second source follower transistor includes a gate-source voltage of the second source follower transistor.

9. The amplifier as claimed in claim 8, wherein the gate-source voltage of the first source follower transistor is determined by a current generated by said first constant current source transistor, and the gate-source voltage of the second source follower transistor is determined by a current generated by said second constant current source transistor.

10. The amplifier as claimed in claim 8, wherein the gate-source voltage of the first source follower transistor is determined by a first transistor size, said first transistor size being determined by a ratio of a channel width to a channel length of the first follower transistor, and the gate-source voltage of the second source follower transistor is determined by a second transistor size, said second transistor size being determined by a ratio of a channel width to a channel length of the second follower transistor.

11. The amplifier as claimed in claim 5, further comprising:
   a first resistor connected between the output terminal of said first amplifier and the input terminal of said second amplifier; and
   a second resistor connected between the output terminal and the input terminal of said second amplifier.

12. The amplifier as claimed in claim 1, wherein said limiting amplifier comprises:
   a first amplifier including a first amplifying stage and a first output stage, said first amplifying stage and said first output stage including transistors of a first conductivity type; and
   a second amplifier, including a second amplifying stage and a second output stage, connected in cascade to said first amplifier, said second amplifying stage said and second output stage including transistors of a second conductivity type;
   wherein said second amplifier is an inverting amplifier including a signal input terminal and a reference voltage input terminal, and one of upper and lower limits of the limited output signal is limited by biasing a reference voltage applied to said reference voltage input terminal from a center of a linear operating region of said second amplifier, and the other of the upper and lower limits of the limited output signal is limited by said second output stage.

13. The amplifier as claimed in claim 12, wherein said second output stage comprises a serial connection of a second source follower transistor and a second constant current source transistor, and wherein said other of the upper and lower limits of the limited output signal is limited by a characteristic of said second source follower transistor.

14. The amplifier as claimed in claim 13, wherein said first output stage comprises a serial connection of a first source follower transistor and a first constant current source transistor, and wherein said other of the upper and lower limits of the limited output signal is further limited by a characteristic of said first source follower transistor.

15. The amplifier as claimed in claimed 14, wherein said first amplifying stage comprises a first differential amplifier including a first plurality of active load transistors of said second conductivity type and a pair of transistors of said first conductivity type for driving said first plurality of active load transistors, and said second amplifying stage comprises a second differential amplifier including a second plurality of active load transistors of said first conductivity type and a pair of transistors of said second conductivity type for driving said second plurality of active load transistors.

16. The amplifier as claimed in claim 12, further comprising:
   a first resistor connected between the output terminal of said first amplifier and the input terminal of said second amplifier; and
   a second resistor connected between the output terminal and the input terminal of said second amplifier.

17. The amplifier as claimed in claim 1 further comprising a clamping diode and a fixed voltage terminal, said fixed voltage terminal being externally applied with a fixed voltage,
   wherein said clamping diode is connected between the output terminal of said bottom-hold circuit and the fixed voltage terminal, and
   wherein each of said top-hold circuit and said bottom-hold circuit includes a reset signal terminal, and voltages of the input terminal and output terminal of said top-hold circuit and voltages of said bottom-hold circuit become substantially equal when the top-hold circuit and the bottom-hold circuit are reset by an external reset signal.

18. The amplifier as claimed in claim 1, further comprising a clamping diode and a fixed voltage terminal, the fixed voltage terminal being externally applied with a fixed voltage,
   wherein said clamping diode is connected between the output terminal of said top-hold circuit and the fixed voltage terminal, and
   wherein each of said top-hold circuit and said bottom-hold circuit included a reset signal terminal, and voltages of the input terminal and output terminal of said top-hold circuit and voltages of said bottom-hold circuit become substantially equal when the top-hold circuit and the bottom-hold circuit are reset by an external reset signal.

19. An amplifier comprising:
   a plurality of basic amplifiers connected in cascade, each of said basic amplifiers comprising:
   a limiting amplifier, including a signal input terminal and a reference voltage input terminal, for amplifying an input signal applied to the signal input terminal and for producing a limited output signal when an amplitude of the input signal is greater than a predetermined value, and a level of the input signal is within a predetermined range with regard to a reference voltage applied to the reference voltage input terminal; and
   an automatic threshold control circuit for supplying the reference voltage input terminal of said limiting amplifier with a substantially middle value between a top value of the input signal and a bottom value of the input signal as the reference voltage.

20. The amplifier as claimed in claim 19, wherein said automatic threshold control circuit comprises:
   a top-hold circuit for detecting and holding a top value of the input signal;
   a bottom-hold circuit for detecting and holding a bottom value of the input signal; and
   a voltage divider for producing the substantially middle value between the top value and the bottom value as the reference voltage.

21. The amplifier as claimed in claim 20, wherein each of said top-hold circuit and said bottom-hold circuit comprises a reset signal terminal, and produces an output signal of substantially the same predetermined level when the top-hold circuit and the bottom-hold circuit are reset by a reset signal externally supplied to each said reset signal terminal.

22. The amplifier as claimed in claim 21, further comprising a delay circuit interposed between each two consecutive basic amplifiers of said plurality of basic amplifiers connected in cascade to allow sequential resetting of said top-hold circuit and said bottom-hold circuit of each of said plurality of basic amplifiers.

23. An amplifier as claimed in claim 21, further comprising a final stage basic amplifier connected to the output of the plurality of basic amplifiers connected in cascade, said final stage basic amplifier comprising:
   a limiting amplifier, including a signal input terminal and a reference voltage input terminal, for amplifying an input signal applied to the signal input terminal and for producing a limited output signal when the amplitude of the input signal is greater than a predetermined value, and level of the input signal is within a predetermined range with regard to a reference voltage applied to the reference voltage input terminal; and an automatic threshold control circuit for supplying the reference voltage to the reference voltage input terminal of said limiting amplifier, wherein said automatic threshold control circuit comprises a top-hold circuit for detecting and holding a top value of the input signal and a voltage divider for producing, as the reference voltage, a divided voltage between the output of said top-hold circuit and a fixed voltage externally supplied, and wherein voltages of the input terminal and output terminal of said top-hold circuit become substantially equal when the top-hold circuit is reset by an external reset signal.

24. The amplifier as claimed in claim 21, further comprising a final stage basic amplifier connected to the output of the plurality of basic amplifiers connected in cascade, said final stage basic amplifier comprising:

a limiting amplifier, including a signal input terminal and a reference voltage input terminal, for amplifying an input signal applied to the signal input terminal and for producing a limited output signal when the amplitude of the input signal is greater than a predetermined value, and the level of the input signal is within a predetermined range with regard to a reference voltage applied to the reference voltage input terminal; and an automatic threshold control circuit for supplying the reference voltage to the reference voltage input terminal of said limiting amplifier, wherein said automatic threshold control circuit comprises a bottom-hold circuit for detecting and holding a bottom value of the input signal and a voltage divider for producing, as the reference voltage, a divided voltage between the output of said bottom-hold circuit and a fixed voltage externally supplied, and wherein voltages of the input terminal and output terminal of said bottom-hold circuit become substantially equal when the bottom-hold circuit is reset by an external reset signal.

25. The amplifier as claimed in claim 21 further comprising a final stage basic amplifier comprises:

a fixed voltage terminal having a fixed voltage applied externally; and a clamping diode connected between the output terminal of said bottom-hold circuit and the fixed voltage terminal;

wherein each of said top-hold circuit and said bottom-hold circuit includes a reset signal terminal, and voltages of the input terminal and output terminal of said top-hold circuit and voltages of said bottom-hold circuit become substantially equal when the top-hold circuit and the bottom-hold circuit are reset by an external reset signal.

26. The amplifier as claimed in claim 21 further comprising a final stage basic amplifier comprises:

a fixed voltage terminal having a fixed voltage applied externally; and a clamping diode connected between the output terminal of said top-hold circuit and the fixed voltage terminal, wherein each of said top-hold circuit and said bottom-hold circuit includes a reset signal terminal, and voltages of the input terminal and output terminal of said top-hold circuit and voltages of said bottom-hold circuit become substantially equal when the top-hold circuit and the bottom-hold circuit are reset by an external reset signal.

27. The amplifier as claimed in claim 21, wherein said limiting amplifier comprises a first amplifier and at least one additional amplifier connected in cascade to the output of said first amplifier and wherein the plurality of basic amplifiers connected in cascade includes a final stage comprising a transistor including drain, source and gate, the drain of the transistor being connected to a signal input terminal of one of said additional amplifiers, the source of the transistor being connected to a common terminal, and the gate of the transistor being provided with the reset signal.

28. The amplifier as claimed in claim 21, wherein, said limiting amplifier comprises a first amplifier and at least one additional amplifier connected in cascade to the output of said first amplifier and wherein the plurality of basic amplifiers connected in cascade includes a final stage comprising a transistor including drain, source and gate, the drain of the transistor being connected to a signal input terminal of one of said additional amplifiers, the source of the transistor being connected to a common terminal, and the gate of the transistor being provided with the reset signal, wherein the reset signal is ended in accordance with a start timing of receiving the input signal.

29. The amplifier as claimed in claim 19, wherein said limiting amplifier comprises:

a first amplifier including a first amplifying stage and a first output stage, said first amplifying stage and said first output stage including transistors of a first conductivity type; and a second amplifier, including a second amplifying stage and a second output stage, connected in cascade to said first amplifier, said second amplifying stage and said second output stage including transistors of a second conductivity type;

wherein said second amplifier is a non-inverting amplifier, and one of upper and lower limits of the limited output signal is limited by said first output stage, and the other of the upper and lower limits of the limited output signal is limited by said second output stage.

30. The amplifier as claimed in claim 29, wherein said first output stage comprises a serial connection of a first source follower transistor and a first constant current source transistor and said second output stage comprises a serial connection of a second source follower transistor and a second constant current source transistor, and wherein said one of upper and lower limits of the limited output signal is limited by a characteristic of said first source follower transistor, and said other of the upper and lower limits of the limited output signal is limited by a characteristic of said second source follower transistor.

31. The amplifier as claimed in claim 30, wherein said first amplifying stage comprises a first differential amplifier including a first plurality of active load transistors of said second conductivity type and a pair of transistors of said first conductivity type for driving said first plurality of active load transistors, and said second amplifying stage comprises a second differential amplifier including a second plurality of active load transistors of said first conductivity type and a pair of transistors of said second conductivity type for driving said second plurality of active load transistors.

32. The amplifier as claimed in claim 30, further comprising:

a first resistor connected between the output terminal of said first amplifier and the input terminal of said second amplifier; and a second resistor connected between the output terminal and the input terminal of said second amplifier.

33. The amplifier as claimed in claim 30, wherein the characteristic of the first source follower transistor includes a gate-source voltage of the first source follower transistor, and the characteristic of the second source follower transistor includes a gate-source voltage of the second source follower transistor.

34. The amplifier as claimed in claim 33, wherein the gate-source voltage of the first source follower transistor is determined by a current generated by said first constant current source transistor, and the gate-source voltage of the second source follower transistor is determined by a current generated by said second constant current source transistor.

35. The amplifier as claimed in claim 33, wherein the gate-source voltage of the first source follower transistor is determined by a first transistor-size, said first transistor size being determined by a ratio of a channel width to a channel length of the first follower transistor, and the gate-source voltage of the second source follower transistor is determined by a second transistor size, said second transistor size being determined by a ratio of a channel width to a channel length of the second follower transistor.

36. The amplifier as claimed in claim 19, wherein said limiting amplifier comprises:

a first amplifier including a first amplifying stage and a first output stage, said first amplifying stage and said first output stage including transistors of a first conductivity type; and a second amplifier, including a second amplifying stage and a second output stage, connected in cascade to said first amplifier, said second amplifying stage and said second output stage including transistors of a second conductivity type;

wherein said second amplifier is an inverting amplifier including a signal input terminal and a reference voltage input terminal, and one of upper and lower limits of the limited output signal is limited by biasing a reference voltage applied to said reference voltage input terminal from a center of a linear operating region of said second amplifier, and the other of the upper and lower limits of the limited output signal is limited by said second output stage.

37. The amplifier as claimed in claim 36, wherein said second output stage comprises a serial connection of a second source follower transistor and a second constant current source transistor, and wherein said other of the upper and lower limits of the limited output signal is limited by a characteristic of said second source follower transistor.

38. The amplifier as claimed in claim 37, wherein said first output stage comprises a serial connection of a first source follower transistor and a first constant current source transistor, and wherein said other of the upper and lower limits of the limited output signal is further limited by a characteristic of said first source follower transistor.

39. The amplifier as claimed in claim 38, wherein said first amplifying stage comprises a first differential amplifier including a first plurality of active load transistors of said second conductivity type and a pair of transistors of said first conductivity type for driving said first plurality of active load transistors, and said second amplifying stage comprises a second differential amplifier including a second plurality of active load transistors of said first conductivity type and a pair of transistors of said second conductivity type for driving said second plurality of active load transistors.

40. The amplifier as claimed in claim 36, further comprising:

a first resistor connected between the output terminal of said first amplifier and the input terminal of said second amplifier; and a second resistor connected between the output terminal and the input terminal of said second amplifier.

41. A limiting amplifier for amplifying an input signal and for producing a limited output signal having a limited amplitude, said limiting amplifier comprising:

a first amplifier including a first amplifying stage and a first output stage, said first amplifying stage and said first output stage including transistors of a first conductivity type; and a second amplifier, including a second amplifying stage and a second output stage, connected in cascade to said first amplifier, said second amplifying stage and said second output stage including transistors of a second conductivity type;

wherein said second amplifier is a non-inverting amplifier, and one of upper and lower limits of the limited output signal is limited by said first output stage, and the other of the upper and lower limits of the limited output signal is limited by said second output stage.

42. The amplifier as claimed in claim 41, wherein said first output stage comprises a serial connection of a first source follower transistor and a first constant current source transistor and said second output stage comprises a serial connection of a second source follower transistor and a second constant current source transistor, and wherein said one of upper and lower limits of the limited output signal is limited by a characteristic of said first source follower transistor and said other of the upper and lower limits of the limited output signal is limited by a characteristic of said second source follower transistor.

43. The amplifier as claimed in claim 42, wherein said first amplifying stage comprises a first differential amplifier including a first plurality of active load transistors of said second conductivity type and a pair of transistors of said first conductivity type for driving said first plurality of active load transistors, and said second amplifying stage comprises a second differential amplifier including a second plurality of active load transistors of said first conductivity type and a pair of transistors of said second conductivity type for driving said second plurality of active load transistors.

44. The amplifier as claimed in claim 42, wherein the characteristic of the first source follower transistor includes a gate-source voltage of the first source follower transistor, and the characteristic of the second source follower transistor includes a gate-source voltage of the second source follower transistor.

45. The amplifier as claimed in claim 44, wherein the gate-source voltage of the first source follower transistor is determined by a current generated by said first constant current source transistor, and the gate-source voltage of the second source follower transistor is determined by a current generated by said second constant current source transistor.

46. The amplifier as claimed in claim 44, wherein the gate-source voltage of the first source follower transistor is determined by a first transistor size, said first transistor size being determined by a ratio of a channel width to a channel length of the first follower transistor, and the gate source voltage of the second source follower transistor is determined by a second transistor size, said second transistor size being determined by a ratio of a channel width to a channel length of the second follower transistor.

47. The amplifier as claimed in claim 41, further comprising:

a first resistor connected between the output terminal of said first amplifier and the input terminal of said second amplifier; and a second resistor connected between the output terminal and the input terminal of said second amplifier.

48. A limiting amplifier for amplifying an input signal and for producing a limited output signal having a limited amplitude, said limiting amplifier comprising:

a first amplifier including a first amplifying stage and a first output stage, said first amplifying stage and said first output stage including transistors of a first conductivity type; and a second amplifier, including a second amplifying stage and a second output stage, connected in cascade to said first amplifier, said second amplifying stage and said second output stage including transistors of a second conductivity type;

wherein said second amplifier is an inverting amplifier including a signal input terminal and a reference voltage input terminal, and one of upper and lower limits of the limited output signal is limited by biasing a reference voltage applied to said reference voltage input terminal from a center of a linear operating region of said second amplifier, and the other of the upper and lower limits of the limited output signal is limited by said second output stage.

49. The amplifier as claimed in claim 48, wherein said second output stage comprises a serial connection of a second source follower transistor and a second constant current source transistor, and wherein said other of the upper and lower limits of the limited output signal is limited by a characteristic of said second source follower transistor.

50. The amplifier as claimed in claim 49, wherein said first output stage comprises a serial connection of a first source follower transistor and a first constant current source transistor, and wherein said other of the upper and lower limits of the limited output signal is further limited by a characteristic of said first source follower transistor.

51. The amplifier as claimed in claim 50, wherein said first amplifying stage comprises a first differential amplifier including a first plurality of active load transistors of said second conductivity type and a pair of transistors of said first conductivity type for driving said first plurality of active load transistors, and said second amplifying stage comprises a second differential amplifier including a second plurality of active load transistors of said first conductivity type and a pair of transistors of said second-conductivity type for driving said second plurality of active load transistors.

52. The amplifier as claimed in claim 48, further comprising:

a first resistor connected between terminal of said first amplifier and the input terminal of said second amplifier; and a second resistor connected between the output terminal and the input terminal of said second amplifier.

53. An amplifier comprising:

a limiting amplifier, including a signal input terminal and a reference voltage input terminal, for amplifying an input signal applied to the signal input terminal and for producing a limited output signal when an amplitude of the input signal is greater than a predetermined value, and a level of the input signal is within a predetermined range with regard to a reference voltage applied to the reference voltage input terminal; and an automatic threshold control circuit for supplying the reference voltage to the reference voltage input terminal of said limiting amplifier, wherein said automatic threshold control circuit comprises a top-hold circuit for detecting and holding a top value of the input signal, and a voltage divider for producing, as the reference voltage, a divided voltage between the output of said top-hold circuit and a fixed voltage externally supplied from a fixed voltage source, and wherein voltages of the input terminal and output terminal of said top-hold circuit become substantially equal when the top-hold circuit is reset by an external reset signal and wherein said fixed voltage is set at a value lower than the voltage at said signal input terminal during a signal-less state so as to assure the output of said limiting amplifier is at a low value during said signal-less state.

54. An amplifier comprising:

a limiting amplifier, including a signal input terminal and a reference voltage input terminal, for amplifying an input signal applied to the signal input terminal and for producing a limited output signal when an amplitude of the input signal is greater than a predetermined value, and a level of the input signal is within a predetermined range with regard to a reference voltage applied to the reference voltage input terminal; and an automatic threshold control circuit for supplying the reference voltage to the reference voltage input terminal of said limiting amplifier, wherein said automatic threshold control circuit comprises a bottom-hold circuit for detecting and holding a bottom value of the input signal, and a voltage divider for producing, as the reference voltage, a divided voltages between the output of said bottom-hold circuit and a fixed voltage externally supplied, and wherein voltages of the input terminal and output terminal of said bottom-hold circuit become substantially equal when the bottom-hold circuit is reset by an external reset signal.

\* \* \* \* \*